(12) United States Patent
Yamazaki et al.

(10) Patent No.: US 9,437,273 B2
(45) Date of Patent: Sep. 6, 2016

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 94 days.

(21) Appl. No.: 14/139,248

(22) Filed: Dec. 23, 2013

(65) Prior Publication Data

US 2014/0177345 A1    Jun. 26, 2014

(30) Foreign Application Priority Data

Dec. 26, 2012   (JP) ................................ 2012-282478

(51) Int. Cl.
| | |
|---|---|
| *G11C 16/26* | (2006.01) |
| *G11C 11/405* | (2006.01) |
| *G11C 11/4076* | (2006.01) |
| *G11C 11/56* | (2006.01) |

(52) U.S. Cl.
CPC .......... *G11C 11/405* (2013.01); *G11C 11/4076* (2013.01); *G11C 11/56* (2013.01); *G11C 11/5621* (2013.01); *G11C 11/5642* (2013.01); *G11C 2211/5641* (2013.01)

(58) Field of Classification Search
CPC ...................................................... G11C 16/26
USPC .................................................... 365/185.21
See application file for complete search history.

(56) References Cited

U.S. PATENT DOCUMENTS

| | | | |
|---|---|---|---|
| 4,466,081 A | | 8/1984 | Masuoka |
| 5,218,569 A | * | 6/1993 | Banks ...................... 365/185.21 |
| 5,349,366 A | | 9/1994 | Yamazaki |
| 5,731,856 A | | 3/1998 | Kim et al. |
| 5,744,864 A | | 4/1998 | Cillessen et al. |
| 6,127,702 A | | 10/2000 | Yamazaki |
| 6,294,274 B1 | | 9/2001 | Kawazoe et al. |
| 6,560,142 B1 | | 5/2003 | Ando |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Min Huang
(74) *Attorney, Agent, or Firm* — Fish & Richardson P.C.

(57) ABSTRACT

To provide a semiconductor device that has a novel structure and achieves a higher degree of convenience, the semiconductor device is configured to include a memory cell that stores binary data or multilevel data, and a reading circuit that reads the data stored in the memory cell and transfers the data to the outside. The reading circuit includes a first reading circuit for reading binary data and a second reading circuit for reading multilevel data.

16 Claims, 32 Drawing Sheets

(56) References Cited

U.S. PATENT DOCUMENTS

| | | |
|---|---|---|
| 6,563,174 B2 | 5/2003 | Kawasaki et al. |
| 6,577,530 B2 | 6/2003 | Muranaka |
| 6,646,300 B2 | 11/2003 | Ishii |
| 6,727,522 B1 | 4/2004 | Kawasaki et al. |
| 6,825,525 B2 | 11/2004 | Ishii |
| 6,873,009 B2 | 3/2005 | Hisamoto |
| 7,009,243 B2 | 3/2006 | Ishii |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto |
| 7,732,819 B2 | 6/2010 | Akimoto et al. |
| 7,888,207 B2 | 2/2011 | Wager |
| 8,289,753 B2 | 10/2012 | Yamazaki |
| 8,363,452 B2 | 1/2013 | Yamazaki |
| 8,576,620 B2 | 11/2013 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0209739 A1 | 11/2003 | Hisamoto |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0221692 A1 | 10/2006 | Chen |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0237992 A1* | 9/2009 | Maejima .............. 365/185.03 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka |
| 2010/0109002 A1 | 5/2010 | Itagaki et al. |
| 2010/0142276 A1* | 6/2010 | Kasuga .............. G11C 16/26 365/185.11 |
| 2010/0148171 A1 | 6/2010 | Hayashi |
| 2010/0193785 A1 | 8/2010 | Kimura |
| 2010/0264419 A1 | 10/2010 | Iwasaki |
| 2011/0110145 A1* | 5/2011 | Yamazaki et al. ............ 365/149 |
| 2011/0116310 A1 | 5/2011 | Yamazaki |
| 2011/0128777 A1 | 6/2011 | Yamazaki |
| 2011/0134683 A1* | 6/2011 | Yamazaki et al. ............ 365/149 |
| 2012/0032164 A1 | 2/2012 | Ohnuki |
| 2012/0033488 A1 | 2/2012 | Nagatsuka |
| 2012/0230114 A1 | 9/2012 | Sekine |
| 2012/0275245 A1 | 11/2012 | Sekine |
| 2013/0140558 A1 | 6/2013 | Yamazaki |
| 2013/0235678 A1* | 9/2013 | McCollum et al. ..... 365/189.09 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-123986 A | 6/2011 |
| WO | 2004/114391 A1 | 12/2004 |
| WO | 2011/058934 A1 | 5/2011 |

OTHER PUBLICATIONS

Orita, M et al., "Amorphous transparent conductive oxide InGaO3(ZnO)m (m<4):a Zn4s conductor," Philosophical Magazine, 2001, vol. 18, No. 5, pp. 501-515.

(56) References Cited

OTHER PUBLICATIONS

Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using Castep," Zeitschrift fur Kristallographie, 2005, vol. 220, pp. 567-570.
Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

(56) References Cited

OTHER PUBLICATIONS

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with new Long-Period Structure," Nirim Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931, vol. 41, No. 6.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

\* cited by examiner

FIG. 6A
FIG. 6B
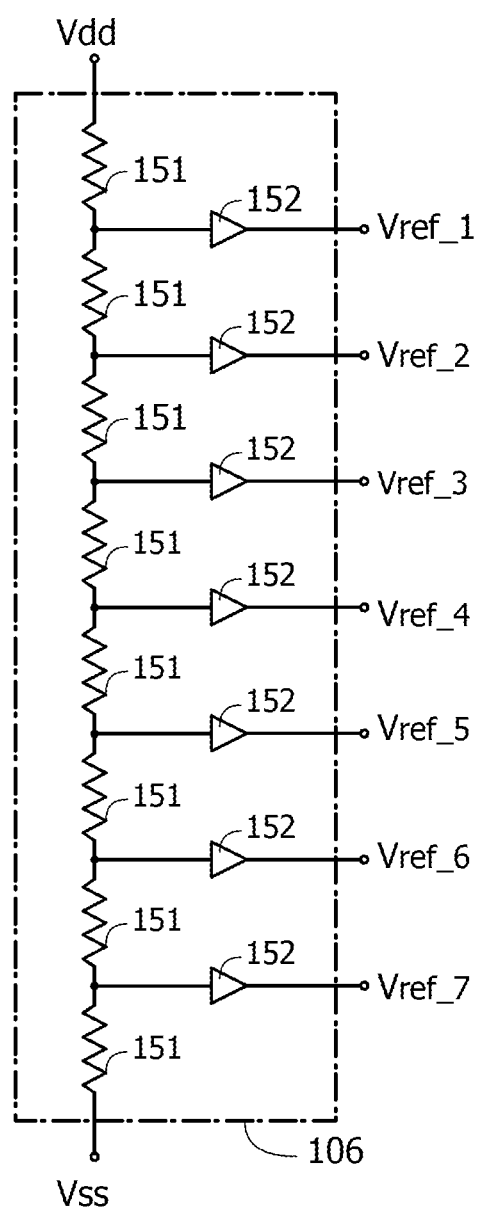
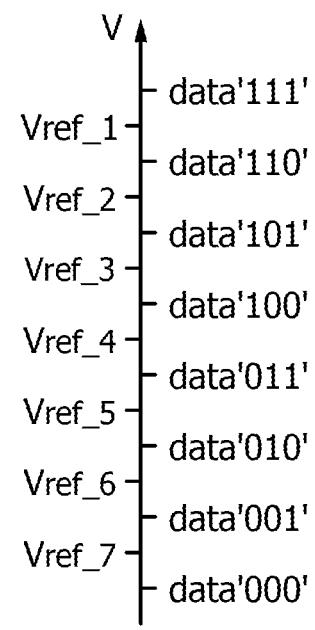

FIG. 18A
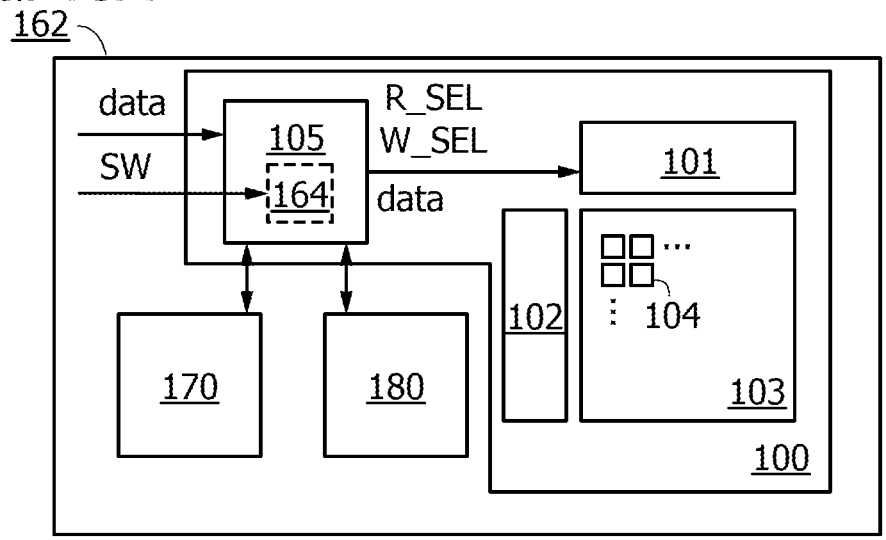
FIG. 18B
| Software | SW1 | SW2 | SW3 | |
|---|---|---|---|---|
| Number of levels of multilevel data | 2 | 4 | 8 | |
FIG. 18C
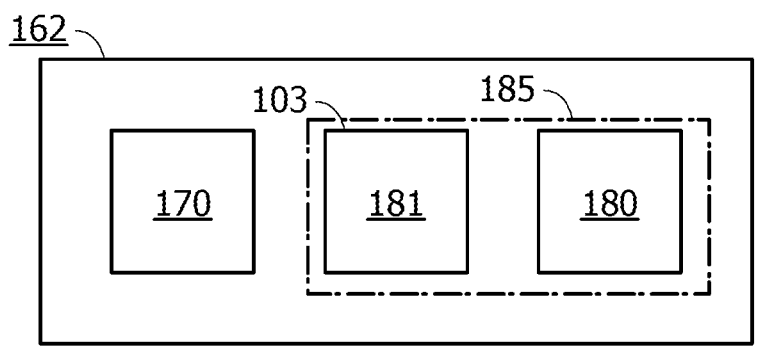

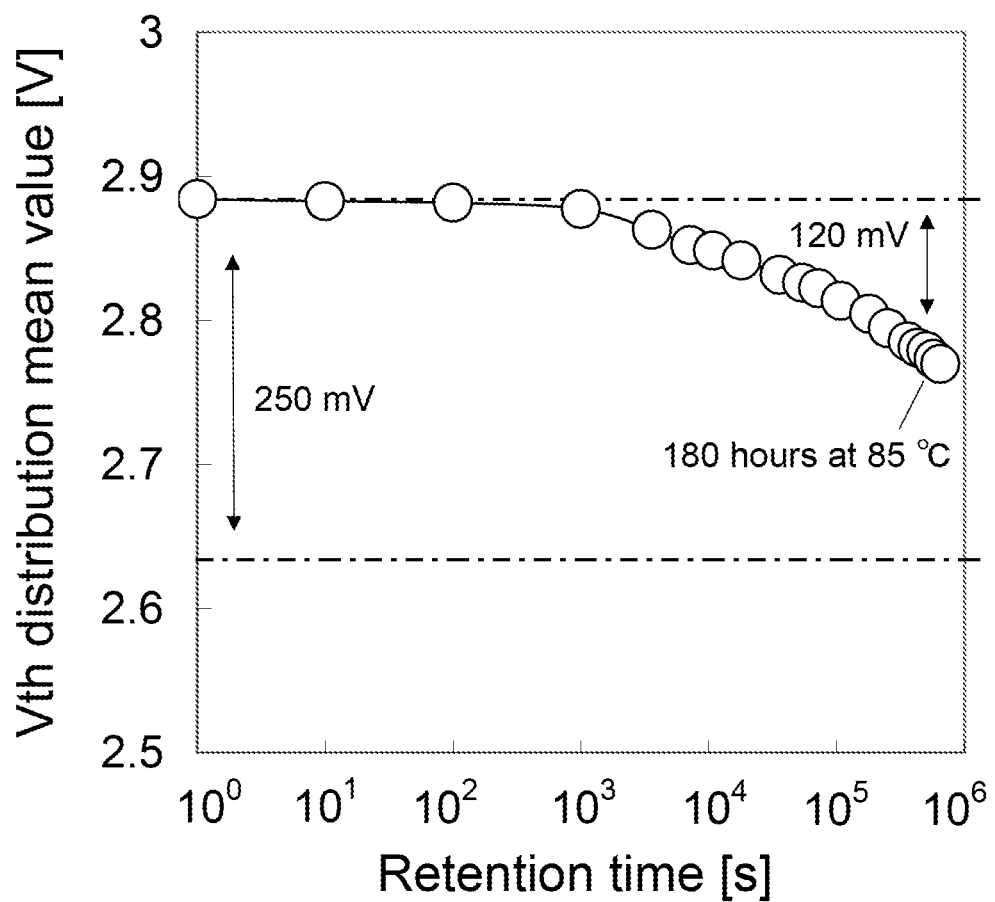

SEMICONDUCTOR DEVICE

BACKGROUND OF THE INVENTION

1. Field of the Invention

The present invention relates to an object (a product including a machine, a manufacture, and a composition of matter) and a method (a process including a simple method and a production method). In particular, one embodiment of the present invention relates to a semiconductor device, a display device, a light-emitting device, a driving method thereof, or a manufacturing method thereof. One embodiment of the present invention particularly relates to, for example, a semiconductor device or a driving method thereof.

2. Description of the Related Art

Semiconductor devices including elements using semiconductor properties have attracted attention. An example of an element using semiconductor properties is a transistor. A transistor is used in a liquid crystal display device, a memory device, and the like.

Although silicon (Si) is widely known as a semiconductor material used for a transistor, an oxide semiconductor has received attention in recent years (see Patent Document 1).

REFERENCE

Patent Document 1: Japanese Published Patent Application No. 2011-123986

SUMMARY OF THE INVENTION

A memory device (also referred to as memory) is broadly classified into two categories: a memory that stores binary data (hereinafter referred to as binary memory) such as DRAM and SRAM, and a memory that stores multilevel data (hereinafter referred to as multilevel memory) such as flash memory.

A binary memory particularly needs to operate at high speed to store data temporarily and is less suitable for an increase in memory capacity than a multilevel memory. A multilevel memory particularly requires an increase in memory capacity for storing a large amount of data and is less suitable for high-speed operation than a binary memory.

In the present circumstances, these binary and multilevel memories are formed as different electronic components and mounted on a printed circuit board or the like. Since the compatibility between the binary memory and the multilevel memory is not maintained after the memories are mounted on the printed circuit board, it is difficult to switch the memories depending on the application, and the convenience is hampered as a result.

In view of the above, an object of one embodiment of the present invention is to provide a semiconductor device or the like that has a novel structure and achieves a higher degree of convenience. An object of one embodiment of the present invention is to provide a semiconductor device or the like that has a novel structure and has compatibility between a binary memory and a multilevel memory. An object of one embodiment of the present invention is to provide a semiconductor device or the like that has a novel structure and can be additionally provided with a binary memory or a multilevel memory after being mounted on a substrate. An object of one embodiment of the present invention is to provide a semiconductor device or the like which has a novel structure and in which a memory to be used can switch between a binary memory and a multilevel memory depending on the application. An object of one embodiment of the present invention is to provide a semiconductor device or the like which has a novel structure and in which a memory to be used can switch between a binary memory and a multilevel memory without an increase in circuit size. An object of one embodiment of the present invention is to provide a semiconductor device or the like which has a novel structure and in which the number of levels of data that a multilevel memory can store can be changed without an increase in circuit size. An object of one embodiment of the present invention is to provide a semiconductor device or the like that has a novel structure and is capable of changing the operating speed. An object of one embodiment of the present invention is to provide a semiconductor device or the like which has a novel structure and in which the off-state current is low. An object of one embodiment of the present invention is to provide a semiconductor device or the like with a novel structure with low power consumption. An object of one embodiment of the present invention is to provide a semiconductor device or the like with a novel structure with high reliability. An object of one embodiment of the present invention is to provide a semiconductor device or the like with a novel structure.

Note that the descriptions of these objects do not disturb the existence of other objects. One embodiment of the present invention does not necessarily achieve all the objects listed above. Objects other than the above objects will be apparent from and can be derived from the descriptions of the specification, the drawings, the claims, and the like.

One embodiment of the present invention is a semiconductor device including a memory cell configured to store binary data or multilevel data, and a reading circuit configured to read the data stored in the memory cell and transfer the data to the outside. The reading circuit includes a first reading circuit configured to read binary data and a second reading circuit configured to read multilevel data.

One embodiment of the present invention is a semiconductor device including a memory cell configured to store binary data or multilevel data, a writing circuit configured to write the data into the memory cell, and a reading circuit configured to read the data stored in the memory cell and transfer the data to the outside. The writing circuit includes a first writing circuit configured to write binary data and a second writing circuit configured to write multilevel data. The reading circuit includes a first reading circuit configured to read binary data and a second reading circuit configured to read multilevel data.

In the semiconductor device of one embodiment of the present invention, the first reading circuit preferably includes a comparator supplied with a reference voltage.

In the semiconductor device of one embodiment of the present invention, the second reading circuit preferably includes a plurality of comparators supplied with reference voltages having different levels, and an arithmetic circuit configured to output a multi-bit signal in accordance with output signals of the comparators.

In the semiconductor device of one embodiment of the present invention, the first reading circuit is preferably one of the plurality of comparators in the second reading circuit.

In the semiconductor device of one embodiment of the present invention, it is preferable that the memory cell include a first transistor, and a second transistor and a capacitor that have a function of holding a potential of a gate of the first transistor, and that a semiconductor layer of the second transistor contain an oxide semiconductor.

In one embodiment of the present invention, a semiconductor device that has a novel structure and achieves a high degree of convenience can be provided.

BRIEF DESCRIPTION OF THE DRAWINGS

In the accompanying drawings:
FIGS. 6A and 6B illustrate a voltage generator circuit;
FIG. 18A is a block diagram of a semiconductor circuit,
and FIGS. 18B and 18C are diagrams illustrating operation of the semiconductor circuit;
FIG. 30 is a graph showing characteristics of a memory cell.

DETAILED DESCRIPTION OF THE INVENTION

Figure 1:
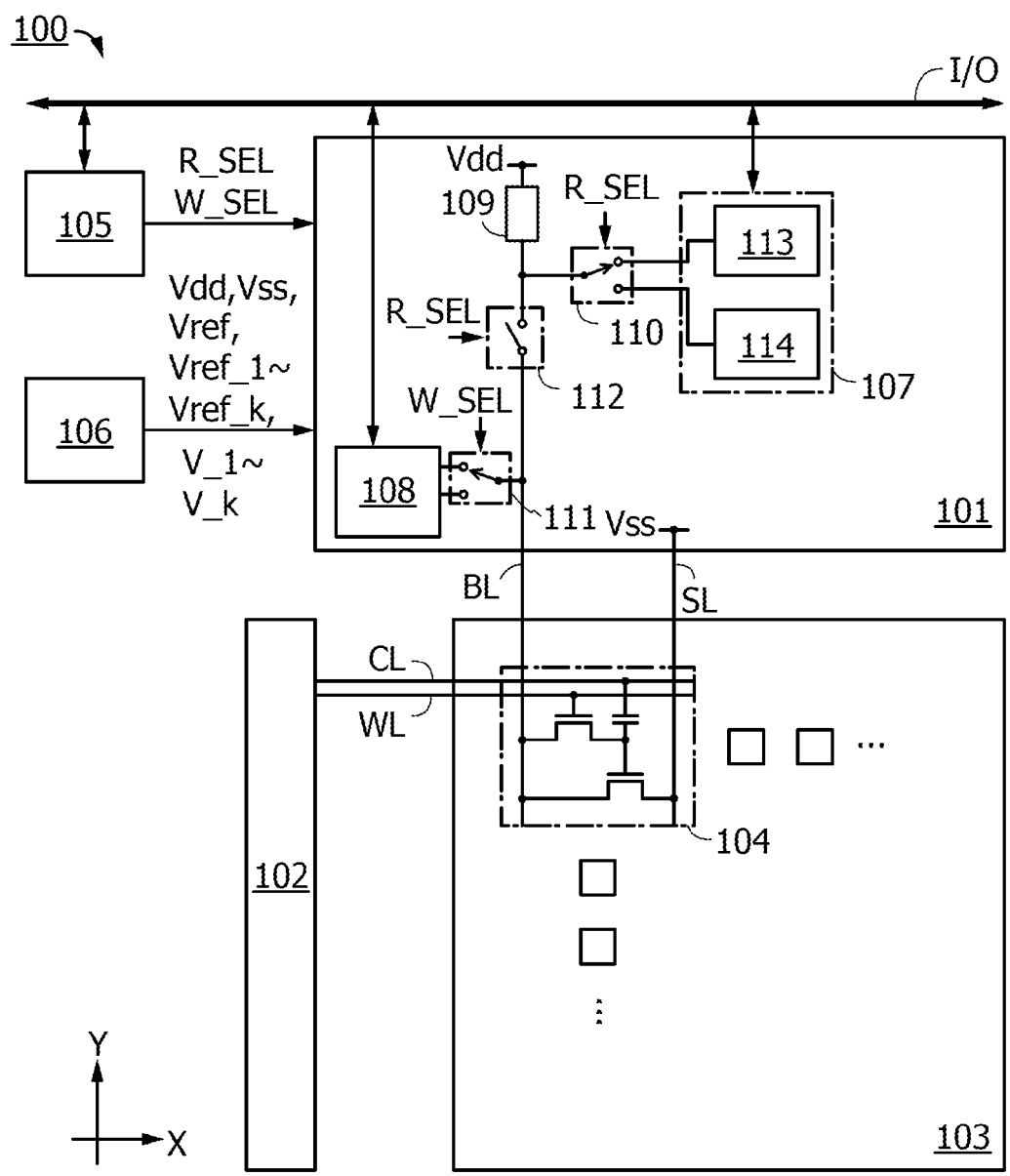
FIG. 1 is a block diagram of a semiconductor device.

Embodiments will be hereinafter described with reference to the accompanying drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the thickness of layers, and/or regions may be exaggerated for clarity in some cases. Therefore, embodiments of the present invention are not limited to such scales. Note that drawings are schematic views of ideal examples, and the embodiments of the present invention are not limited to the shape or the value illustrated in the drawings. For example, variation in signal, voltage, or current due to noise or difference in timing can be included.

In this specification and the like, a transistor is an element having at least three terminals of a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since a source and a drain may change depending on a structure, operating conditions, and the like of the transistor, it is difficult to define which is the source or the drain. Thus, a portion functioning as the source and a portion functioning as the drain are not called a source and a drain in some cases, and one of the source and the drain may be referred to as a first electrode and the other thereof may be referred to as a second electrode.

In this specification, ordinal numbers such as "first", "second", and "third" are used in order to avoid confusion among components, and the terms do not limit the components numerically.

In this specification, when it is described that "A and B are connected to each other", the case where A and B are electrically connected to each other is included in addition to the case where A and B are directly connected to each other. Here, the description "A and B are electrically connected to each other" means the following case: when an object having any electrical function exists between A and B, an electric signal can be transmitted and received between A and B.

In this specification, terms for describing arrangement, such as "over" and "under", are used for convenience to indicate a positional relation between components with reference to drawings. Further, a positional relation between components is changed as appropriate in accordance with a direction in which each component is described. Thus, the positional relation is not limited to that described with a term used in this specification and can be explained with another term as appropriate depending on the situation.

Note that the positional relations of circuit blocks in block diagrams are specified for description. Even when a block diagram shows that different functions are achieved by different circuit blocks, the circuit blocks in an actual circuit or an actual region may be provided in the same circuit or the same region to achieve different functions. In addition, functions of circuit blocks in block diagrams are specified for description, and even when a block diagram shows one circuit block performing given processing, a plurality of circuit blocks may be provided in an actual circuit or an actual region to perform the processing.

In this specification, the term "parallel" indicates that the angle formed between two straight lines ranges from $-10°$ to 10°, and accordingly also includes the case where the angle ranges from −5° to 5°. In addition, the term "perpendicular" indicates that the angle formed between two straight lines ranges from 80° to 100°, and accordingly includes the case where the angle ranges from 85° to 95°.

In this specification, the trigonal and rhombohedral crystal systems are included in the hexagonal crystal system.

In this specification, embodiments of the present invention will be described with reference to the drawings. Embodiments are described in the following order.
1. Embodiment 1: Basic structure of one embodiment of the present invention
2. Embodiment 2: Structure example of a reading circuit
3. Embodiment 3: Structure example of a writing circuit
4. Embodiment 4: Structure example of a memory cell
5. Embodiment 5: Structure examples of a voltage generator circuit
6. Embodiment 6: Variations of components in a semiconductor device
7. Embodiment 7: Application examples of a semiconductor device
8. Embodiment 8: Elements included in a semiconductor device
9. Embodiment 9: Structure examples of an electronic component including a semiconductor device and electronic devices including the electronic component (Embodiment 1)

In Embodiment 1, a basic structure of a semiconductor device of one embodiment of the disclosed invention will be described with reference to FIG. 1.

FIG. 1 is a block diagram illustrating an example of a semiconductor device 100.

Note that a semiconductor device refers to a device including a semiconductor element. The semiconductor device includes a driver circuit that drives a circuit including a semiconductor element, and the like, and also includes a control circuit, a voltage generator circuit, or the like provided over a separate substrate.

The block diagram of the semiconductor device 100 in FIG. 1 shows a circuit (hereinafter referred to as driver circuit 101) for supplying a signal to a wiring provided in the Y direction, a circuit (hereinafter referred to as driver circuit 102) for supplying a signal to a wiring provided in the X direction, and a circuit (hereinafter referred to as memory circuit 103) that stores data in accordance with signals supplied to the wirings provided in the X direction and the Y direction. The memory circuit 103 in FIG. 1 includes a plurality of circuits (hereinafter referred to as memory cells 104) into which data to be stored is written and from which the data is read. The block diagram of the semiconductor device 100 in FIG. 1 also shows a circuit (hereinafter referred to as control circuit 105) that supplies a signal for controlling the driver circuit 101, a circuit (hereinafter referred to as voltage generator circuit 106) that generates voltages having a plurality of levels for controlling the driver circuit 101, and an input/output unit I/O for inputting and outputting data to/from the driver circuit 101 and the control circuit 105.

The driver circuit 101 in FIG. 1 includes a reading circuit 107, a writing circuit 108, a load 109, a read switching circuit 110, a write switching circuit 111, and a read switching switch 112. The reading circuit 107 determines a voltage level corresponding to binary data or multilevel data read from the memory cell 104, and outputs the obtained data on the voltage level to the input/output unit I/O. The writing circuit 108 outputs a voltage having a level corresponding to binary data or multilevel data to be written into the memory cell 104. The load 109 is a circuit for converting a current that flows in accordance with the data stored in the memory cell 104 into a voltage. The read switching circuit 110 switches electrical connection between the reading circuit 107 and the load 109 depending on whether the stored data is binary data or multilevel data. The write switching circuit 111 switches electrical connection between the writing circuit 108 and the memory cell 104 depending on whether data to be written is binary data or multilevel data. The read switching switch 112 is a circuit for controlling electrical connection between the load 109 and the memory cell 104.

Note that in the following description, a write data voltage (Vw) refers to a signal having a voltage level corresponding to data written into the memory cell 104, and a read data voltage (Vr) refers to a signal having a voltage level corresponding to data read from the memory cell 104.

The reading circuit 107 in FIG. 1 includes a circuit (reading circuit 113) that determines a read data voltage when the data stored in the memory cell 104 is binary data, and outputs the read data voltage to the input/output unit I/O; and a circuit (reading circuit 114) that determines a read data voltage when the data stored in the memory cell 104 is multilevel data, and outputs the read data voltage to the input/output unit I/O.

The control circuit 105 in FIG. 1 outputs a read control signal R_SEL for controlling the reading circuit 113 or the reading circuit 114, and a write control signal W_SEL for switching write data voltages. The read control signal R_SEL switches electrical connection depending on whether a read data voltage output to the driver circuit 101 corresponds to binary data or multilevel data. The write control signal W_SEL switches electrical connection depending on whether a write data voltage corresponds to binary data or multilevel data.

The voltage generator circuit 106 outputs, to the driver circuit 101, a voltage Vdd and a voltage Vss for applying the power supply voltage, a reference voltage Vref used for determining binary data, reference voltages Vref_1 to Vref_k (k is a natural number of 2 or more) used for determining multilevel data, and voltages V_1 to V_k used for writing binary data or multilevel data.

The driver circuit 101 is electrically connected to the memory cell 104 through a bit line BL and a source line SL. The driver circuit 101 supplies a write data voltage for binary data or multilevel data to the bit line BL, and writes the write data voltage into the memory cell 104. Moreover, the driver circuit 101 supplies the potential Vss to the source line SL.

The driver circuit 102 is electrically connected to the memory cell 104 through a word line WL and a capacitor word line CL. The driver circuit 102 supplies a word signal for selecting the memory cell 104 to the word line WL, so that the write data voltage of the bit line BL is written into the memory cell 104. Moreover, the driver circuit 102 supplies, to the capacitor word line CL, a read word signal for reading data stored in the memory cell; thus, the data stored in the memory cell is read and transferred to the bit line BL as the read data voltage.

Note that the wirings provided in the X direction refer to wirings including the word line WL and the capacitor word line CL. The wirings provided in the Y direction refer to wirings including the bit line BL and the source line SL. Note that the capacitor word line CL is not necessarily provided.

The memory circuit 103 includes a circuit in which a plurality of memory cells 104 are arranged in a matrix or stacked three-dimensionally. The memory circuit 103 can store binary data or multilevel data in each of the memory cells 104 on the basis of write data voltages.

Note that binary data is data capable of having either of two states of data '1' and data '0'. Specifically, binary data refers to data that can be judged by H-level voltage or L-level voltage.

Note that multilevel data is data capable of having any of (k+1) states of data 'k' and data 'k−1' to data '0', for example, when the number of levels of the data is (k+1). Specifically, multilevel data refers to data that can be distinguished by (k+1) voltages obtained by dividing a difference between the potential Vdd and the potential Vss by (k+1).

Note that the term "store" means that data can be held in the memory cell 104 for a given time, and specifically means that charge or a voltage based on a write data voltage is held in the memory cell 104 for a given time. The data stored by being held in the memory cell 104 can be output to the outside in accordance with a signal for reading data.

The memory cell 104 is a circuit capable of holding a write data voltage and outputting a read data voltage in accordance with signals supplied to the wirings connected to the memory cell 104, for example, the bit line BL, the word line WL, the capacitor word line CL, and the source line SL. As an example, the memory cell 104 in FIG. 1 includes a transistor functioning as a switching element by utilizing semiconductor properties, a capacitor having a function of holding charge, and a transistor whose on/off state is controlled in accordance with the held charge.

As another example, the memory cell may be configured to store a write data voltage by accumulating charge in a floating gate. Further, a semiconductor layer of the transistor functioning as a switching element is preferably formed using an oxide semiconductor in order to hold data with as little charge leakage as possible.

A specific circuit configuration of the memory cell 104 will be described in detail in Embodiment 4.

The control circuit 105 selects whether data input from the input/output unit I/O is stored as binary data or multilevel data. Specifically, whether data is stored as binary data or multilevel data is selected in such a manner that whether data is written as binary data or multilevel data is determined in accordance with the amount of data stored in an external memory device, for example, and the read control signal R_SEL and the write control signal W_SEL are controlled.

For example, the control circuit 105 may make the memory circuit 103 store data in the form of multilevel data when the amount of data stored in the external memory device accounts for at least 80% of the memory capacity, and may make the memory circuit 103 store data in the form of binary data in the other cases. In this example, the read control signal R_SEL and the write control signal W_SEL are controlled by the control circuit 105 such that a write data voltage is set so that data is stored as binary data or multilevel data and a read data voltage is determined depending on whether the written data is binary data or multilevel data.

The external memory device is another memory circuit including a volatile memory circuit or a nonvolatile memory circuit, an arithmetic circuit including a CPU or the like, etc. The external memory device is electrically connected to the control circuit 105, the writing circuit 108, and the reading circuit 107 through the input/output unit I/O.

The voltage generator circuit 106 can be composed of a resistor ladder that generates voltages having a plurality of levels, for example. The voltages having different levels can be used as reference voltages used for determining the read data voltage in the reading circuit 107. Moreover, the voltages having different levels can be used as write data voltages corresponding to multilevel data in the writing circuit 108.

When a read data voltage supplied to the bit line BL corresponds to binary data, the reading circuit 107 outputs data indicating the determination result to the input/output unit I/O through the reading circuit 113. Moreover, when a read data voltage supplied to the bit line BL corresponds to multilevel data, the reading circuit 107 outputs data indicating the determination result to the input/output unit I/O through the reading circuit 114.

The writing circuit 108 outputs a binary write data voltage when a write data voltage written into the memory cell 104 through the bit line BL is written as binary data. Further, the writing circuit 108 outputs a multilevel write data voltage when a write data voltage written into the memory cell 104 through the bit line BL is written as multilevel data.

In the case where the write data voltage stored in the memory cell 104 is read and transferred to the bit line BL as the current value, the load 109 converts the current value into a voltage value to be used as a read data voltage. The load 109 is composed of a resistor or a transistor.

The read switching circuit 110 is composed of a demultiplexer circuit that switches electrical connection in accordance with the read control signal R_SEL.

The write switching circuit 111 is composed of a multiplexer circuit that switches electrical connection in accordance with the write control signal W_SEL.

The read switching switch 112 is composed of an analog switch that switches electrical connection in accordance with the read control signal R_SEL.

The term "voltage level" refers to a potential difference between a given potential and a reference potential (e.g., a ground potential). A voltage level is simply referred to as voltage in some cases and can also be called potential, potential difference, or voltage value.

A reference voltage is a voltage input to an inverting input terminal of a comparator. The level of a read data voltage is obtained by comparing the levels of the reference voltage and the read data voltage.

A comparator is a circuit that compares the voltage levels of two inputted signals and outputs an H-level or L-level signal. Specifically, two signals to be compared are input to an inverting input terminal and a non-inverting input terminal of an operational amplifier, and the voltage level of an output terminal of the operational amplifier changes to H level or L level.

The reading circuit 113 is composed of a comparator supplied with a reference voltage. Note that the reading circuit 113 can be referred to as a first reading circuit.

The reading circuit 114 is composed of comparators supplied with reference voltages having corresponding different levels. Note that the reading circuit 114 can be referred to as a second reading circuit.

For example, in judging 8-level data, the reading circuit 114 needs to determine which of the eight levels the read data voltage has. In this case, seven comparators are provided and supplied with corresponding different reference voltages. Then, which of the eight levels the read data voltage has is determined by these comparators, and the determination result is calculated to obtain 3-bit data.

When the read data voltage corresponds to multilevel data, the reading circuit 114 cannot determine the read data voltage until the voltage value is stabilized, because a difference between adjacent voltages used for determination is smaller. Thus, it takes time to obtain data, and the response is delayed. Alternatively, when the read data voltage corresponds to multilevel data, it takes time to obtain data and the response is delayed accordingly because operation needs to be performed in an arithmetic circuit in accordance with outputs of the comparators.

In one embodiment of the present invention, either binary data or multilevel data is selected as appropriate, and a reading circuit for binary data and a reading circuit for multilevel data are separately provided. With this structure, binary data or multilevel data can be used depending on the situation.

A specific preferred structure of the semiconductor device is as follows: writing and reading of binary data are performed when data stored in the memory cells 104 is intended to be processed at high speed, whereas writing and reading of multilevel data are performed when the amount of data stored in the memory cells 104 is intended to increase. This structure enables the semiconductor device to achieve a higher degree of convenience.

In the reading circuit 113, a margin for output determination is larger for a binary read data voltage than for a multilevel read data voltage. Thus, the speed of determination of binary output can be higher than that of determination of multilevel output.

Although a margin for output determination is smaller for a multilevel read data voltage than for a binary read data voltage in the reading circuit 114, the reading circuit 114 allows multilevel data to be stored in a memory cell. Thus, the memory capacity can be increased. In addition, since another circuit is used to determine binary data, arithmetic operation becomes unnecessary and the arithmetic time for determining binary data can be shortened.

The structure described in this embodiment can be combined as appropriate with any of the structures described in the other embodiments.

(Embodiment 2)

In Embodiment 2, a structure example of the reading circuit described in Embodiment 1 will be described with reference to FIG. 2.

Figure 2:
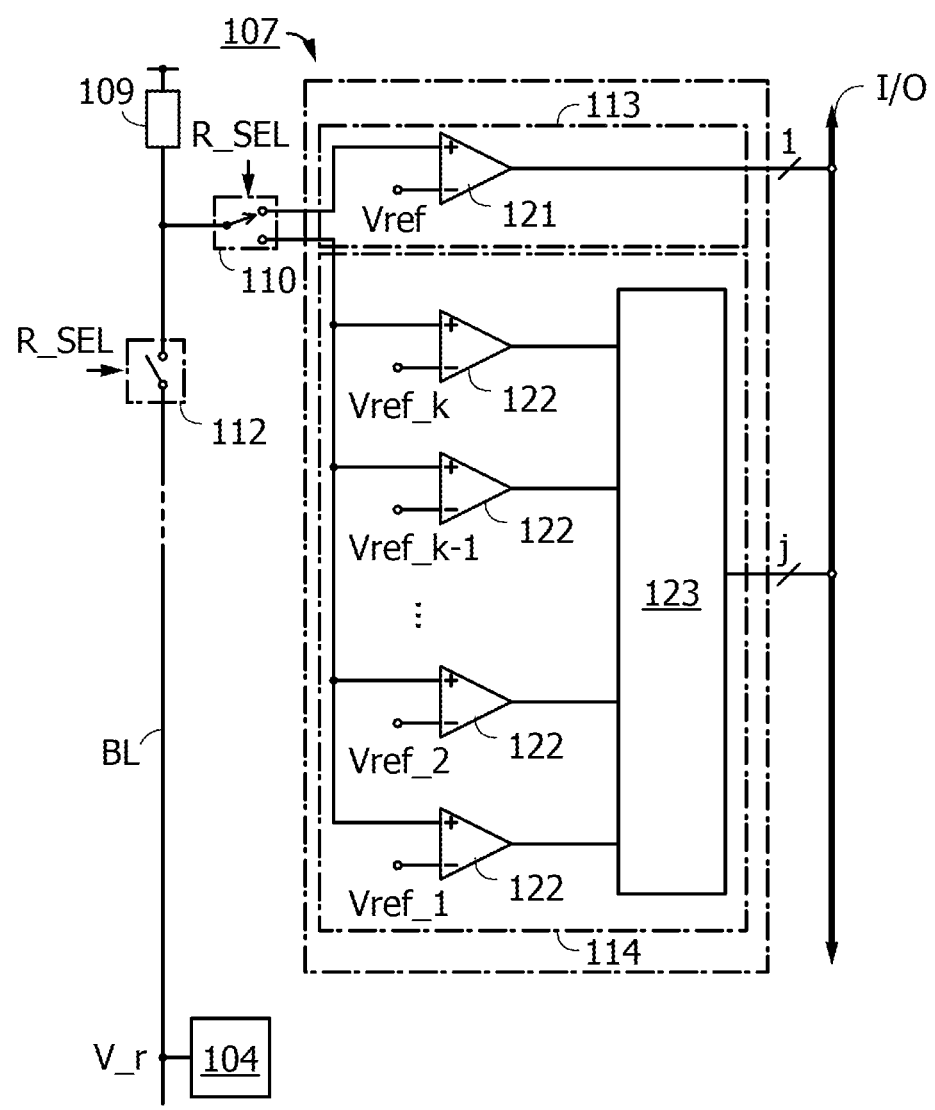
FIG. 2 is a block diagram of a reading circuit.

The block diagram of the reading circuit 107 in FIG. 2 shows the reading circuit 113, the reading circuit 114, a comparator 121, comparators 122, and an arithmetic circuit 123. FIG. 2 also shows the memory cell 104, the load 109, the read switching circuit 110, the read switching switch 112, and the input/output unit I/O.

The reading circuit 113 can compare the levels of the reference voltage Vref and a read data voltage that is input to the comparator 121 in response to switching of the read switching circuit 110 and the read switching switch 112. As the determination result of the comparison by the reading circuit 113, 1-bit data having H level or L level, that is, 1-bit data of data '0' or data '1' is output to the input/output unit I/O.

In the reading circuit 114, a read data voltage input by switching of the read switching circuit 110 and the read switching switch 112 and one of reference voltages Vref_1 to Vref_k are input to the plurality of comparators 122. The comparators 122 in the reading circuit 114 can compare the levels of the respective reference voltages with the level of the read data voltage. When the read data voltage corresponds to multilevel data having (k+1) levels, the comparators 122 can determine which of the k voltage levels the read data voltage has. Accordingly, the arithmetic circuit 123 performs arithmetic operation on the basis of the determination result. As a result of the arithmetic operation in the arithmetic circuit 123, j-bit data (j is a natural number of 2 or more) is output to the input/output unit I/O.

In one embodiment of the present invention, a reading circuit is selected as appropriate depending on binary data or multilevel data, and accordingly, a reading circuit for binary data and a reading circuit for multilevel data are separately provided.

In the reading circuit 113, a margin for output determination is larger for a binary read data voltage than for a multilevel read data voltage. Thus, the speed of determination of binary output can be higher than that of determination of multilevel output.

Although a margin for output determination is smaller for a multilevel read data voltage than for a binary read data voltage in the reading circuit 114, the reading circuit 114 allows multilevel data to be stored in a memory cell. Thus, the memory capacity can be increased. In addition, since another circuit is used to determine binary data, arithmetic operation becomes unnecessary and the arithmetic time can be shortened.

The structure described in this embodiment can be combined as appropriate with any of the structures described in the other embodiments.

(Embodiment 3)

In Embodiment 3, a structure example of the writing circuit described in Embodiment 1 will be described with reference to FIG. 3.

Figure 3:
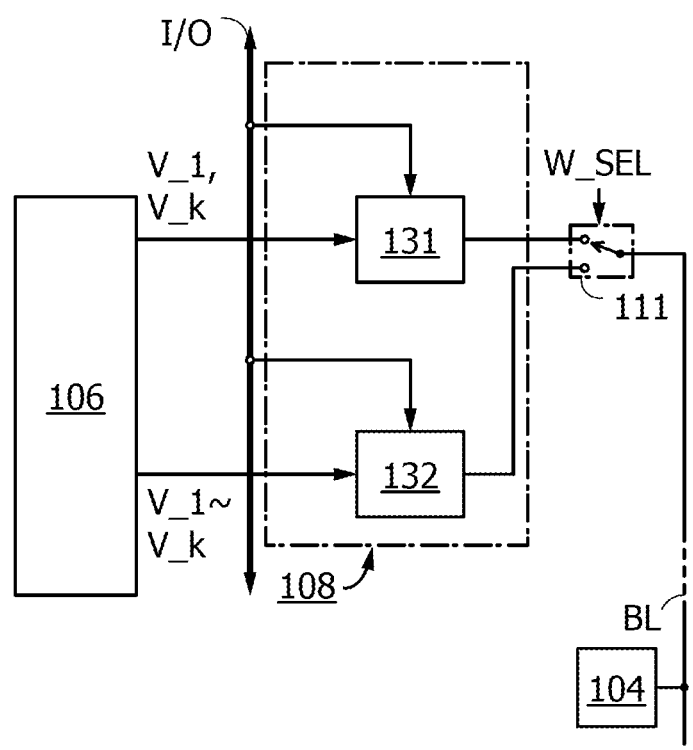
FIG. 3 is a block diagram of a writing circuit.

The block diagram of the writing circuit 108 in FIG. 3 shows a writing circuit 131 and a writing circuit 132. FIG. 3 also shows the memory cell 104, the write switching circuit 111, the voltage generator circuit 106, and the input/output unit I/O.

The writing circuit 131 is supplied with data through the input/output unit I/O and outputs a voltage corresponding to the data to the memory cell 104 through the bit line BL. For example, the writing circuit 131 is supplied with voltages V_1 and V_k serving as write data voltages for binary data from the voltage generator circuit 106, and outputs one of the voltages in accordance with the data.

The writing circuit 132 is supplied with data through the input/output unit I/O and outputs a voltage corresponding to the data to the memory cell 104 through the bit line BL. For example, the writing circuit 132 is supplied with voltages V_1 to V_k serving as write data voltages for multilevel data from the voltage generator circuit 106, and outputs one of the voltages in accordance with the data.

Output of a write data voltage to the bit line BL from the writing circuit 131 or the writing circuit 132 in the writing circuit 108 is controlled by switching of the write switching circuit 111.

In one embodiment of the present invention, a writing circuit is selected as appropriate depending on binary data or multilevel data, and accordingly, a writing circuit for binary data and a writing circuit for multilevel data are separately provided. Thus, data to be stored in a memory cell can be switched between binary data, which can be read at high speed, and multilevel data, with which the amount of data to be stored in memory cells can be increased.

The structure described in this embodiment can be combined as appropriate with any of the structures described in the other embodiments.

(Embodiment 4)

In Embodiment 4, structure examples of the memory cell described in Embodiment 1 will be described with reference to FIGS. 4A to 4C and FIGS. 5A and 5B.

Figure 4A:
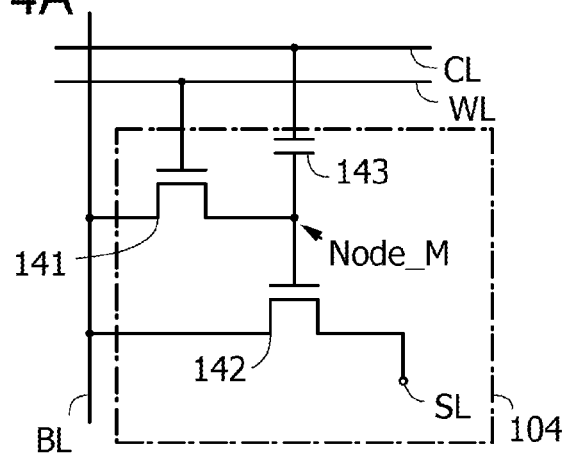
FIG. 4A is a circuit diagram of a memory cell.

The circuit diagram of the memory cell 104 in FIG. 4A shows a transistor 141, a transistor 142, a capacitor 143, the bit line BL, the source line SL, the word line WL, and the capacitor word line CL. FIG. 4A also shows a node Node_M connected to the transistor 141, the transistor 142, and the capacitor 143. Although the transistors 141 and 142 are n-channel transistors in the following description, at least one of the transistors 141 and 142 may be a p-channel transistor.

The transistor 141 has a function of controlling supply of a write data voltage of the bit line BL to the node Node_M when the voltage level of a word signal supplied to the word line WL is at H level. The transistor 141 also has a function of preventing a variation in the potential of the node Node_M due to leakage of charge held at the node Node_M to the bit line BL when the voltage level of a word signal supplied to the word line WL is at L level. For example, the transistor 141 is preferably a transistor that includes a semiconductor layer containing an oxide semiconductor and thus achieves extremely low off-state current.

The transistor including a semiconductor layer containing an oxide semiconductor will be described in detail in Embodiment 8.

The transistor 142 has a function of controlling the amount of current flowing between the bit line BL and the source line SL, in accordance with the potential of the node Node_M. For example, the transistor 142 has a function of a variable resistor with which the amount of current flowing between the bit line BL and the source line SL is large when the potential of the node Node_M is high and is small when the potential of the node Node_M is low. With this function, a read data voltage V_r obtained at the bit line BL by voltage division between the load 109 and the transistor 142 is acquired corresponding to the potential of the node Node_M.

The capacitor 143 has a function of holding charge at the node Node_M. The capacitor 143 also has a function of making a current whose amount corresponds to a potential held in advance flow through the transistor 142 by raising the potential of the node Node_M by capacitive coupling caused when the voltage level of a read word signal supplied to the capacitor word line CL is set at H level.

A write data voltage for binary data or multilevel data is supplied to the bit line BL. The potential Vss is supplied to the source line SL. A word signal is supplied to the word line WL. A read word signal is supplied to the capacitor word line CL. Note that the source line SL can be shared between adjacent memory cells.

Figure 4B:
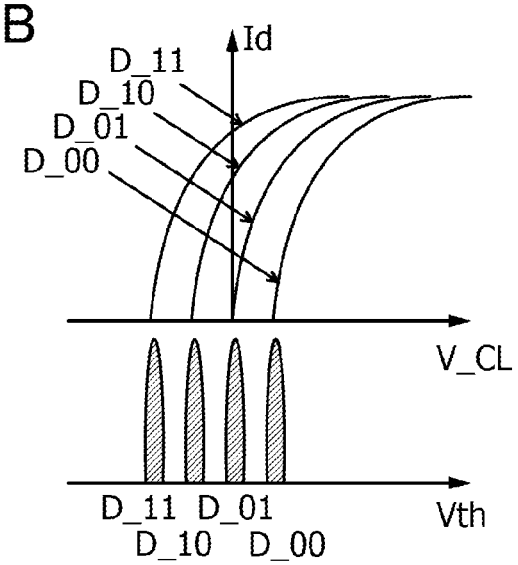
FIGS. 4B and 4C are schematic diagrams showing characteristics of the memory cell.

The schematic diagram in FIG. 4B shows a difference in current Id at the time when the write data voltage of the bit line BL is held at the node Node_M in the case where the write data voltage has four levels ('D_00', 'D_01', 'D_10', 'D_11'), with the horizontal axis representing a potential V_CL of a read word signal of the capacitor word line CL and the vertical axis representing a current Id flowing between the bit line BL and the source line SL.

As shown in FIG. 4B, the threshold voltage (Vth) at which the amount of current Id flowing between the bit line BL and the source line SL increases depends on the potential V_CL of the read word signal of the capacitor word line CL. Thus, the memory cell 104 can store multilevel data and make the multilevel data read out in such a manner that a different voltage level depending on data to be stored is held at the node Node_M and the read word signal of the capacitor word line CL is changed.

Figure 4C:
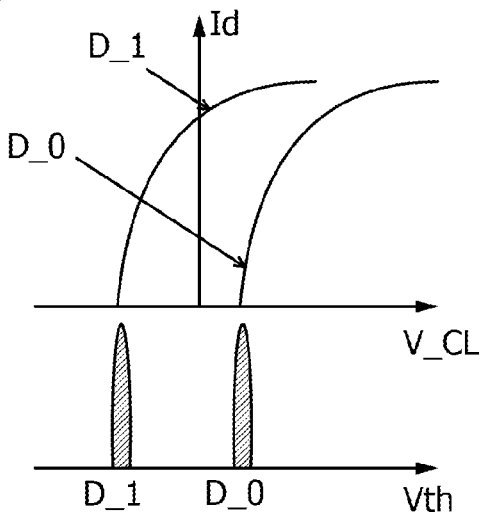

As in FIG. 4B, the schematic diagram in FIG. 4C shows a difference in current Id at the time when the write data voltage of the bit line BL is held at the node Node_M in the case where the write data voltage has two levels ('D_1', 'D_0'). The memory cell 104 having the characteristics shown in FIG. 4C can store binary data and make the binary data read out, as in the case of the memory cell 104 having the characteristics shown in FIG. 4B.

Figure 5A:
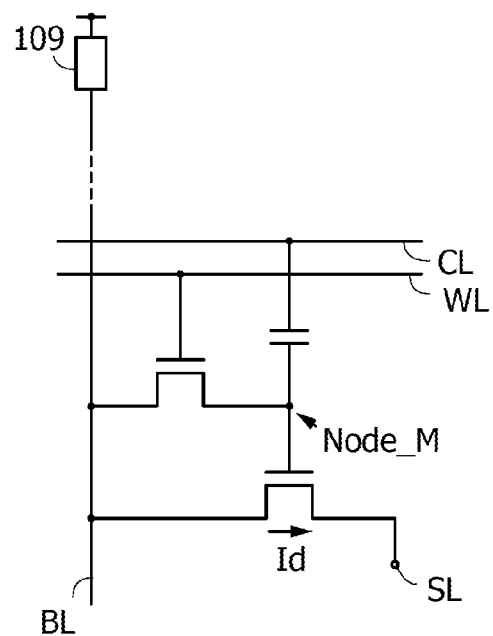
FIGS. 5A and 5B are a circuit diagram and a timing chart of a memory cell.
Figure 5B:
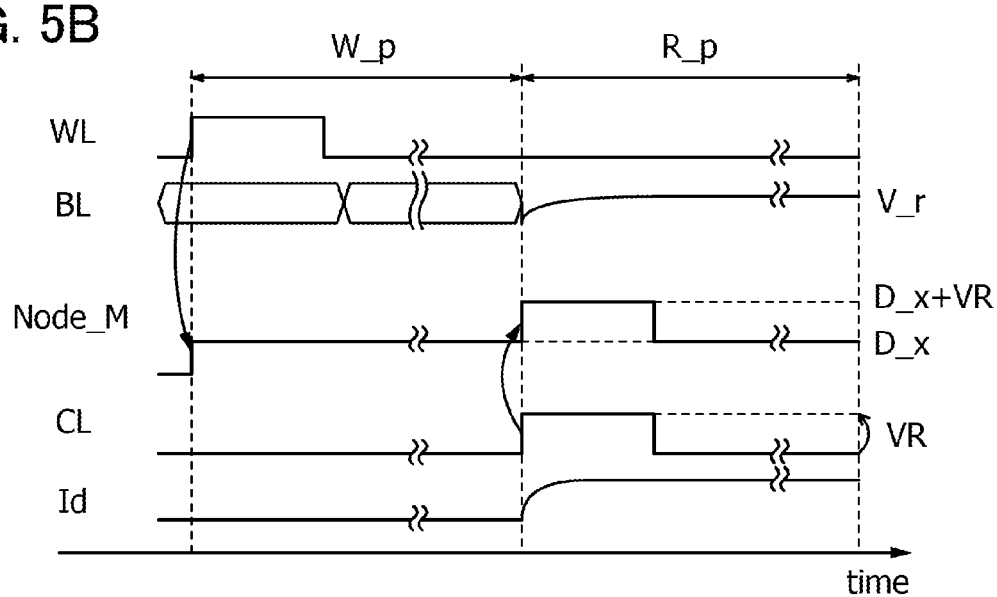

FIG. 5A shows a circuit diagram that is nearly identical to that illustrated in FIG. 4A, and FIG. 5B is a timing chart of data writing and data reading of the memory cell illustrated in FIG. 5A.

In the timing chart in FIG. 5B, a period W_p indicates a time for data writing, and a period R_p indicates a time for data reading. FIG. 5B shows changes in the voltage levels of the word line WL, the bit line BL, the node Node_M, and the capacitor word line CL and a change in the amount of current Id flowing between the bit line BL and the source line SL.

In the period W_p in FIG. 5B, first, the word line WL is set at H level, and the voltage of the bit line BL is written into the node Node_M. The voltage of the bit line BL written into the node Node_M is a write data voltage for binary data or multilevel data as described above. Note that the write data voltage is represented by D_x in FIG. 5B.

In the period R_p in FIG. 5B, first, the voltage of the capacitor word line CL is raised by a voltage VR, and the potential of the node Node_M is increased from D_x to (D_x+VR). With the increase in the potential of the node Node_M to (D_x+VR), the current Id is increased and the potential of the bit line BL is changed at the same time. The voltage of the bit line BL to be read out is the read data voltage V_r for binary data or multilevel data as described above.

In the operation of the memory cell 104 described so far in this embodiment, a plurality of different voltage levels are held at the node Node_M by writing of write data voltages. The voltage held at the node Node_M can be stored as data for a long time by utilizing the fact that the off-state current of the transistor 141 is low. The written voltage level can be held even after data reading.

Figure 27:
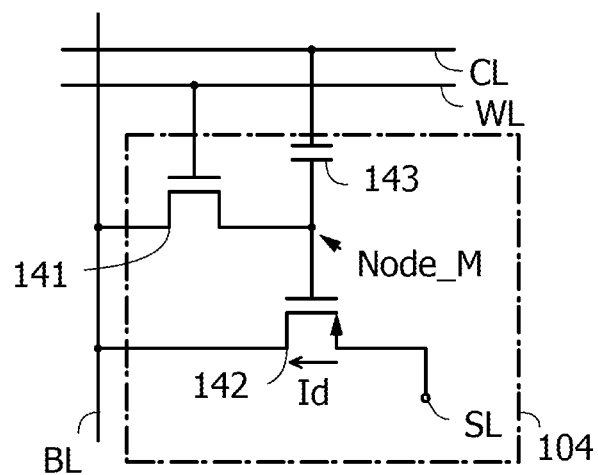
FIG. 27 is a circuit diagram of a memory cell.

As an example of the memory cell 104, FIG. 27 shows a circuit diagram of the memory cell 104 in which the transistor 141 is an n-channel transistor including a semiconductor layer containing an oxide semiconductor and the transistor 142 is a p-channel transistor including a semiconductor layer containing silicon. In the example of FIG. 27, the potential Vdd is supplied to the source line SL and the potential Vss is supplied to a load connected to the bit line BL, and a current flows from the source line SL to the bit line BL so that the amount of current Id varies.

Figure 28A:
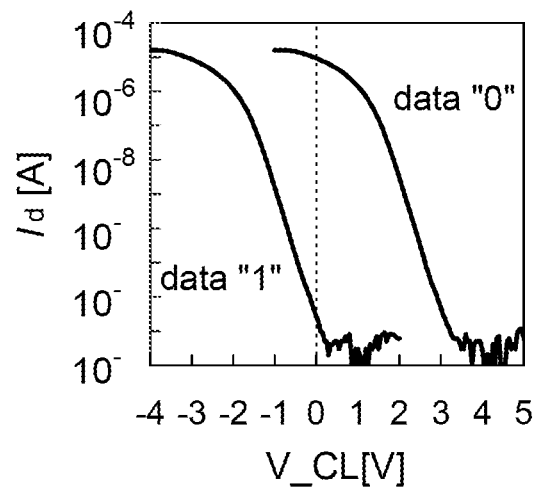
FIGS. 28A to 28C are graphs each showing characteristics of a memory cell.
Figure 28B:
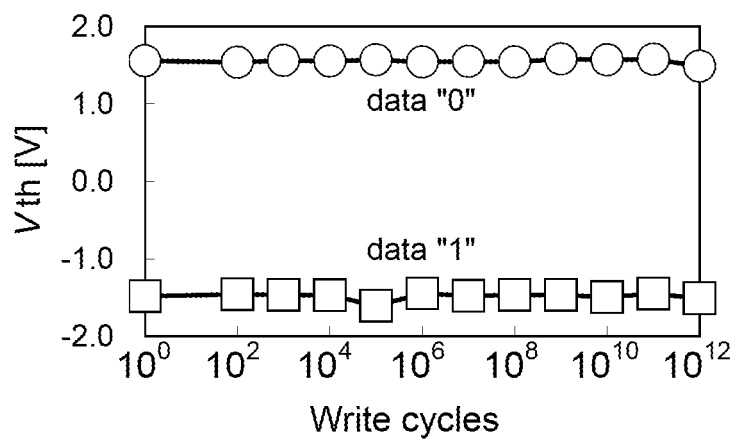
Figure 28C:
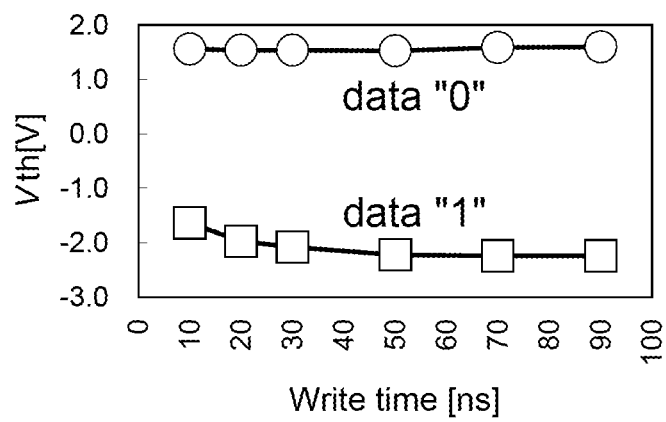

FIGS. 28A to 28C are graphs showing measured electrical characteristics of the memory cell 104 illustrated in FIG. 27.

FIG. 28A shows a change in the current Id flowing between the bit line BL and the source line SL when the potential V_CL of a read word signal of the capacitor word line CL is changed. FIG. 28A shows electrical characteristics of the memory cell 104 in which a write data voltage for binary data ("0" and "1") is held at the node Node_M. Data can be read from the memory cell 104 by the current Id that varies depending on the read word signal of the capacitor word line CL, which is changed depending on the voltage held at the node Node_M.

FIG. 28B shows write cycles of binary data ("0" and "1") and a change in the threshold voltage of the transistor 142. As shown in FIG. 28B, a change in the threshold voltage is small even with a large number of write cycles. In other words, the memory cell 104 illustrated in FIG. 27 has a write endurance over $10^{12}$ cycles.

FIG. 28C shows a change in the threshold voltage of the transistor 142 with a varying write time for rewriting binary data ("0" and "1"). As shown in FIG. 28C, binary data ("0" and "1") with different threshold voltages can be read out in a write time of 10 ns or less. In other words, the memory cell 104 illustrated in FIG. 27 can have a write time as short as 10 ns or less.

Figure 29:
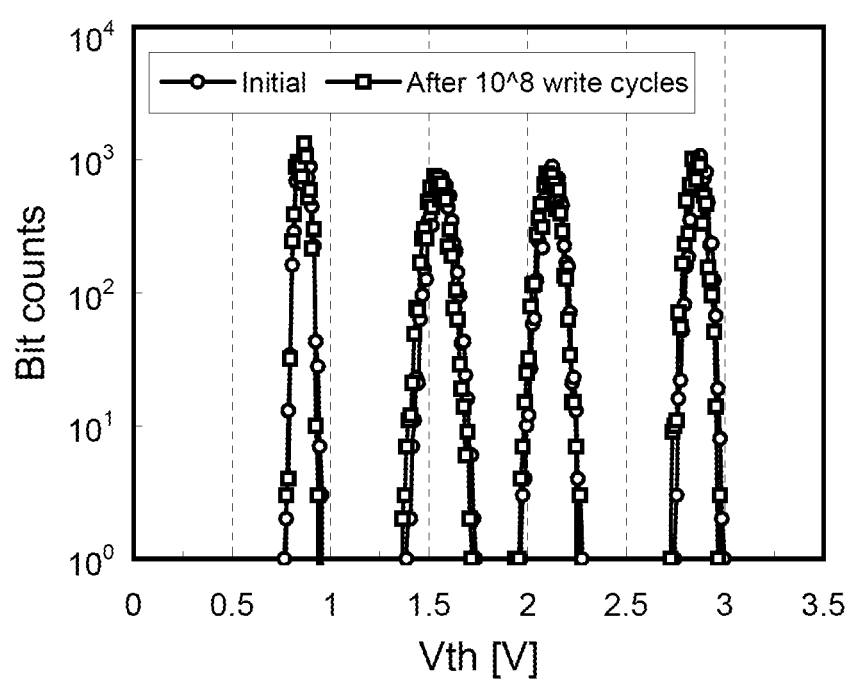
FIG. 29 is a graph showing characteristics of a memory cell.

FIG. 29 is a graph showing the distribution of the threshold voltages of the memory cell 104 in FIG. 27 after $10^8$ rewrite operations of multilevel data having four levels, in comparison with the initial distribution of the threshold voltages. As shown in FIG. 29, there is no difference between the initial distribution of the threshold voltages and the distribution after $10^8$ rewrite operations. In other words, the memory cell 104 illustrated in FIG. 27 excels at retaining multilevel data.

FIG. 30 is a graph showing a change over a data retention time at 85° C. in the distribution of the threshold voltage of the memory cell 104 in FIG. 27 into which a write data voltage corresponding to data "11" is written. As shown in FIG. 30, the amount of shift in the threshold voltage is approximately 120 mV after a data retention time of 180 hours at 85° C. In other words, the memory cell 104 in FIG. 27 excels at retaining multilevel data.

The structure described in this embodiment can be combined as appropriate with any of the structures described in the other embodiments.

(Embodiment 5)

In Embodiment 5, structure examples of the voltage generator circuit described in Embodiment 1 will be described with reference to FIGS. 6A and 6B and FIGS. 7A and 7B.

The voltage generator circuit 106 illustrated in FIG. 6A includes a plurality of resistors 151 and a plurality of buffer circuits 152.

The plurality of resistors 151 are electrically connected in series between a wiring supplied with the potential Vdd and a wiring supplied with the potential Vss. A plurality of different voltages are generated at nodes between the resistors 151 because of voltage division. Each voltage is output to a reading circuit or the like through the corresponding buffer circuit 152.

FIG. 6A shows a plurality of reference voltages Vref_1 to Vref_7 as an example of a plurality of voltages generated in the voltage generator circuit 106. By using these seven voltage levels, voltage levels corresponding to 3-bit data (data '111' to data '000') exemplified in FIG. 6B can be judged to obtain data based on a read data voltage. Note that a reference voltage used for judging 1-bit data may be one of Vref_1 to Vref_7 or may be a voltage generated separately.

Figure 7A:
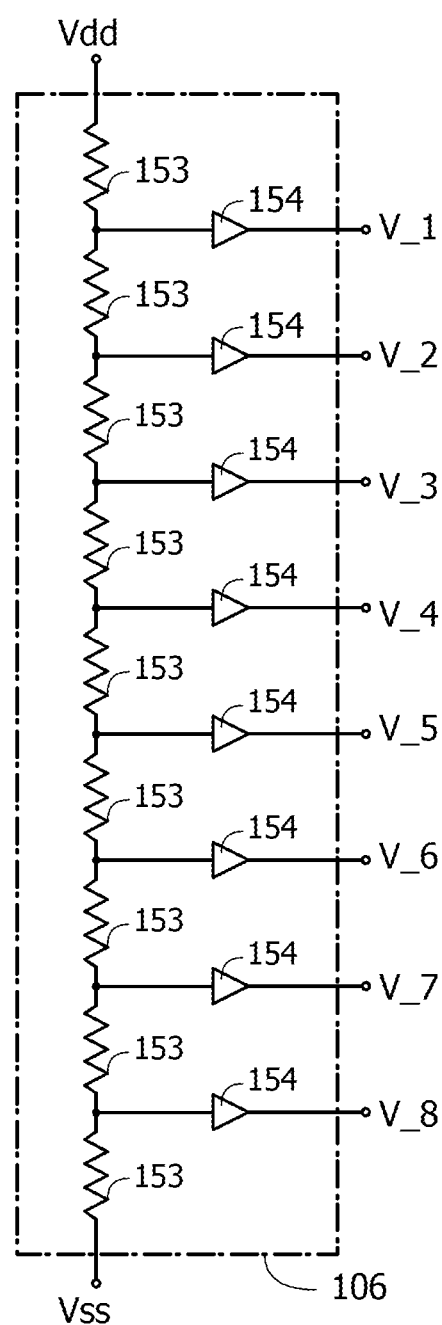
FIGS. 7A and 7B illustrate a voltage generator circuit.
Figure 7B:
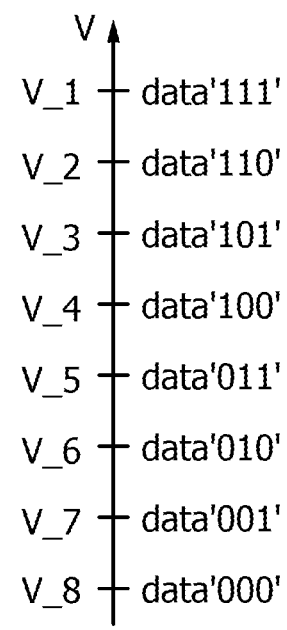

As in FIG. 6A, the voltage generator circuit 106 illustrated in FIG. 7A includes a plurality of resistors 153 and a plurality of buffer circuits 154.

FIG. 7A shows a plurality of write data voltages V_1 to V_8 as an example of a plurality of voltages generated in the voltage generator circuit 106. These eight voltage levels correspond to 3-bit data (data '111' to data '000') exemplified in FIG. 7B to be used as write data voltages.

The structure described in this embodiment can be combined as appropriate with any of the structures described in the other embodiments.

(Embodiment 6)

In Embodiment 6, variations of the components in the semiconductor device described in Embodiments 1 to 5 will be described with reference to FIG. 8, FIG. 9, FIGS. 10A and 10B, FIG. 11, FIG. 12, FIGS. 13A to 13C, FIG. 14, and FIGS. 15A and 15B.

<Variations of Reading Circuit>

First, variations of the reading circuit will be described with reference to FIG. 8, FIG. 9, FIGS. 10A and 10B, FIG. 11, FIG. 12, FIGS. 13A to 13C, and FIG. 14.

Figure 8:
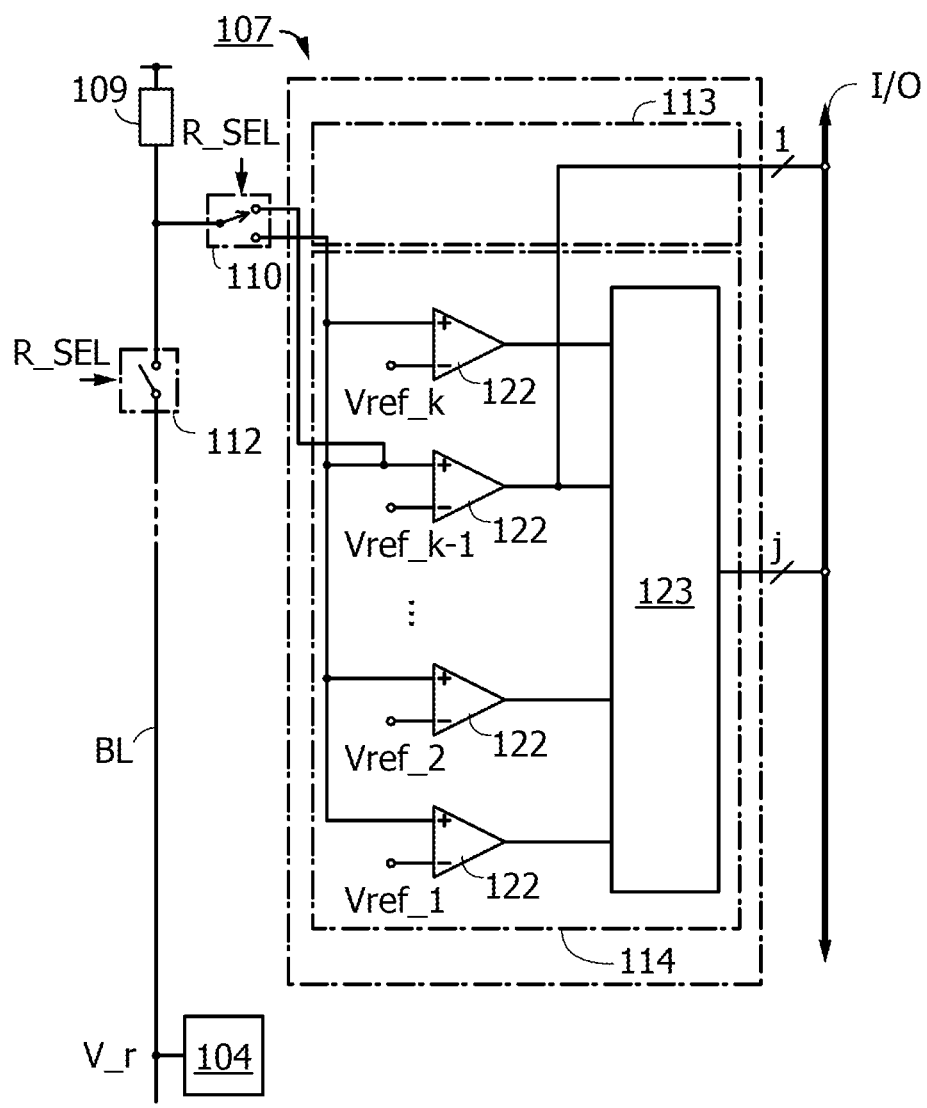
FIG. 8 is a block diagram of a reading circuit.

The block diagram of the reading circuit 107 in FIG. 8 shows the reading circuit 113, the reading circuit 114, the comparators 122, and the arithmetic circuit 123. FIG. 8 also shows the memory cell 104, the load 109, the read switching circuit 110, the read switching switch 112, and the input/output unit I/O.

The reading circuit 107 in FIG. 8 differs from the reading circuit 107 in FIG. 2 in that the comparator 121 in the reading circuit 113 is omitted and one of output signals from the comparators 122 in the reading circuit 114 is output as a 1-bit signal.

In the reading circuit 107 having the configuration illustrated in FIG. 8, the number of comparators included in the reading circuit 113 can be reduced. Thus, the size and power consumption of the reading circuit 107 can be reduced.

Figure 9:
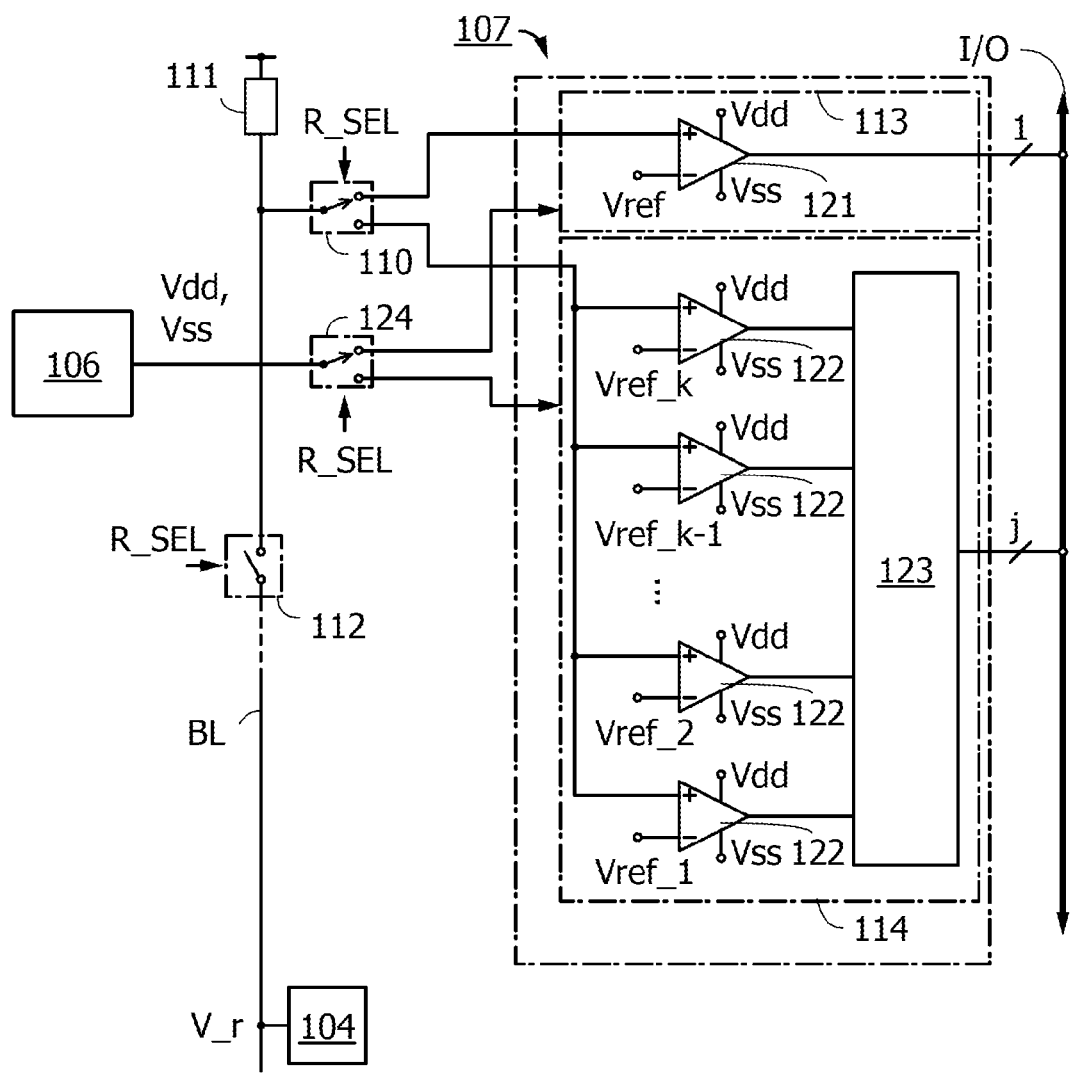
FIG. 9 is a block diagram of a reading circuit.

The block diagram of the reading circuit 107 in FIG. 9 shows the reading circuit 113, the reading circuit 114, the comparator 121, the comparators 122, and the arithmetic circuit 123. FIG. 9 also shows the voltage generator circuit 106, the memory cell 104, the load 109, the read switching circuit 110, the read switching switch 112, a voltage switching switch 124, and the input/output unit I/O.

The voltage switching switch 124 is composed of a demultiplexer circuit that switches electrical connection in accordance with the read control signal R_SEL. For example, when the read switching circuit 110 selects the reading circuit 113 to be electrically connected to the reading circuit 113, the voltage switching switch 124 operates so that the potential Vdd and the potential Vss for applying the power supply voltage are supplied to the reading circuit 113 and the power supply voltage is not supplied to the reading circuit 114.

The reading circuit 107 in FIG. 9 differs from the reading circuit 107 in FIG. 2 in that the power supply voltage is supplied to at least a reading circuit from which data is to be read out and not to the other reading circuit.

The configuration illustrated in FIG. 9 enables the power supply voltage not to be supplied to a circuit that is not subjected to data reading among the reading circuits in the reading circuit 107. Thus, power consumption of the reading circuit 107 can be reduced.

As voltage levels for judging multilevel data, the voltage generator circuit for supplying reference voltages to the reading circuit 107 can select from a plurality of groups of voltage levels to be output, instead of outputting one group of voltage levels illustrated in FIG. 6B. As an example, FIG. 10A illustrates a configuration of a voltage generator circuit with which read data voltages for 3-bit data and read data voltages for 2-bit data can be switched to be used for judging data.

Figure 10A:
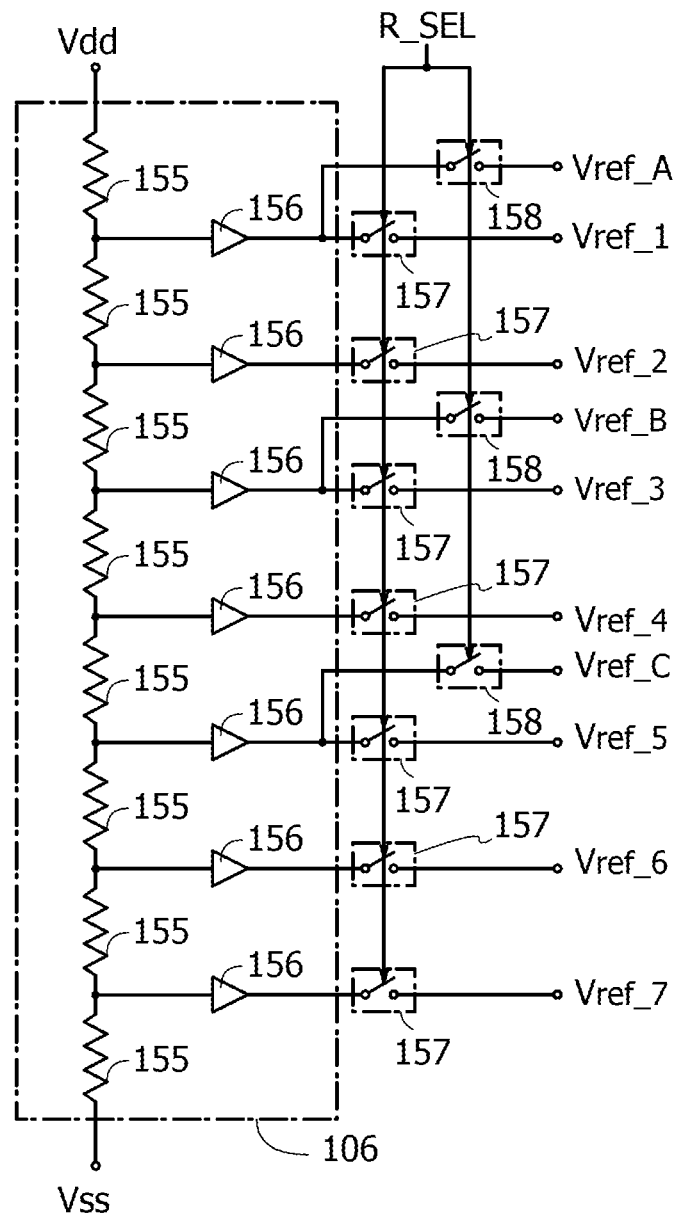
FIGS. 10A and 10B illustrate a voltage generator circuit.
Figure 10B:
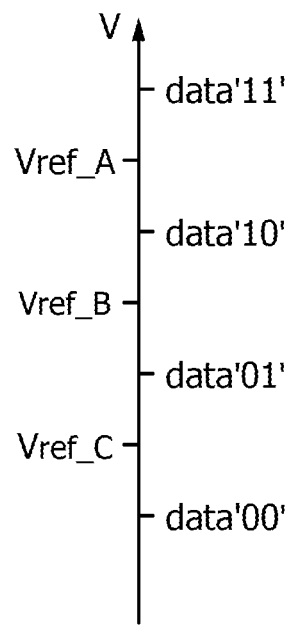

The voltage generator circuit 106 illustrated in FIG. 10A includes a plurality of resistors 155 and a plurality of buffer circuits 156. FIG. 10A also shows switches 157 and switches 158.

The plurality of resistors 155 are electrically connected in series between a wiring supplied with the potential Vdd and a wiring supplied with the potential Vss. A plurality of different voltages are generated at nodes between the resistors 155 because of voltage division. Each voltage is output to one terminal of the switch 157 and one terminal of the switch 158 through the corresponding buffer circuit 156.

The on/off states of the switches 157 and 158 are switched by the read control signal R_SEL. Specifically, the switches 157 and 158 are controlled to be on and off, respectively, in order to determine 3-bit data, whereas the switches 157 and 158 are controlled to be off and on, respectively, in order to determine 2-bit data.

FIG. 10A shows a plurality of reference voltages Vref_1 to Vref_7 as an example of a plurality of voltage levels for judging 3-bit data. By using these seven voltage levels, voltage levels corresponding to 3-bit data can be judged to obtain data based on a read data voltage. FIG. 10A also shows a plurality of reference voltages Vref_A to Vref_C as an example of a plurality of voltage levels for judging 2-bit data. By using these three voltage levels, voltage levels corresponding to 2-bit data (data '11' to data '00') exemplified in FIG. 10B can be judged to obtain data based on a read data voltage. Note that a reference voltage used for judging 1-bit data may be one of Vref_1 to Vref_7 and Vref_A to Vref_C or may be a voltage generated separately.

Figure 11:
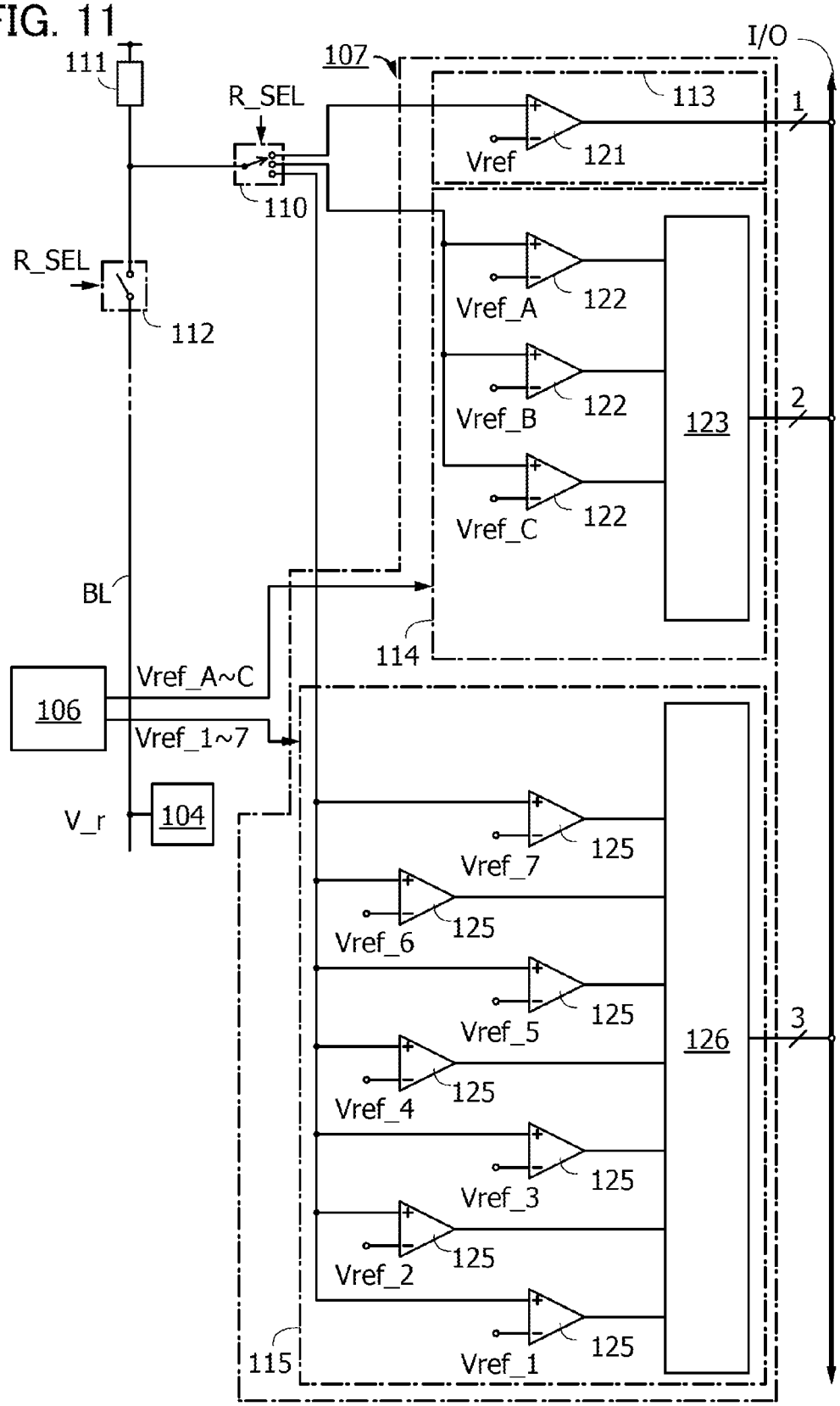
FIG. 11 is a block diagram of a reading circuit.

FIG. 11 illustrates a configuration of a reading circuit compatible with the voltage generator circuit illustrated in FIG. 10A. The block diagram of the reading circuit 107 in FIG. 11 shows the reading circuit 113, the reading circuit 114, a reading circuit 115, the comparator 121, the comparators 122, comparators 125, the arithmetic circuit 123, and an arithmetic circuit 126. FIG. 11 also shows the voltage generator circuit 106, the memory cell 104, the load 109, the read switching circuit 110, the read switching switch 112, and the input/output unit I/O.

The reading circuit 115 can judge read data voltages for 3-bit data. The reading circuit 114 can judge read data voltages for 2-bit data. The voltage generator circuit 106 selectively supplies the reference voltages Vref_1 to Vref_7 or Vref_A to Vref_C to a reading circuit that performs judgment of read data voltages.

The configuration illustrated in FIG. 11 enables the power supply voltage not to be supplied to a circuit that is not subjected to data reading among the reading circuits for reading multilevel data in the reading circuit 107. Thus, power consumption of the reading circuit 107 can be reduced.

It is possible to omit some of the comparators included in the reading circuit depending on the number of reference voltages. Specifically, when reference voltages are temporally switched to be input to a comparator, the number of comparators provided in the reading circuit can be reduced.

Figure 12:
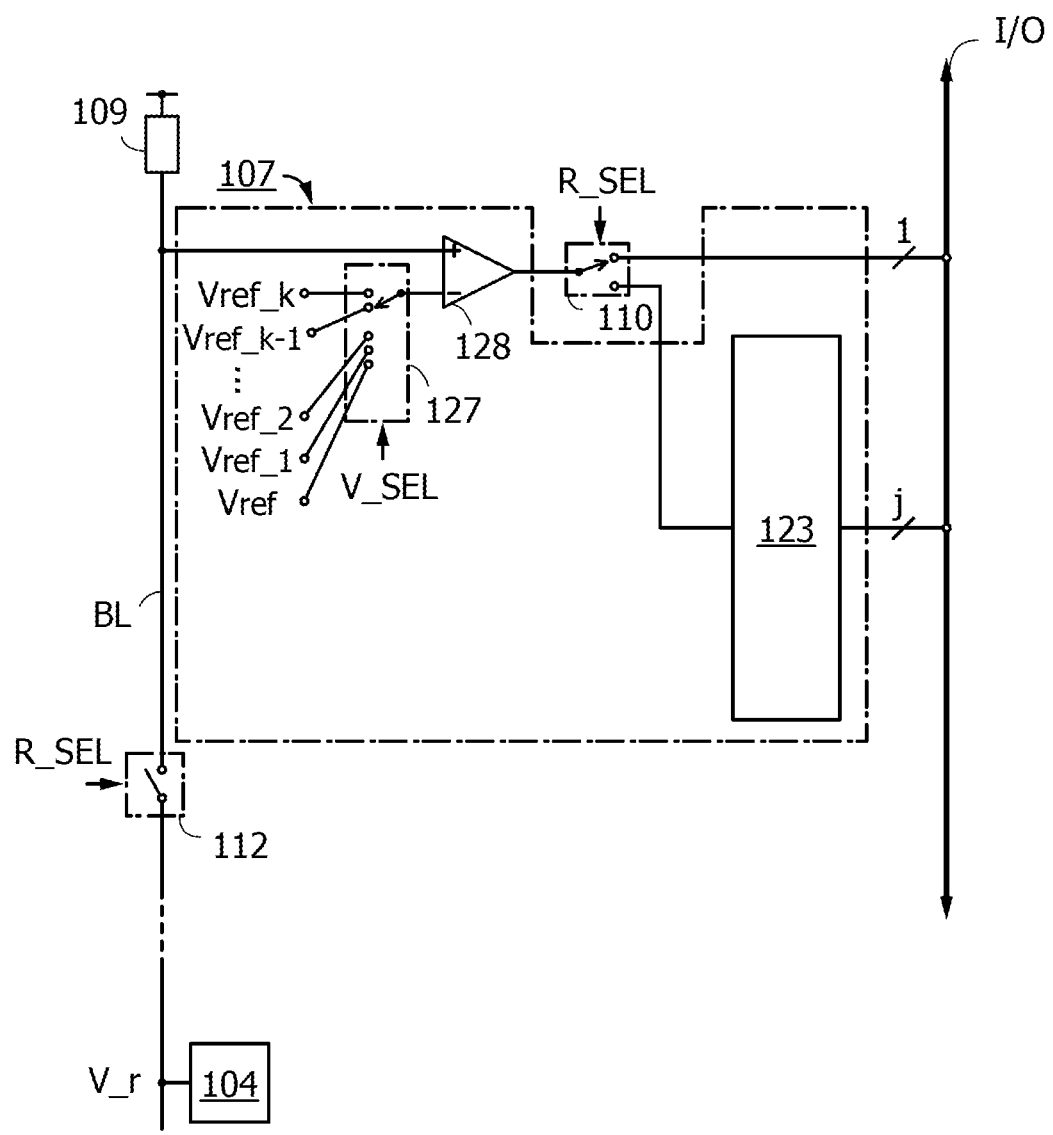
FIG. 12 is a block diagram of a reading circuit.

FIG. 12 illustrates a configuration of a reading circuit having a smaller number of comparators. The block diagram of the reading circuit 107 in FIG. 12 shows a reference voltage switching circuit 127, a comparator 128, and the arithmetic circuit 123. FIG. 12 also shows the memory cell 104, the load 109, the read switching circuit 110, the read switching switch 112, and the input/output unit I/O.

The reference voltage switching circuit 127 is composed of a demultiplexer circuit that switches electrical connection in accordance with a reference voltage control signal V_SEL. For example, the reference voltage switching circuit 127 is configured to judge a read data voltage by sequentially switching the reference voltages Vref_1 to Vref_7 and Vref in accordance with the reference voltage control signal V_SEL.

The reading circuit 107 can judge a read data voltage for binary data or multilevel data on the basis of reference voltages that are input to the comparator 128 while being sequentially switched by the reference voltage switching circuit 127. In the read switching circuit 110, connection is switched in accordance with the read data voltage for binary data or multilevel data. For example, the read switching circuit 110 is switched so that 1-bit data is output to the input/output unit I/O when the read data voltage for binary data is determined, and so that multi-bit data is output to the input/output unit I/O through arithmetic processing by the arithmetic circuit 123 when the read data voltage for multilevel data is determined.

The operation of the comparator 128 supplied with reference voltages that are switched by the reference voltage switching circuit 127 will be described with reference to a circuit diagram and simple timing charts in FIGS. 13A to 13C.

Figure 13A:
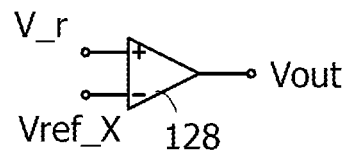
FIG. 13A is a circuit diagram of a reading circuit.

As an example, in the comparator 128 shown in the circuit diagram of FIG. 13A, a read data voltage V_r is input to the non-inverting input terminal, Vref_X representing a given reference voltage is input to the inverting input terminal, and Vout is output from the output terminal.

Figure 13B:
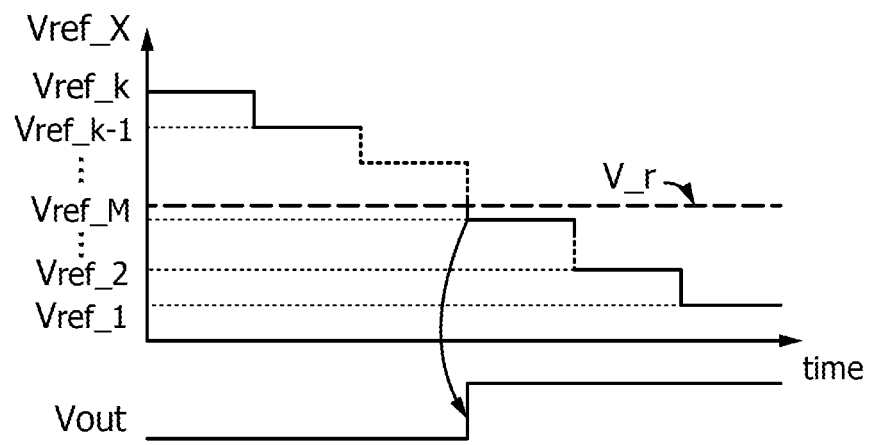
FIGS. 13B and 13C are timing charts of the reading circuit.

FIG. 13B is a timing chart showing an example of determining a read data voltage V_r for multilevel data. FIG. 13B shows a change in a signal of each terminal illustrated in FIG. 13A, and the reference voltage varies from Vref_k to Vref_1 and is compared to the read data voltage V_r. The reference voltage is sequentially changed as shown in FIG. 13B, and a change in Vout of the output terminal can be detected when the reference voltage falls below the read data voltage V_r. Data corresponding to the reference voltage before and after the detection corresponds to data stored in the memory cell.

Figure 13C:
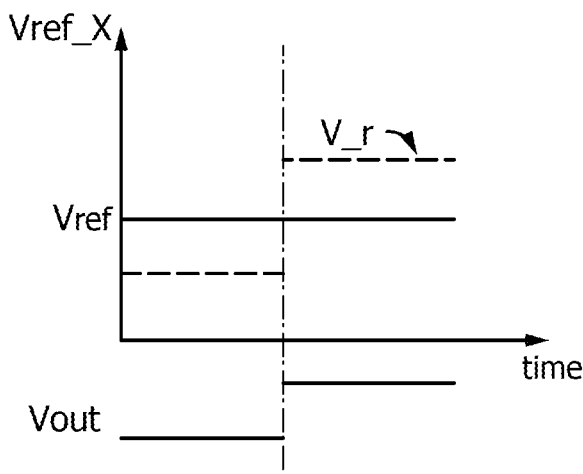

FIG. 13C is a timing chart showing an example of determining a read data voltage V_r for binary data. FIG. 13C shows a change in a signal of each terminal illustrated in FIG. 13A, and the reference voltage Vref is compared to the read data voltage V_r. As shown in FIG. 13C, Vout of the output terminal is at L level when the read data voltage V_r is lower than the reference voltage Vref, and is at H level when the read data voltage V_r is higher than the reference voltage Vref. The level of Vout of the output terminal corresponds to 1-bit data stored in the memory cell.

In the reading circuit 107 having the configuration illustrated in FIG. 12 and FIGS. 13A to 13C, the number of comparators included in the reading circuit 107 can be reduced. Thus, the size and power consumption of the reading circuit 107 can be reduced.

Figure 14:
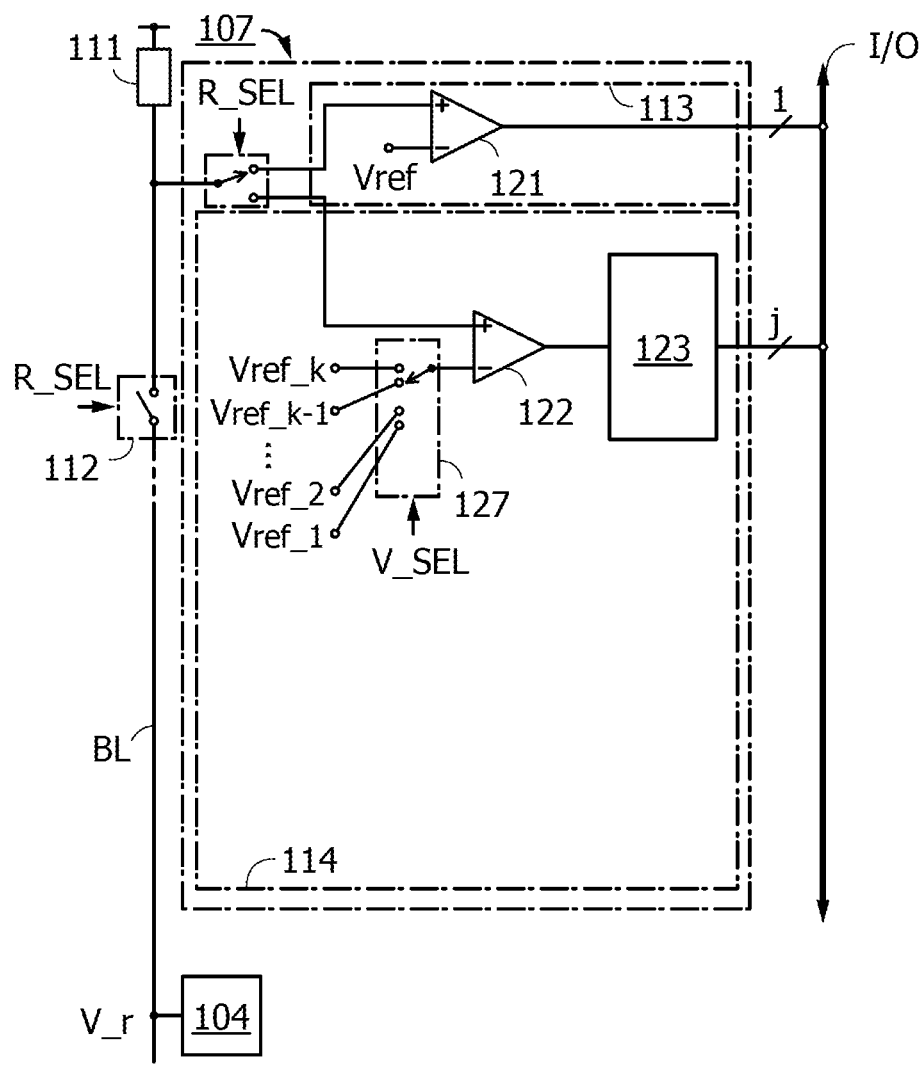
FIG. 14 is a block diagram of a reading circuit.

Although FIG. 12 illustrates the structure in which all reading circuits in the reading circuit 107 operate with a common comparator, the structure is not limited to this. As comparators included in the reading circuit, as illustrated in FIG. 14, for example, different comparators can be provided for the reading circuit 113 determining a read data voltage for binary data and the reading circuit 114 determining a read data voltage for multilevel data.

<Variation of Memory Cell>

Next, a variation of the memory cell will be described with reference to FIGS. 15A and 15B.

The memory cell illustrated in FIG. 1 is a memory element capable of storing binary data and multilevel data. A specific example of such a memory element is a nonvolatile memory having a floating gate. FIGS. 15A and 15B illustrate a simple circuit diagram of a nonvolatile memory having a floating gate and a cross-sectional structure of the memory element.

Figure 15A:
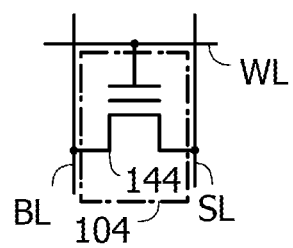
FIGS. 15A and 15B are a circuit diagram and a cross-sectional schematic diagram of a memory cell.

In the circuit diagram in FIG. 15A, the memory cell 104 includes a memory element 144 connected to the bit line BL, the word line WL, and the source line SL. Although FIG. 15A illustrates the structure of a NOR memory cell, the memory cell 104 may be a NAND memory cell.

Figure 15B:
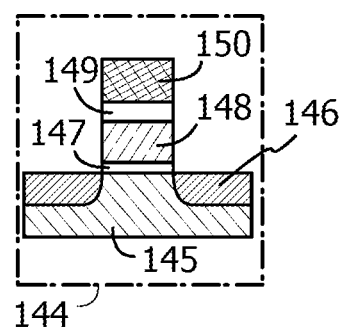

The cross section of the memory element 144 in FIG. 15B shows a substrate 145, impurity regions 146, an insulating film 147, a first gate electrode 148 functioning as a floating gate, an insulating film 149, and a second gate electrode 150 functioning as a control gate.

The structure described in this embodiment can be combined as appropriate with any of the structures described in the other embodiments.

(Embodiment 7)

In Embodiment 7, application examples of the semiconductor device described in the foregoing embodiment will be described with reference to FIGS. 16A and 16B, FIG. 17A to 17C, and FIGS. 18A to 18C.

Figure 16A:
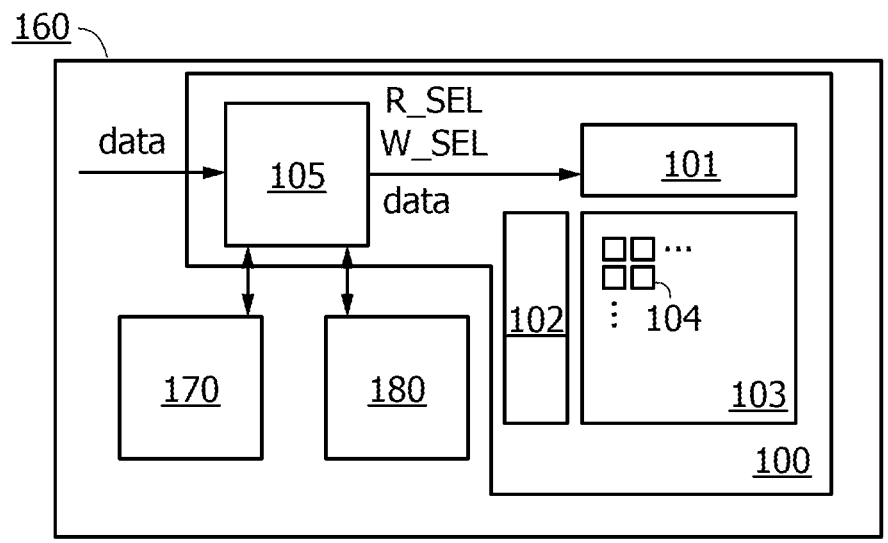
FIGS. 16A and 16B are block diagrams of a semiconductor circuit.

FIG. 16A is a block diagram illustrating an example of a semiconductor circuit 160 including the semiconductor device 100 described in the foregoing embodiment.

Note that a semiconductor circuit refers to a semiconductor device that is mounted on a printed circuit board together with other electronic components such as a memory device. Further, a semiconductor circuit can be composed of an electronic component including a combination of a device functioning as a semiconductor device and a device functioning as a memory device.

The semiconductor circuit 160 in the block diagram of FIG. 16A includes a memory device 170, a memory device 180, and the semiconductor device 100. The semiconductor device 100 illustrated in FIG. 16A includes the driver circuit 101, the driver circuit 102, the memory circuit 103, the memory cells 104, and the control circuit 105.

The memory device 170 includes a circuit from which data can be read at higher speed than the memory device 180. The memory device 170 specifically corresponds to SRAM, DRAM, or the like.

The memory device 180 includes a circuit that has difficulty achieving high-speed data reading but has larger storage capacity than the memory device 170. The memory device 180 is specifically NAND flash memory, a hard disk, or the like.

The control circuit 105 switches data to be stored in the semiconductor device 100 between binary data and multilevel data on the basis of data input to the control circuit 105 and the usage of the memory devices 170 and 180. Specifically, whether data is stored as binary data or multilevel data is selected in such a manner that whether data is written as binary data or multilevel data is determined in accordance with the amount of data stored in the memory devices 170 and 180, and the read control signal R_SEL and the write control signal W_SEL are controlled.

For example, the control circuit 105 may make the semiconductor device 100 store data in the form of multilevel data when the amount of data stored in the memory device 180 accounts for at least 80% of the memory capacity, and may make the semiconductor device 100 store data in the form of binary data in the other cases.

Figure 16B:
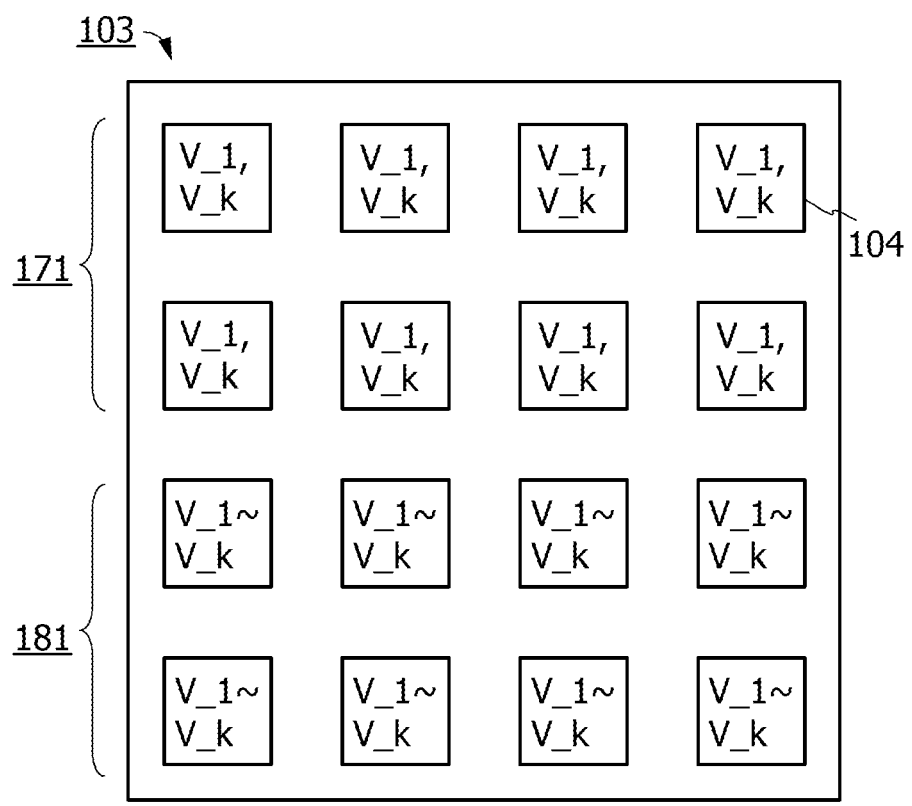

By using the control circuit 105, memory cells storing data in the memory circuit 103 may be divided into a region for binary data and a region for multilevel data. For example, as shown in a block diagram of FIG. 16B, data may be separately stored in a region 171 for binary data and a region 181 for multilevel data. Note that in FIG. 16B, "V_1, V_k" represents a memory cell 104 into which a write data voltage for binary data is written, and "V_1 to V_k" represents a memory cell 104 into which a write data voltage for multilevel data is written. By providing the region 171 and the region 181 in the memory circuit 103 as illustrated in FIG. 16B, an intended function can be achieved by switching functions of the semiconductor device without expanding the memory devices 170 and 180.

Figure 17A:
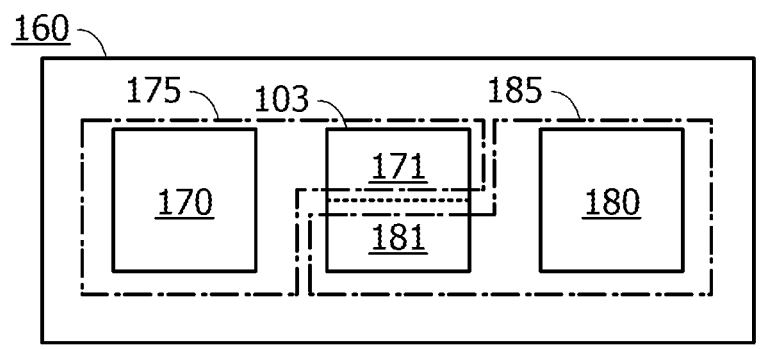
FIGS. 17A to 17C are block diagrams of a semiconductor circuit.

The memory circuit 103 will be specifically described with reference to block diagrams in FIGS. 17A to 17C. For example, it is possible that the region 171 and the region 181 coexist in the memory circuit 103 as illustrated in FIG. 17A. In this case, the memory capacitor of a region 175 from which data can be read at high speed can be larger than that of only the memory device 170. Moreover, the memory capacitor of a region 185 capable of storing a large amount of data can be larger than that of only the memory device 180.

Figure 17B:
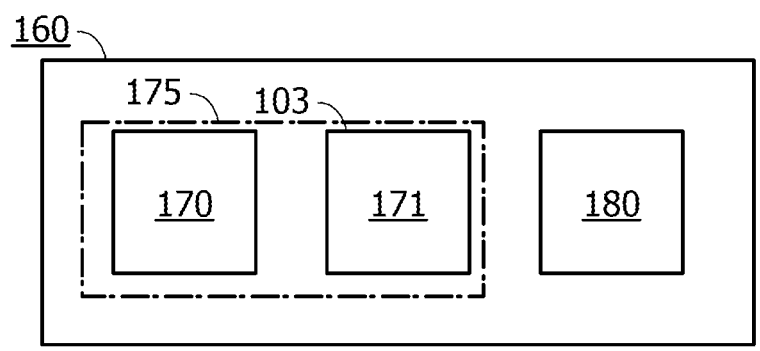
Figure 17C:
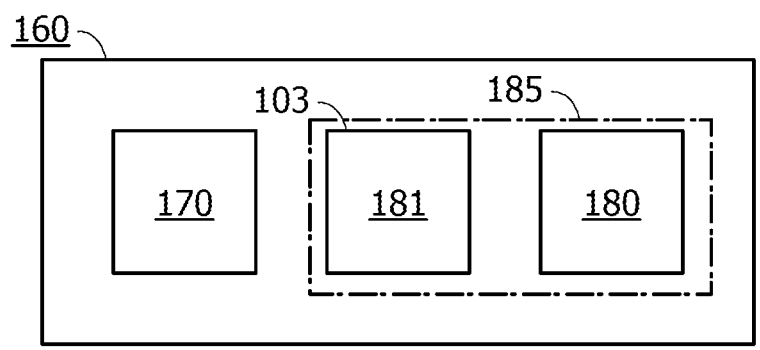

As illustrated in FIGS. 17B and 17C, the region 175, from which data can be read at high speed, and the region 185 having large storage capacity can be switched by switching between the region 171 and the region 181 in the memory circuit 103. Thus, an intended function can be achieved by switching functions of the semiconductor device without expanding the memory devices 170 and 180, and the convenience is increased.

Next, another application example of the semiconductor device will be described.

FIG. 18A is a block diagram illustrating an example of a semiconductor circuit 162 including the semiconductor device 100 described in the foregoing embodiment.

The semiconductor circuit 162 in the block diagram of FIG. 18A includes the memory device 170, the memory device 180, and the semiconductor device 100. The semiconductor device 100 illustrated in FIG. 18A includes the driver circuit 101, the driver circuit 102, the memory circuit 103, the memory cell 104, and the control circuit 105. The block diagram in FIG. 18A differs from the block diagram in FIG. 16A in that the control circuit 105 includes a software memory unit 164 in which software SW can be updated externally The software memory unit 164 can store the software SW. By updating the software SW in the software memory unit 164, the number of levels of multilevel data to be stored in the semiconductor device 100 can be variable. For example, as illustrated in FIG. 18B, first software SW1 is used when data is stored as binary data. Second software SW2 is used when data is stored as 4-level data. Third software SW3 is used when data is stored as 8-level data. The memory capacity of the semiconductor device 100 increases as the number of levels of multilevel data to be stored in the semiconductor device 100 increases.

When the amount of data to be stored in the semiconductor circuit 162 is large, the memory capacitor can be increased or decreased with the use of the memory circuit 103 of the semiconductor device 100 by updating the software SW. Specifically, as illustrated in a block diagram in FIG. 18C, the region 185 having large storage capacity can be controlled when the memory capacity of the memory circuit 103 is increased or decreased by allowing multilevel data to be stored. Accordingly, when it is difficult to further increase the memory capacity of the memory device 180, the memory capacity can be increased or decreased by software update.

The structure described in this embodiment can be combined as appropriate with any of the structures described in the other embodiments.

(Embodiment 8)

In Embodiment 8, a structure and a fabrication method of elements included in a semiconductor device of one embodiment of the disclosed invention, specifically a transistor and a capacitor included in a memory cell will be described with reference to FIGS. 19A and 19B, FIGS. 20A to 20D, FIGS. 21A to 21D, FIGS. 22A to 22D, FIGS. 23A and 23B, and FIGS. 25A and 25B.

<Cross-Sectional Structure and Plan View of Memory Cell>

Figure 19A:
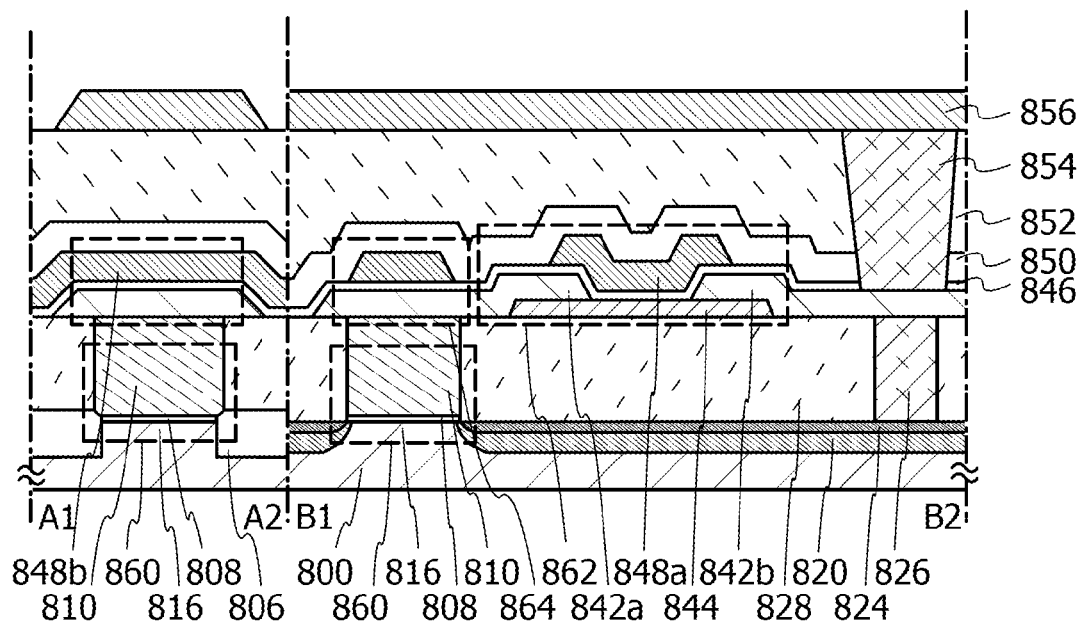
FIGS. 19A and 19B are a cross-sectional view and a top view of a semiconductor device.
Figure 19B:
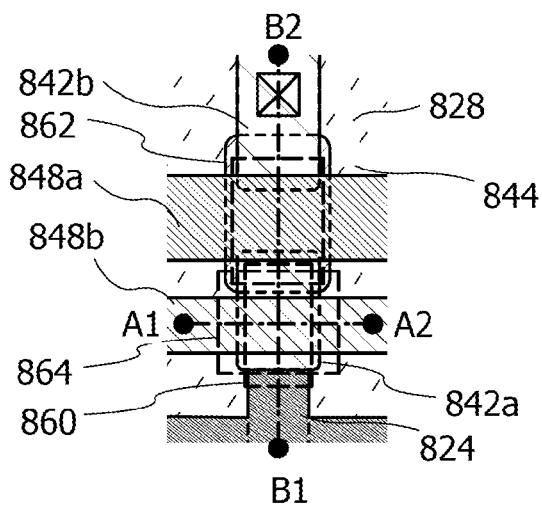

FIGS. 19A and 19B illustrate an example of a structure of a memory cell included in a semiconductor device. FIGS. 19A and 19B are a cross-sectional view and a plan view of the memory cell included in the semiconductor device. In FIG. 19A, the section A1-A2 is a cross section perpendicular to the channel length direction of a transistor, and the section B1-B2 is a cross section parallel to the channel length direction of the transistor. The semiconductor device illustrated in FIGS. 19A and 19B includes a transistor 860 including a first semiconductor material in a lower portion, and a transistor 862 including a second semiconductor material in an upper portion. Although FIGS. 19A and 19B illustrate the semiconductor device including one transistor 860, one transistor 862, and one capacitor 864, the semiconductor device may include a plurality of transistors 860, transistors 862, and capacitors 864.

Here, the first semiconductor material is preferably different from the second semiconductor material. For example, the first semiconductor material can be a semiconductor material other than an oxide semiconductor, and the second semiconductor material can be an oxide semiconductor. As the semiconductor material other than an oxide semiconductor, silicon, germanium, silicon germanium, silicon carbide, or gallium arsenide can be used, for example, and a single crystal semiconductor is preferably used. Alternatively, an organic semiconductor material or the like may be used. A transistor including such a semiconductor material can operate at high speed easily. On the other hand, a transistor including an oxide semiconductor enables charge to be held for a long time owing to its extremely low off-state current.

Note that either an n-channel transistor or a p-channel transistor can be used as the transistor 860 and the transistor 862. Here, the case where the transistors 860 and 862 are n-channel transistors will be described. The technical feature of one embodiment of the present invention is to use a semiconductor material with which off-state current can be sufficiently decreased, such as an oxide semiconductor, in the transistor 862 so that data can be held. Therefore, a specific structure of the semiconductor device, such as a material and components of the semiconductor device, is not limited to that described here.

The transistor 860 includes a channel formation region 816 provided in a substrate 800 containing a semiconductor material (e.g., silicon), impurity regions 820 (also referred to as a source region and a drain region) provided so that the channel formation region 816 is placed therebetween, intermetallic compound regions 824 in contact with the impurity regions 820, a gate insulating layer 808 over the channel formation region 816, and a gate electrode 810 over the gate insulating layer 808. Note that FIGS. 19A and 19B illustrate an element in which distinct source and drain electrodes are not provided; the element in such a state is sometimes referred to as a transistor for convenience. In such a case, to explain the connection relation of a transistor, a source region and a source electrode may be collectively referred to as a source electrode, and a drain region and a drain electrode may be collectively referred to as a drain electrode. That is, in this specification, the term "source electrode" may include a source region.

An electrode 826 is connected to part of the intermetallic compound region 824 of the transistor 860. Here, the electrode 826 serves as a source electrode or a drain electrode of the transistor 860. An element isolation insulating layer 806 is provided over the substrate 800 so as to surround the transistor 860. An insulating layer 828 is provided over the transistor 860. Note that it is preferable that the transistor 860 do not have a sidewall insulating layer as illustrated in FIGS. 19A and 19B in order to achieve high integration. On the other hand, when the importance is put on the characteristics of the transistor 860, sidewall insulating layers may be provided on side surfaces of the gate electrode 810 and the impurity regions 820 may include regions that are provided in regions overlapping with the sidewall insulating layers and have an impurity concentration different from that of the impurity regions 820.

The transistor 862 includes an oxide semiconductor layer 844 over the insulating layer 828 and the like, source/drain electrodes 842a and 842b electrically connected to the oxide semiconductor layer 844, a gate insulating layer 846 for covering the oxide semiconductor layer 844 and the source/drain electrodes 842a and 842b, and a gate electrode 848a provided over the gate insulating layer 846 so as to overlap with the oxide semiconductor layer 844.

Here, the oxide semiconductor layer 844 used in the transistor 862 is preferably an oxide semiconductor layer that is purified by sufficient removal of impurities such as hydrogen or sufficient supply of oxygen. For example, the concentration of hydrogen in the oxide semiconductor layer 844 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower. Note that the concentration of hydrogen in the oxide semiconductor layer 844 is measured by secondary ion mass spectrometry (SIMS). In the oxide semiconductor layer 844 which is highly purified by sufficient reduction in the hydrogen concentration and in which defect levels in the energy gap due to oxygen vacancies are reduced by sufficient supply of oxygen, the carrier concentration is lower than $1 \times 10^{12}$/cm$^3$, preferably lower than $1 \times 10^{11}$/cm$^3$, further preferably lower than $1.45 \times 10^{10}$/cm$^3$. For example, the off-state current (here, current per micrometer (μm) of channel width) of the transistor at room temperature (25° C.) is lower than or equal to 100 zA (1 zA (zeptoampere) is $1 \times 10^{-21}$ A), preferably lower than or equal to 10 zA. Thus, the transistor 862 can have excellent off-state current characteristics by using the i-type (intrinsic) or substantially i-type oxide semiconductor layer 844.

Although the oxide semiconductor layer that is processed into an island shape is used in the transistor 862 in order to suppress leakage current generated between elements due to miniaturization, an oxide semiconductor layer that is not processed into an island shape may be used. When an oxide semiconductor layer is not processed into an island shape, contamination of the oxide semiconductor layer due to etching for processing can be prevented.

The capacitor 864 includes the source/drain electrode 842a, the gate insulating layer 846, and a conductive layer 848b. That is, the source/drain electrode 842a functions as one electrode of the capacitor 864, and the conductive layer 848b functions as the other electrode of the capacitor 864. With such a structure, capacitance can be sufficiently secured. When the oxide semiconductor layer 844 and the gate insulating layer 846 are stacked, insulation between the source/drain electrode 842a and the conductive layer 848b can be sufficiently secured. The capacitor 864 may be omitted if capacitance is not necessary.

Note that in the transistor 862 and the capacitor 864, end portions of the source/drain electrodes 842a and 842b are preferably tapered. The tapered end portions of the source/drain electrodes 842a and 842b can improve the coverage thereof with the gate insulating layer 846 and prevent disconnection. Here, a taper angle is in the range of 30° to 60°, for example. Note that the taper angle means an inclination angle formed with a side surface and a bottom surface of a layer having a tapered shape (e.g., the source/drain electrode 842a) when seen from a direction perpendicular to a cross section (a plane perpendicular to a surface of a substrate) of the layer.

An insulating layer 850 and an insulating layer 852 are provided over the transistor 862 and the capacitor 864. An electrode 854 is provided in an opening formed in the gate insulating layer 846, the insulating layers 850 and 852, and the like. A wiring 856 connected to the electrode 854 is formed over the insulating layer 852. Although the intermetallic compound region 824, the source/drain electrode 842b, and the wiring 856 are connected to each other through the electrode 826 and the electrode 854 in FIGS. 19A and 19B, one embodiment of the present invention is not limited to this structure. For example, the source/drain electrode 842b may be directly in contact with the intermetallic compound region 824. Alternatively, the wiring 856 may be in direct contact with the source/drain electrode 842b.

In FIGS. 19A and 19B, the electrode 826 for connecting the intermetallic compound region 824 to the source/drain electrode 842b and the electrode 854 for connecting the source/drain electrode 842b to the wiring 856 overlap with each other. In other words, a region where the electrode 826 functioning as the source electrode or the drain electrode of the transistor 860 is in contact with the source/drain electrode 842b of the transistor 862 overlaps with a region where the source/drain electrode 842b of the transistor 862 is in contact with the electrode 854 for connecting one memory cell to another memory cell. With such a planar layout, the increase in the element area due to the contact regions can be suppressed. In other words, the degree of integration of the semiconductor device can be increased.

In FIGS. 19A and 19B, the transistor 860 and the transistor 862 are provided to at least partly overlap with each other. Moreover, the transistor 862 and the capacitor 864 are provided to overlap with the transistor 860. For example, the conductive layer 848b of the capacitor 864 is provided to overlap with at least part of the gate electrode 810 of the transistor 860. By employing such a planar layout, high integration can be achieved. For example, given that the minimum feature size is F, the area of a memory cell can be 15 $F^2$ to 25 $F^2$.

<Method for Fabricating Memory Cell Included in Semiconductor Device>

Next, an example of a method for fabricating a memory cell included in the semiconductor device will be described. First, a method for fabricating the transistor 860 in the lower portion will be described with reference to FIGS. 20A to 20D and FIGS. 21A to 21D, and then a method for fabricating the transistor 862 in the upper portion and the capacitor 864 will be described with reference to FIGS. 22A to 22D and FIGS. 23A and 23B.

<Method for Fabricating Lower Transistor>

First, a method for fabricating the transistor 860 in the lower portion will be described with reference to FIGS. 20A to 20D and FIGS. 21A to 21D.

First, the substrate 800 containing a semiconductor material is prepared. Examples of the substrate containing a semiconductor material are a single crystal semiconductor substrate or a polycrystalline semiconductor substrate of silicon, silicon carbide, or the like; a compound semiconductor substrate of silicon germanium or the like; and an SOI substrate. Here, as an example, a single crystal silicon substrate is used as the substrate 800 containing a semiconductor material. Note that in general, the term "SOI substrate" means a substrate where a silicon semiconductor layer is provided on an insulating surface. In this specification and the like, the term "SOI substrate" also includes, in its category, a substrate where a semiconductor layer formed using a material other than silicon is provided over an insulating surface. That is, a semiconductor layer included in the SOI substrate is not limited to a silicon semiconductor layer. Moreover, the SOI substrate can be a substrate having a structure in which a semiconductor layer is provided over an insulating substrate such as a glass substrate, with an insulating layer placed therebetween.

For the substrate 800 containing a semiconductor material, a single crystal semiconductor substrate of silicon or the like is preferable because the speed of read operation of the semiconductor device can be increased.

Figure 20A:
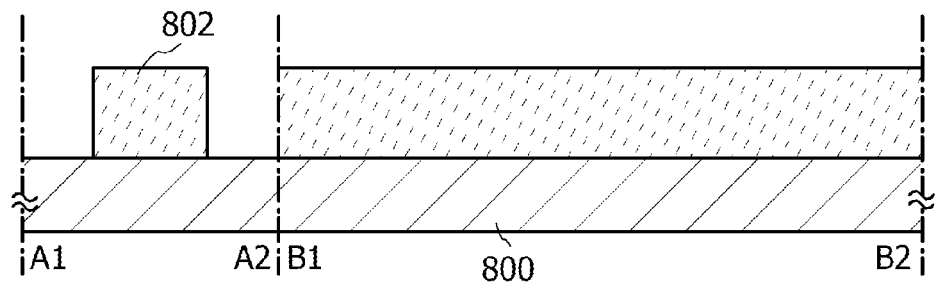
FIGS. 20A to 20D are cross-sectional views illustrating steps of fabricating a semiconductor device.
Figure 20B:
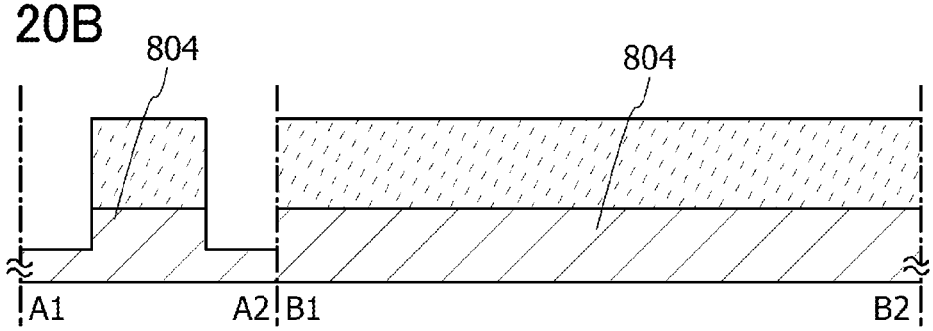

Over the substrate 800, a protective layer 802 serving as a mask for forming an element isolation insulating layer is formed (see FIG. 20A). As the protective layer 802, an insulating layer formed using silicon oxide, silicon nitride, silicon oxynitride, or the like can be used, for example. Note that before or after this step, an impurity element imparting n-type conductivity or an impurity element imparting p-type conductivity may be added to the substrate 800 in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Next, part of the substrate 800 in a region that is not covered with the protective layer 802 (i.e., an exposed region) is removed by etching with the use of the protective layer 802 as a mask. Thus, a semiconductor region 804 isolated from the other semiconductor regions is formed (see FIG. 20B). As the etching, dry etching is preferably performed, but wet etching may be performed. An etching gas or an etchant can be selected as appropriate depending on a material to be etched.

Figure 20C:
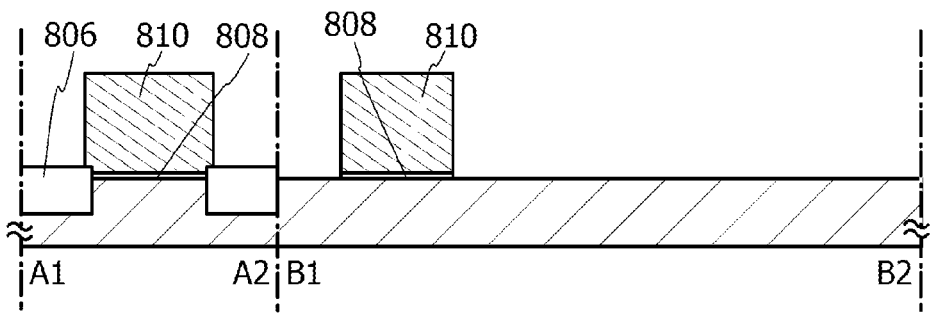

Then, an insulating layer is formed so as to cover the semiconductor region 804 and the insulating layer in a region overlapping with the semiconductor region 804 is selectively removed, so that the element isolation insulating layer 806 is formed (see FIG. 20C). The insulating layer is formed using silicon oxide, silicon nitride, silicon oxynitride, or the like. To remove the insulating layer, any of etching treatment, polishing treatment such as chemical mechanical polishing (CMP), and the like can be employed. Note that the protective layer 802 is removed after formation of the semiconductor region 804 or after formation of the element isolation insulating layer 806.

Here, CMP treatment is treatment of planarizing a surface of an object to be processed by a combination of chemical and mechanical actions. Specifically, CMP treatment is a method in which a polishing cloth is attached to a polishing stage, the polishing stage and the object are each rotated or swung while a slurry (abrasive) is supplied between the object and the polishing cloth, and the surface of the object is polished by chemical reaction between the slurry and the surface of the object and by action of mechanical polishing of the object with the polishing cloth.

Note that the element isolation insulating layer 806 may be formed by introducing oxygen to form an insulating region, for example, instead of selectively removing the insulating layer.

Next, an insulating layer is formed on a surface of the semiconductor region 804, and a layer containing a conductive material is formed over the insulating layer.

The insulating layer is to be a gate insulating layer later, and can be formed by heat treatment (such as thermal oxidation treatment or thermal nitridation treatment) on the surface of the semiconductor region 804, for example. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed by CVD, sputtering, or the like. The insulating layer preferably has a single-layer structure or a stacked structure including any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, and the like. The insulating layer can have a thickness of, for example, 1 nm to 100 nm, preferably 10 nm to 50 nm.

The layer containing a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of film formation methods such as evaporation, CVD, sputtering, and spin coating can be employed. Note that this embodiment shows an example of the case where the layer containing a conductive material is formed using a metal material.

After that, the insulating layer and the layer containing a conductive material are selectively etched; thus, the gate insulating layer 808 and the gate electrode 810 are formed (see FIG. 20C).

Figure 20D:
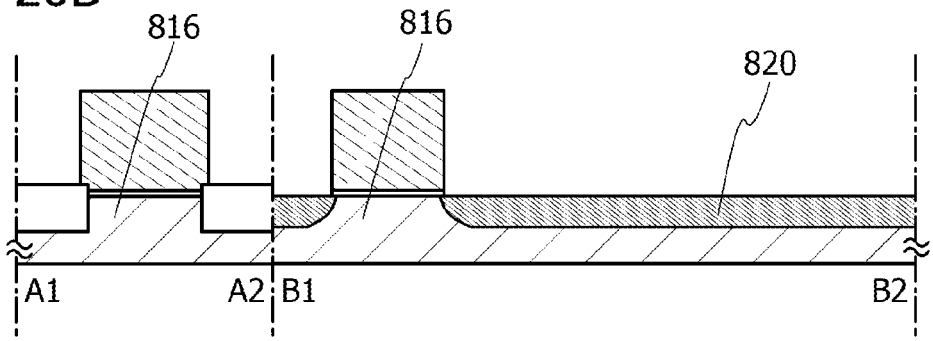

Next, phosphorus (P), arsenic (As), or the like is added to the semiconductor region 804, so that the channel formation region 816 and the impurity regions 820 are formed (see FIG. 20D). Note that phosphorus or arsenic is added here in order to form an n-channel transistor; an impurity element such as boron (B) or aluminum (Al) is added to form a p-channel transistor. Here, the concentration of the impurity added can be set as appropriate; the concentration is preferably increased when the size of a semiconductor element is extremely decreased.

Note that a sidewall insulating layer may be formed around the gate electrode 810, and impurity regions to which the impurity element is added at a different concentration may be formed.

Figure 21A:
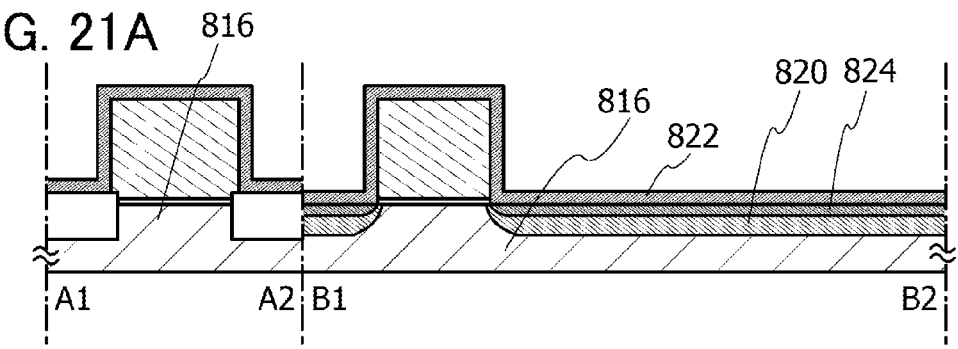
FIGS. 21A to 21D are cross-sectional views illustrating steps of fabricating a semiconductor device.

Then, a metal layer 822 is formed so as to cover the gate electrode 810, the impurity regions 820, and the like (see FIG. 21A). A variety of film formation methods such as vacuum evaporation, sputtering, and spin coating can be employed to form the metal layer 822. The metal layer 822 is preferably formed using a metal material that forms a low-resistance metal compound by reacting with the semiconductor material included in the semiconductor region 804. Examples of such a metal material are titanium, tantalum, tungsten, nickel, cobalt, and platinum.

Next, heat treatment is performed so that the metal layer 822 reacts with the semiconductor material. Thus, the intermetallic compound regions 824 in contact with the impurity regions 820 are formed (see FIG. 21A). When the gate electrode 810 is formed using polycrystalline silicon or the like, an intermetallic compound region is also formed in a portion of the gate electrode 810 in contact with the metal layer 822.

As the heat treatment, irradiation with a flash lamp can be employed, for example. Although it is needless to say that another heat treatment method may be used, a method by which heat treatment for an extremely short time is achieved is preferably used in order to improve the controllability of chemical reaction in formation of the metal compound. Note that the intermetallic compound regions are formed by reaction of the metal material and the semiconductor material and have sufficiently high conductivity. The formation of the intermetallic compound regions can properly reduce the electric resistance and improve element characteristics. Note that the metal layer 822 is removed after the intermetallic compound regions 824 are formed.

Figure 21B:
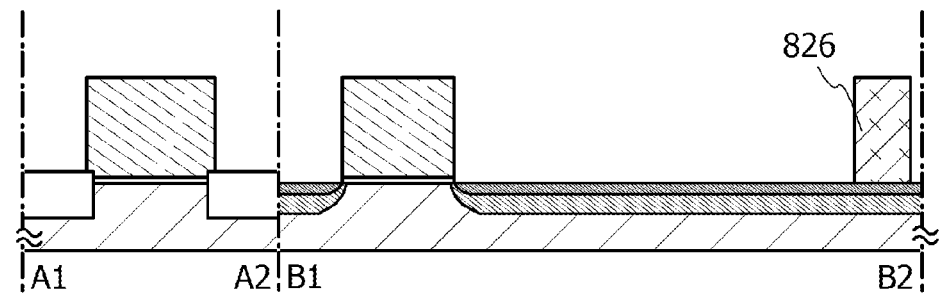

Then, the electrode 826 is formed in a region that is in contact with part of the intermetallic compound region 824 (see FIG. 21B). The electrode 826 is formed by, for example, forming a layer containing a conductive material and then selectively etching the layer. The layer containing a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of film formation methods such as evaporation, CVD, sputtering, and spin coating can be employed.

Figure 21C:
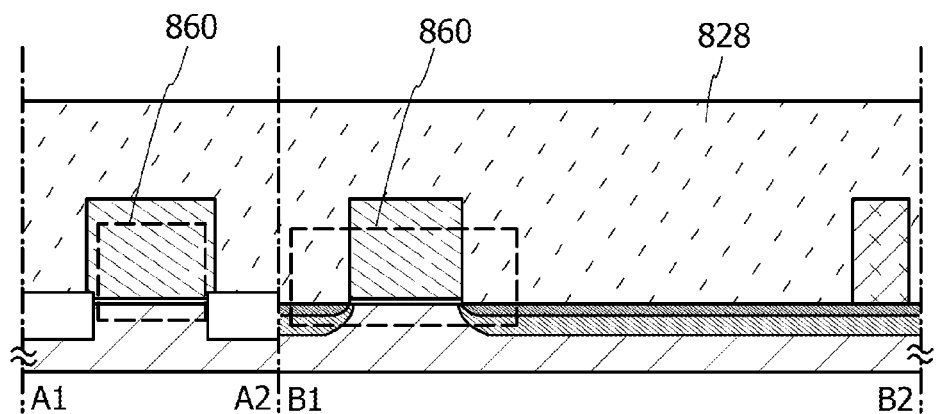

Next, the insulating layer 828 is formed so as to cover the components formed in the above steps (see FIG. 21C). The insulating layer 828 can be formed using a material including an inorganic insulating material such as silicon oxide, silicon oxynitride, silicon nitride, or aluminum oxide. In particular, the insulating layer 828 is preferably formed using a low dielectric constant (low-k) material because capacitance due to overlap of electrodes or wirings can be sufficiently reduced. Note that the insulating layer 828 may be a porous insulating layer formed using any of these materials. Since the porous insulating layer has low dielectric constant as compared to a dense insulating layer, capacitance due to electrodes or wirings can be further reduced. Alternatively, the insulating layer 828 can be formed using an organic insulating material such as polyimide or acrylic. Although the insulating layer 828 has a single-layer structure here, one embodiment of the present invention is not limited to this example. The insulating layer 828 may have a stacked structure including two or more layers. In the case of employing a three-layer structure, the insulating layer 828 can have a stacked structure of a silicon oxynitride layer, a silicon nitride oxide layer, and a silicon oxide layer, for example.

Note that the electrode 826 can be formed so as to fill an opening that is formed in the insulating layer 828 to reach the intermetallic compound region 824 after the formation of the insulating layer 828.

In that case, it is possible to use a method, for example, in which a thin titanium film is formed in a region including the opening by PVD and a thin titanium nitride film is formed by CVD, and then a tungsten film is formed so as to fill the opening. Here, the titanium film formed by PVD has a function of reducing an oxide film (e.g., a native oxide film) formed on a surface where the titanium film is formed, thereby lowering the contact resistance with the lower electrode and the like (here, the intermetallic compound region 824). The titanium nitride film formed after the formation of the titanium film has a barrier function of preventing diffusion of the conductive material. A copper film may be formed by a plating method after the formation of the barrier film of titanium, titanium nitride, or the like.

Through the above steps, the transistor 860 is formed with the use of the substrate 800 containing a semiconductor material (see FIG. 21C). The transistor 860 can operate at high speed, so that the use of the transistor 860 as a reading transistor enables data reading at high speed.

Figure 21D:
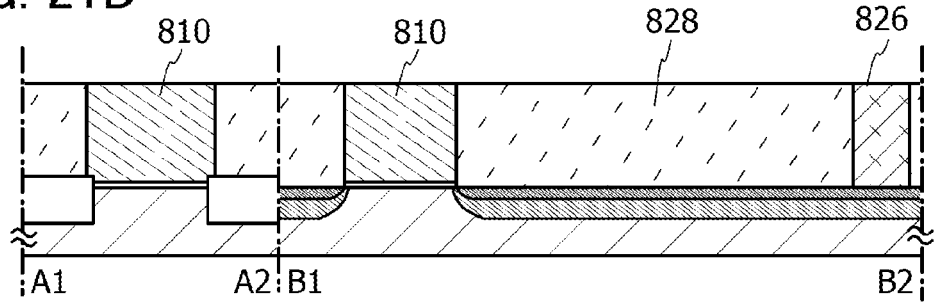

After that, as treatment performed before the transistor 862 and the capacitor 864 are formed, CMP treatment is performed on the insulating layer 828 so that upper surfaces of the gate electrode 810 and the electrode 826 are exposed (see FIG. 21D). As treatment for exposing the upper surfaces of the gate electrode 810 and the electrode 826, etching treatment or the like can be employed instead of CMP treatment; in order to improve characteristics of the transistor 862, the surface of the insulating layer 828 is preferably made as flat as possible. The average surface roughness ($R_a$) of the insulating layer 828 is preferably greater than or equal to 0.1 nm and less than 0.5 nm. This is because crystal orientations can be aligned when an oxide semiconductor film is a crystalline oxide semiconductor film.

Note that the average surface roughness ($R_a$) is obtained by expanding the arithmetic means surface roughness ($R_a$) which is defined by JIS B 0601:2001 (ISO 4287:1997) into three dimensions to be able to be applied to a curved surface. The average surface roughness ($R_a$) is an average value of the absolute values of deviations from a reference surface to a specific surface.

Note that dry etching or the like may be performed instead of CMP treatment in order to planarize the insulating layer 828. As the etching gas, a chlorine-based gas such as a chlorine gas, a boron chloride gas, a silicon chloride gas, or a carbon tetrachloride gas or a fluorine-based gas such as a carbon tetrafluoride gas, a sulfur fluoride gas, or a nitrogen fluoride gas can be used, for example.

Alternatively, plasma treatment or the like may be performed instead of CMP treatment in order to planarize the insulating layer 828. A rare gas is favorably used for the plasma treatment. In the plasma treatment, a surface to be processed is irradiated with ions of an inert gas, and minute projections and depressions on the surface are planarized by a sputtering effect. Such plasma treatment is also referred to as reverse sputtering.

Note that in order to planarize the insulating layer 828, at least one of the above treatments can be employed. For example, only reverse sputtering may be performed, or dry etching may be performed after CMP treatment. Note that dry etching or reverse sputtering is preferably employed in order to prevent entry of water into the insulating layer 828 over which an oxide semiconductor film is formed. In particular, dry etching or reverse sputtering is preferably used when planarization treatment is performed after the heat treatment. Since a solution such as slurry is used in CMP treatment to polish the insulating layer 828, sufficient cleaning and drying are preferably performed after the treatment.

Note that before or after each of the above steps, a step for forming an electrode, a wiring, a semiconductor layer, an insulating layer, or the like may be performed. For example, a multilayer wiring structure in which an insulating layer and a conductive layer are stacked may be employed as a wiring structure, whereby a highly integrated semiconductor device can be provided.

<Method for Fabricating Upper Transistor>

Next, a method for fabricating the transistor 862 in the upper portion and the capacitor 864 will be described with reference to FIGS. 22A to 22D and FIGS. 23A and 23B.

Figure 22A:
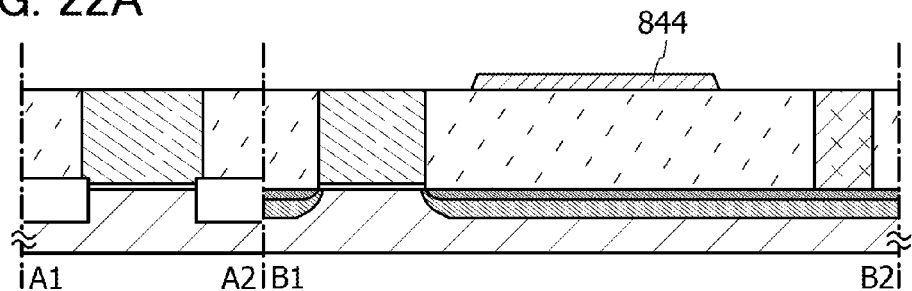
FIGS. 22A to 22D are cross-sectional views illustrating steps of fabricating a semiconductor device.

First, an oxide semiconductor film is formed over the gate electrode 810, the electrode 826, the insulating layer 828, and the like and is processed, so that the oxide semiconductor layer 844 is formed (see FIG. 22A). Note that an insulating layer functioning as a base may be formed over the gate electrode 810, the electrode 826, and the insulating layer 828 before the oxide semiconductor film is formed. The insulating layer can be formed by PVD such as sputtering or CVD such as plasma CVD.

A material used for the oxide semiconductor film preferably contains at least indium (In) or zinc (Zn). In addition, as a stabilizer for reducing variations in electric characteristics of transistors using the oxide semiconductor film, the material preferably contains gallium (Ga), tin (Sn), hafnium (Hf), aluminum (Al), and/or zirconium (Zr).

Unlike silicon carbide, gallium nitride, or gallium oxide, In—Ga—Zn-based oxide or In—Sn—Zn-based oxide among oxide semiconductors enables a transistor with excellent electrical characteristics to be formed by sputtering or a wet process. Further, unlike silicon carbide, gallium nitride, or gallium oxide, the In—Ga—Zn-based oxide enables the formation of a transistor having excellent electrical characteristics without high-temperature treatment above 740° C.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide means an oxide containing In, Ga, and Zn, and there is no limitation on the ratio of In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Moreover, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, with an In—Sn—Zn-based oxide, high mobility is obtained relatively easily. However, even with an In—Ga—Zn-based oxide, mobility can be increased by reducing the defect density in the bulk.

The thickness of the oxide semiconductor film ranges preferably from 3 nm to 100 nm. This is because the transistor might be normally on when the oxide semiconductor film is too thick (e.g., the thickness is 200 nm or more).

It is preferable to form the oxide semiconductor film by a method with which impurities such as hydrogen, water, hydroxyl group, or hydride do not easily enter the oxide semiconductor film. For example, sputtering can be used. If the oxide semiconductor film contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, after formation of the oxide semiconductor film, dehydration treatment (dehydrogenation treatment) is preferably performed to remove hydrogen or moisture from the oxide semiconductor film so that the oxide semiconductor film contains impurities as little as possible.

Note that oxygen in the oxide semiconductor film is also reduced by the dehydration treatment (dehydrogenation treatment) in some cases. Accordingly, it is preferable that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film.

In this embodiment, an In—Ga—Zn-based oxide semiconductor film is formed by sputtering; however, the In—Ga—Zn-based oxide semiconductor film may be formed by a method other than sputtering.

As the In—Ga—Zn-based oxide target, a target expressed by a composition ratio of $In_2O_3:Ga_2O_3:ZnO=1:x:y$ (x is 0 or more and y is from 0.5 to 5) is preferably used. For example, a target with a composition ratio of $In_2O_3:Ga_2O_3:ZnO=1:1:2$ [atomic ratio] can be used. Moreover, it is possible to use a target with a composition ratio of $In_2O_3:Ga_2O_3:ZnO=1:1:1$ [atomic ratio] or 1:1:4 [atomic ratio].

In the case where an In—Zn-based material is used as the oxide semiconductor, a target therefor has a composition of In:Zn=50:1 to 1:2 in an atomic ratio ($In_2O_3:ZnO$=25:1 to 1:4 in a molar ratio), preferably In:Zn=20:1 to 1:1 in an atomic ratio ($In_2O_3:ZnO$=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for forming an In—Zn-based oxide semiconductor with an atomic ratio of In:Zn:O=X:Y:Z, the relation of Z>1.5X+Y is satisfied.

For an In—Sn—Zn-based film, an oxide semiconductor target with a composition ratio of In:Sn:Zn=1:2:2, 2:1:3, 1:1:1, or 20:45:35 in an atomic ratio can be used, for example.

The relative density of a metal oxide in the target is 80% or higher, preferably 95% or higher, further preferably 99.9% or higher. The use of a target with high relative density makes it possible to form an oxide semiconductor film with a dense structure.

In forming the oxide semiconductor film by sputtering, for example, an object to be processed is held in a treatment chamber that is maintained under reduced pressure, and the object is heated to a temperature higher than or equal to 100° C. and lower than 550° C., preferably higher than or equal to 200° C. and lower than or equal to 400° C. Alternatively, the temperature of the object at the time of forming the oxide semiconductor film may be room temperature. Then, a sputtering gas from which hydrogen, water, and the like are removed is introduced while moisture in the treatment chamber is removed, and the oxide semiconductor film is formed with the use of the above target. By forming the oxide semiconductor film while the object is heated, impurities in the oxide semiconductor film, such as hydrogen and water, can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. Since impurities such as moisture can be removed from the treatment chamber evacuated with a cryopump or the like, the concentration of impurities in the oxide semiconductor film can be reduced.

When the oxide semiconductor film is formed by sputtering, the following conditions can be set, for example: the distance between the object to be processed and the target is 170 mm; the pressure is 0.4 Pa; the direct current (DC) power is 0.5 kW; and the atmosphere is an oxygen (100% oxygen) atmosphere, an argon (100% argon) atmosphere, or a mixed atmosphere of oxygen and argon. Note that a pulsed direct current (DC) power source is preferably used because particles (such as powder substances generated in film formation) can be reduced and the film thickness can be uniform. The thickness of the oxide semiconductor film ranges from 1 nm to 50 nm, preferably from 1 nm to 30 nm, further preferably from 1 nm to 10 nm. With the oxide semiconductor film having such a thickness, a short-channel effect due to miniaturization can be suppressed. Note that the appropriate thickness differs depending on the oxide semiconductor material, the intended use of a semiconductor device, or the like; therefore, the thickness can be determined as appropriate in accordance with the material, the intended use, or the like.

Note that before the oxide semiconductor film is formed by sputtering, reverse sputtering in which plasma is generated with an argon gas introduced is preferably performed so that a material attached to a surface where the oxide semiconductor film is to be formed (e.g., a surface of the insulating layer 828) is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated in the vicinity of the object. Note that an atmosphere of nitrogen, helium, oxygen, or the like may be used instead of an argon atmosphere.

The oxide semiconductor film can be processed by being etched after a mask having a desired shape is formed over the oxide semiconductor film. The mask can be formed by a method such as photolithography or an ink-jet method. For the etching of the oxide semiconductor film, either wet etching or dry etching may be employed. It is needless to say that both of them may be used in combination.

As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, parallel plate reactive ion etching (RIE) or inductively coupled plasma (ICP) etching can be used. In order to etch the film to have a desired shape, the etching conditions (e.g., the amount of power applied to a coiled electrode, the amount of power applied to an electrode on the substrate side, and the electrode temperature on the substrate side) are adjusted as appropriate.

As an etchant used for wet etching, a mixed solution of phosphoric acid, acetic acid, and nitric acid or organic acid such as citric acid or oxalic acid can be used. In this embodiment, ITO-07N (produced by Kanto Chemical Co., Inc.) is used.

Note that the oxide semiconductor layer 844 formed by the above method contains moisture or hydrogen (including a hydroxyl group) as impurities in some cases. Moisture or hydrogen easily forms donor levels and thus serves as an impurity in the oxide semiconductor. In order to reduce impurities such as moisture and hydrogen in the oxide semiconductor layer (dehydrate or dehydrogenate the oxide semiconductor layer), the oxide semiconductor layer may be subjected to heat treatment for dehydration or dehydrogenation (hereinafter referred to as first heat treatment) in a reduced-pressure atmosphere, an inert gas atmosphere such as a nitrogen atmosphere or a rare gas atmosphere, an oxygen gas atmosphere, or the like.

By performing the first heat treatment on the oxide semiconductor layer 844, moisture or hydrogen in the oxide semiconductor layer 844 can be eliminated. Specifically, heat treatment can be performed at a temperature higher than or equal to 250° C. and lower than or equal to 750° C., preferably higher than or equal to 400° C. and lower than the strain point of the substrate. For example, heat treatment may be performed at 500° C. for about 3 to 6 minutes. When rapid thermal annealing (RTA) is used for the heat treatment, dehydration or dehydrogenation can be performed in a short time; thus, treatment can be performed even at a temperature higher than the strain point of a glass substrate.

The heat treatment apparatus is not limited to an electric furnace and may have a device for heating an object by thermal conduction or thermal radiation from a heating element such as a resistance heating element. For example, an RTA apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, like nitrogen or a rare gas such as argon is used.

In the first heat treatment, it is preferable that moisture, hydrogen, and the like be not contained in nitrogen or a rare gas such as helium, neon, or argon. Alternatively, the purity of nitrogen or a rare gas such as helium, neon, or argon introduced into the heat treatment apparatus is preferably 6N (99.9999%) or higher, more preferably 7N (99.99999%) or higher (i.e., the impurity concentration is preferably 1 ppm or less, more preferably 0.1 ppm or less).

Further, second heat treatment may be performed on the oxide semiconductor layer 844 which has been subjected to the first heat treatment. The second heat treatment is performed in an oxidizing atmosphere in order to supply oxygen to the oxide semiconductor layer 844 so that oxygen vacancies caused in the oxide semiconductor layer 844 by the first heat treatment are compensated. Accordingly, the second heat treatment can be referred to as oxygen adding treatment. The second heat treatment can be performed at a temperature higher than or equal to 200° C. and lower than the strain point of the substrate, for example, and is preferably performed at a temperature ranging from 250° C. to 450° C. The treatment time is 3 minutes to 24 hours. As the treatment time is increased, the proportion of a crystal region to an amorphous region in the oxide semiconductor layer 844 can be increased. Note that heat treatment for longer than 24 hours is not preferable because the productivity is decreased.

An oxidizing atmosphere is an atmosphere containing an oxidizing gas. An oxidizing gas is oxygen, ozone, nitrous oxide, or the like and preferably does not contain water, hydrogen, and the like. For example, the purity of oxygen, ozone, or nitrous oxide introduced into a heat treatment apparatus is 8N (99.999999%) or higher, preferably 9N (99.9999999%) or higher (i.e., the impurity concentration is 1 ppm or less, preferably less than 0.1 ppm). For an oxidizing atmosphere, a mixture of an oxidizing gas and an inert gas may be used, in which case the mixture contains 10 ppm or more of an oxidizing gas. Further, an inert atmosphere refers to an atmosphere containing an inert gas such as nitrogen or a rare gas (e.g., helium, neon, argon, krypton, or xenon) as the main component. Specifically, the concentration of a reactive gas such as an oxidizing gas is less than 10 ppm.

Note that the second heat treatment can be performed using the same heat treatment apparatus and the same gas as those used for the first heat treatment. It is preferable that the first heat treatment for dehydration or dehydrogenation and the second heat treatment for oxygen addition be successively performed. When the first heat treatment and the second heat treatment are performed successively, the productivity of a semiconductor device can be increased.

The oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when a CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (0 scan) is performed under conditions where the sample is rotated around a normal vector of a sample surface as an axis (0 axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when 0 scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, change in electric characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

Figure 22B:
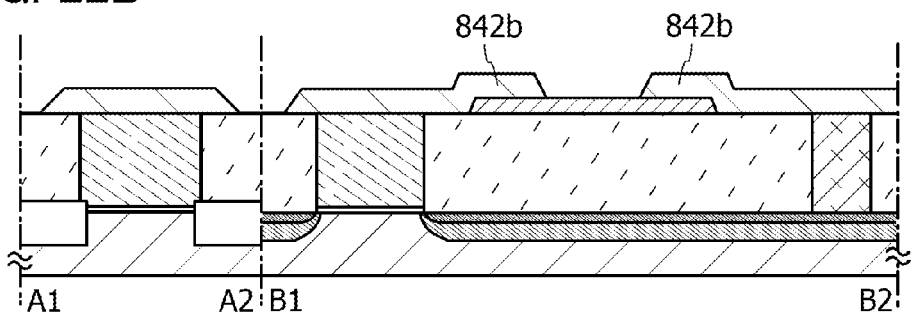

Next, a conductive layer for forming a source electrode and a drain electrode (including a wiring formed using the same layer as the source and drain electrodes) is formed over the oxide semiconductor layer 844 and the like and is processed, so that the source/drain electrodes 842a and 842b are formed (see FIG. 22B).

The conductive layer can be formed by PVD or CVD. As a material for the conductive layer, an element selected from aluminum, chromium, copper, tantalum, titanium, molybdenum, and tungsten; an alloy containing any of these elements as a component; or the like can be used. One or more materials selected from manganese, magnesium, zirconium, beryllium, neodymium, and scandium may be used The conductive layer can have a single-layer structure or a stacked structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. In the case where the conductive layer has a single-layer structure of a titanium film or a titanium nitride film, there is an advantage that the conductive layer can be easily processed into the source/drain electrodes 842a and 842b having tapered shapes.

Alternatively, the conductive layer may be formed using conductive metal oxide. As the conductive metal oxide, indium oxide ($In_2O_3$), tin oxide ($SnO_2$), zinc oxide (ZnO), indium tin oxide ($In_2O_3$—$SnO_2$, usually abbreviated to ITO), indium zinc oxide ($In_2O_3$—ZnO), or any of these metal oxide materials containing silicon or silicon oxide can be used.

The conductive layer is preferably etched so that end portions of the source/drain electrodes 842a and 842b are tapered. Here, a taper angle is preferably in the range of 30° to 60°, for example. The tapered end portions of the source/ drain electrodes 842*a* and 842*b* can improve the coverage thereof with the gate insulating layer 846 formed later and prevent disconnection.

The channel length (L) of the transistor 862 in the upper portion is determined by a distance between lower end portions of the source/drain electrode 842*a* and the source/drain electrode 842*b*. Note that for light exposure for forming a mask used for a transistor with a channel length (L) of less than 25 nm, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor 862 to be formed later can be in the range of 10 nm to 1000 nm (1 μm); thus, the circuit can operate at higher speed. Moreover, miniaturization can lead to lower power consumption of a semiconductor device.

Figure 22C:
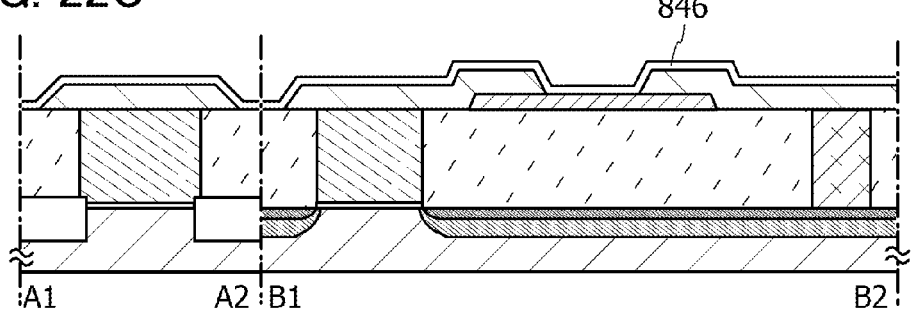

Next, the gate insulating layer 846 is formed so as to cover the source/drain electrodes 842*a* and 842*b* and to be in contact with part of the oxide semiconductor layer 844 (see FIG. 22C).

The gate insulating layer 846 can be formed by CVD, sputtering, or the like. The gate insulating layer 846 is formed using silicon oxide, silicon nitride, silicon oxynitride, or the like. Alternatively, the gate insulating layer 846 can be formed using a material containing an element of Group 13 and oxygen. Examples of the material containing a Group 13 element and oxygen are gallium oxide, aluminum oxide, and aluminum gallium oxide. Further, the gate insulating layer 846 may contain tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 846 may have a single-layer structure or a stacked structure using a combination of the above materials. Although there is no particular limitation on the thickness of the gate insulating layer 846, the thickness is preferably small in order to ensure operation of the transistor when a semiconductor device is miniaturized. For example, the gate insulating layer 846 formed using silicon oxide can have a thickness of 1 nm to 100 nm, preferably 10 nm to 50 nm.

The gate insulating layer 846 is preferably formed by a method with which impurities such as hydrogen and water do not enter the gate insulating layer 846. This is because, if impurities such as hydrogen and water are included in the gate insulating layer 846, the impurities such as hydrogen and water may enter an oxide semiconductor film formed later or may extract oxygen in the oxide semiconductor film, so that a back channel of the oxide semiconductor film might have lower resistance (have n-type conductivity) and a parasitic channel might be formed. Therefore, the gate insulating layer 846 is preferably formed so as to contain impurities such as hydrogen and water as little as possible. For example, the gate insulating layer 846 is preferably formed by sputtering. As a sputtering gas used for forming the gate insulating layer 846, a high-purity gas from which impurities such as hydrogen and water are removed is preferably used.

Many oxide semiconductor materials that can be used for the oxide semiconductor layer 844 contain a Group 13 element. Thus, when the gate insulating layer 846 in contact with the oxide semiconductor layer 844 is formed using a material containing a Group 13 element and oxygen, the state of the interface between the gate insulating layer 846 and the oxide semiconductor layer 844 can be kept favorable. This is because a material containing a Group 13 element and oxygen is compatible with an oxide semiconductor material. For example, when the oxide semiconductor layer 844 and the gate insulating layer 846 containing gallium oxide are provided in contact with each other, pileup of hydrogen at the interface between the oxide semiconductor layer 844 and the gate insulating layer 846 can be reduced. Since aluminum oxide does not easily transmit water, it is preferably used for the gate insulating layer 846 in terms of preventing entry of water into the oxide semiconductor layer 844.

When the gate insulating layer is thin as in the above description, a problem of gate leakage due to a tunnel effect or the like is caused. In order to solve the problem of gate leakage, the gate insulating layer 846 is preferably formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. The use of a high-k material enables the thickness of the gate insulating layer 846 to be increased to reduce gate leakage while keeping favorable electric characteristics of the gate insulating layer 846. Note that a stacked structure of a film containing a high-k material and a film containing any one of silicon oxide, silicon nitride, silicon oxynitride, silicon nitride oxide, aluminum oxide, and the like may be employed.

In addition, the gate insulating layer 846 preferably includes oxygen more than that in the stoichiometric composition. For example, when gallium oxide is used for the gate insulating layer 846, the stoichiometric composition can be expressed as $Ga_2O_{3+\alpha}$ ($0<\alpha<1$). When aluminum oxide is used, the stoichiometric composition can be expressed as $Al_2O_{3+\alpha}$ ($0<\alpha<1$). When gallium aluminum oxide is used, the stoichiometric composition can be expressed as $Ga_xAl_{2-x}O_{3+\alpha}$ ($0<x<2$, $0<\alpha<1$).

Note that oxygen doping treatment may be performed after the oxide semiconductor film is formed, after the oxide semiconductor layer 844 is formed, or after the gate insulating layer 846 is formed. Note that oxygen doping means that oxygen (including at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes oxygen plasma doping in which oxygen that is made to be plasma is added to a bulk. With oxygen doping, the proportion of oxygen included in the oxide semiconductor layer 844 and the gate insulating layer 846 can be made larger than the stoichiometric proportion.

The oxygen doping treatment is preferably performed by an inductively coupled plasma (ICP) method using oxygen plasma that is excited by a microwave (with a frequency of 2.45 GHz, for example).

After the gate insulating layer 846 is formed, third heat treatment is preferably performed in an inert gas atmosphere or an oxygen atmosphere. The third heat treatment is preferably performed at a temperature ranging from 200° C. to 450° C., preferably from 250° C. to 350° C. For example, the heat treatment may be performed at 250° C. for 1 hour in a nitrogen atmosphere. By performing the third heat treatment, variation in electric characteristics of the transistor can be reduced. Moreover, when a film in contact with the oxide semiconductor layer 844, for example, the gate insulating layer 846 includes oxygen, oxygen is supplied to the oxide semiconductor layer 844 to fill oxygen vacancies in the oxide semiconductor layer 844, whereby an i-type (intrinsic)

or substantially i-type oxide semiconductor layer can be formed. Note that when a base film including oxygen is provided in contact with the oxide semiconductor layer 844, oxygen can also be supplied from the base film to fill oxygen vacancies.

Although the third heat treatment is performed after the gate insulating layer 846 is formed in this embodiment, the timing of the third heat treatment is not limited to this. For example, the third heat treatment may be performed after a gate electrode is formed. Alternatively, the third heat treatment may be performed following the second heat treatment, the second heat treatment may double as the third heat treatment, or the third heat treatment may double as the second heat treatment.

By performing at least one of the second heat treatment and the third heat treatment as described above, the oxide semiconductor layer 844 can be purified so as to contain a substance including a hydrogen atom as little as possible.

Figure 22D:
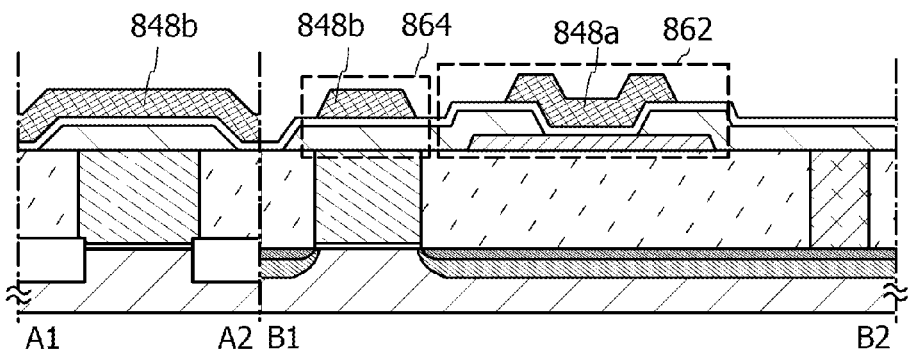

Next, a conductive layer used for forming a gate electrode (including a wiring formed using the same layer as the gate electrode) is formed and processed, so that the gate electrode 848a and the conductive layer 848b are formed (see FIG. 22D).

The gate electrode 848a and the conductive layer 848b can be formed using a metal material such as molybdenum, titanium, tantalum, tungsten, aluminum, copper, neodymium, or scandium or an alloy material containing any of these materials as a main component. Note that the gate electrode 848a and the conductive layer 848b may have a single-layer structure or a stacked structure.

Figure 23A:
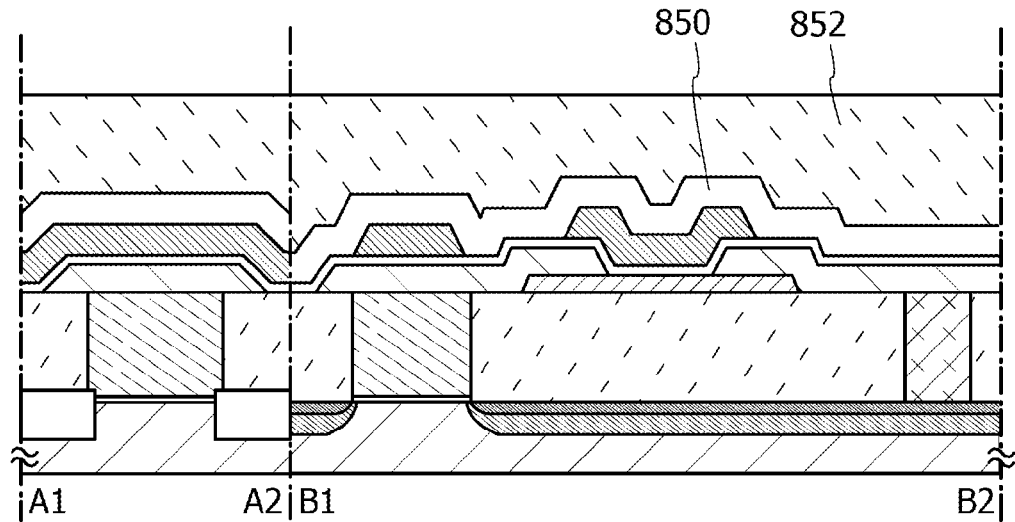
FIGS. 23A and 23B are cross-sectional views illustrating steps of fabricating a semiconductor device.

Then, the insulating layer 850 and the insulating layer 852 are formed over the gate insulating layer 846, the gate electrode 848a, and the conductive layer 848b (see FIG. 23A). The insulating layers 850 and 852 can be formed by PVD, CVD, or the like. The insulating layers 850 and 852 can be formed using a material including an inorganic insulating material such as silicon oxide, silicon oxynitride, silicon nitride, hafnium oxide, gallium oxide, aluminum oxide, or gallium aluminum oxide. Note that the insulating layers 850 and 852 are preferably formed using a low dielectric constant material or to have a structure with a low dielectric constant (such as a porous structure). This is because when the insulating layers 850 and 852 have a low dielectric constant, capacitance generated between wirings, electrodes, or the like can be reduced and the operating speed can be increased. Although each of the insulating layers 850 and 852 has a single-layer structure in this embodiment, one embodiment of the present invention is not limited to this and each of the insulating layers 850 and 852 may have a stacked structure including two or more layers.

Next, an opening 853 reaching the source/drain electrode 842b is formed in the gate insulating layer 846 and the insulating layers 850 and 852. Then, the electrode 854 in contact with the source/drain electrode 842b is formed in the opening 853, and the wiring 856 in contact with the electrode 854 is formed over the insulating layer 852 (see FIG. 23B). The opening 853 is formed by selective etching using a mask or the like.

The electrode 854 can be formed in such a manner that, for example, a conductive layer is formed by PVD, CVD, or the like in a region including the opening 853 and then part of the conductive layer is removed by etching treatment, CMP treatment, or the like.

Specifically, it is possible to employ a method, for example, in which a thin titanium film is formed in a region including the opening 853 by PVD and a thin titanium nitride film is formed by CVD, and then a tungsten film is formed so as to fill the opening 853. Here, the titanium film formed by PVD has a function of reducing an oxide film (e.g., a native oxide film) formed on a surface where the titanium film is formed, thereby lowering the contact resistance with the lower electrode and the like (here, the source/drain electrode 842b). The titanium nitride film formed after the formation of the titanium film has a barrier function of preventing diffusion of the conductive material. A copper film may be formed by plating after the formation of the barrier film of titanium, titanium nitride, or the like.

Note that in the case where the electrode 854 is formed by removing part of the conductive layer, processing is preferably performed so that the surface is planarized. For example, when the thin titanium film and the thin titanium nitride film are formed in a region including the opening 853 and then the tungsten film is formed so as to fill the opening 853, excess tungsten, titanium, titanium nitride, and the like can be removed and the planarity of the surface can be improved by subsequent CMP treatment. By planarizing the surface including the electrode 854 in this manner, an electrode, a wiring, an insulating layer, a semiconductor layer, and the like with favorable characteristics can be formed in later steps.

The wiring 856 is formed in such a manner that a conductive layer is formed by PVD such as sputtering or CVD such as plasma CVD and then is patterned. Examples of a material for the conductive layer are an element selected from aluminum, chromium, copper, tantalum, titanium, molybdenum, and tungsten and an alloy containing any of these elements as a component. A material including one or more of manganese, magnesium, zirconium, beryllium, neodymium, and scandium may be used. The description of the source/drain electrodes 842a and 842b, for example, can be referred to for the details.

Figure 23B:
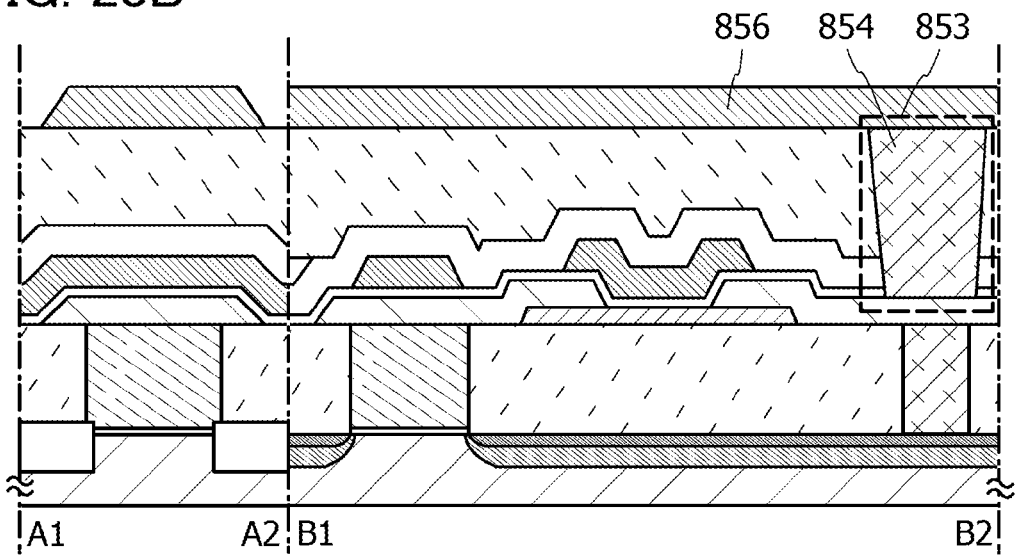

Through the above steps, the semiconductor device including the transistor 860, the transistor 862, and the capacitor 864 is completed (see FIG. 23B).

The process of fabricating the transistor including the oxide semiconductor layer does not need high-temperature treatment, so that the transistor including the oxide semiconductor layer can be formed without affecting another device such as the lower transistor and wirings. Further, the process of fabricating the transistor including the oxide semiconductor layer has a smaller number of steps than a process of fabricating a transistor including a semiconductor material (e.g., silicon) other than an oxide semiconductor.

Figure 24A:
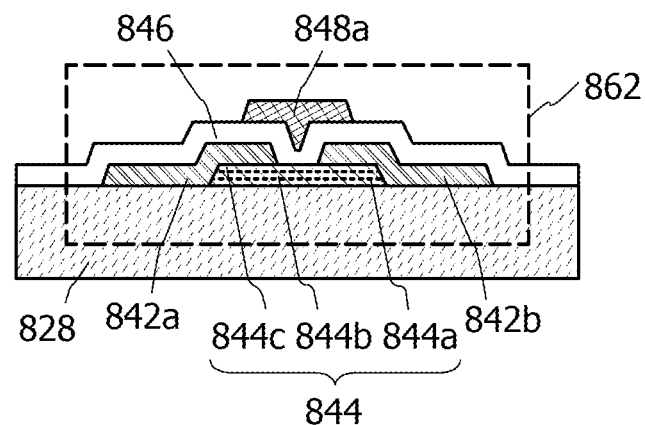
FIGS. 24A and 24B are cross-sectional view of semiconductor devices.

The oxide semiconductor layer is not limited to a single oxide semiconductor layer and may be a plurality of oxide semiconductor layers stacked. FIG. 24A shows an example of the structure of the transistor 862 in which the oxide semiconductor layer has a three-layer structure.

The transistor 862 illustrated in FIG. 24A includes the oxide semiconductor layer 844 over the insulating layer 828 and the like, the source/drain electrodes 842a and 842b electrically connected to the oxide semiconductor layer 844, the gate insulating layer 846 covering the oxide semiconductor layer 844 and the source/drain electrodes 842a and 842b, and the gate electrode 848a provided over the gate insulating layer 846 so as to overlap with the oxide semiconductor layer 844.

In the transistor 862, oxide semiconductor layers 844a to 844c are stacked in this order on the insulating layer 828.

The oxide semiconductor layers 844a and 844c are each an oxide film that contains at least one of metal elements contained in the oxide semiconductor layer 844b. The energy at the bottom of the conduction band of the oxide semiconductor layers 844a and 844c is closer to a vacuum level than that of the oxide semiconductor layer 844b by 0.05 eV or more, 0.07 eV or more, 0.1 eV or more, or 0.15 eV or more and 2 eV or less, 1 eV or less, 0.5 eV or less, or 0.4 eV or less. The oxide semiconductor layer 844b preferably contains at least indium in order to increase carrier mobility.

Here, a band structure of the stacked oxide semiconductor layer 844 will be described.

The band structure of the stacked oxide semiconductor layer 844 can be specified by the following method, for example. For instance, the energy gap of the oxide semiconductor layers 844a to 844c and the energy gap of the interface between the oxide semiconductor layers 844a to 844c are measured with a spectroscopic ellipsometer. Then, the energy difference between the vacuum level and the bottom of the valence band of each of the oxide semiconductor layers 844a to 844c is measured with an ultraviolet photoelectron spectroscopy (UPS) device. Next, the energy difference between the vacuum level and the bottom of the conduction band (electron affinity) of each of the oxide semiconductor layers 844a to 844c, which is calculated by subtracting the energy gap of each layer from the energy difference between the vacuum level and the top of the valence band, is plotted. In the above manner, the band structure of the stacked oxide semiconductor layer 844 can be specified. Here, the oxide semiconductor layers 844a and 844c are formed using In—Ga—Zn oxide with an energy gap of 3.15 eV, and the oxide semiconductor layer 844b is formed using In—Ga—Zn oxide with an energy gap of 2.8 eV. The energy gap in the vicinity of the interface between the oxide semiconductor layer 844a and the oxide semiconductor layer 844b is 3 eV, and that in the vicinity of the interface between the oxide semiconductor layer 844b and the oxide semiconductor layer 844c is 3 eV.

Figure 25A:
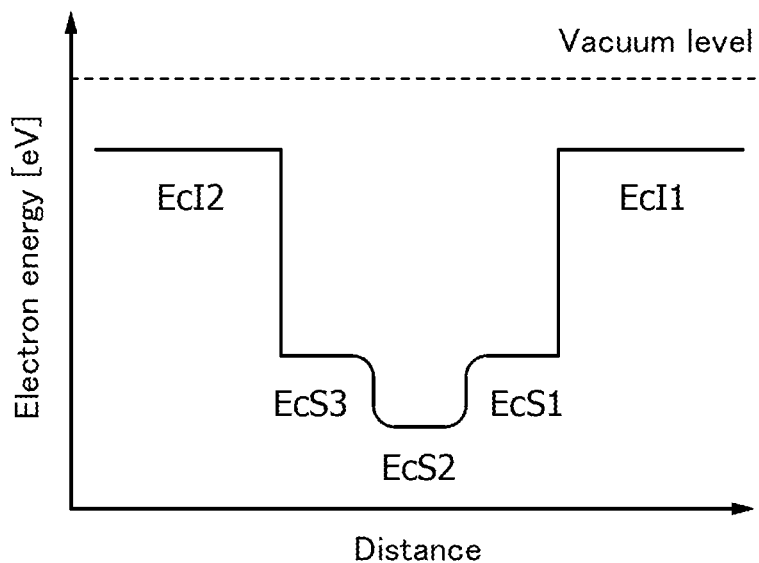
FIGS. 25A and 25B are band diagrams of stacked oxide semiconductor layers.

FIG. 25A is a schematic diagram of the band structure specified in the above manner. FIG. 25A shows the case where silicon oxide films are provided in contact with the oxide semiconductor layers 844a and 844c. Here, the vertical axis represents electron energy (eV) and the horizontal axis represents distance. Further, EcI1 and EcI2 denote the energy of the bottom of the conduction band of the silicon oxide films; EcS1, the energy of the bottom of the conduction band of the oxide semiconductor layer 844a; EcS2, the energy of the bottom of the conduction band of the oxide semiconductor layer 844b; and EcS3, the energy of the bottom of the conduction band of the oxide semiconductor layer 844c.

As shown in FIG. 25A, the energy of the bottom of the conduction band is changed continuously between the oxide semiconductor layer 844a, the oxide semiconductor layer 844b, and the oxide semiconductor layer 844c. This can be understood from the fact that oxygen is easily diffused among the oxide semiconductor layers 844a to 844c because the compositions of the oxide semiconductor layers 844a to 844c are close to one another.

Figure 25B:
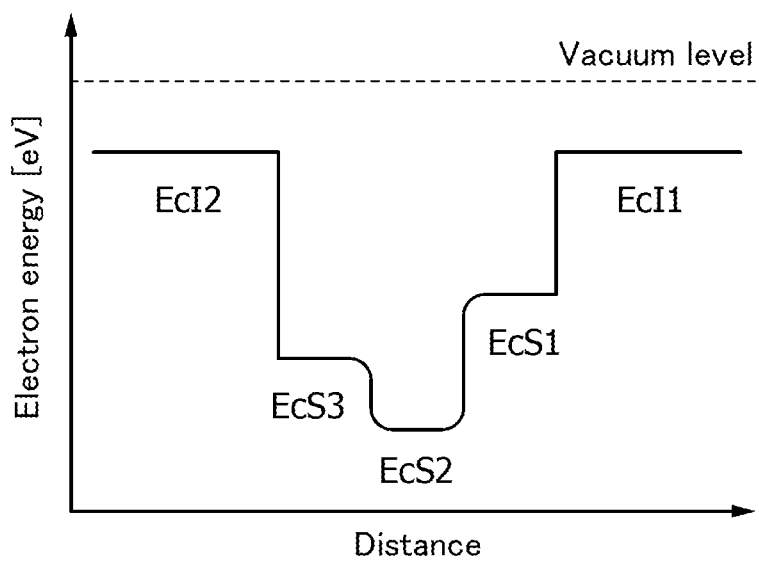

Although FIG. 25A shows the case where the oxide semiconductor layers 844a and 844c are oxide layers with the same energy gap, the oxide semiconductor layers 844a and 844c may be oxide layers with different energy gaps. For example, FIG. 25B shows part of the band structure in which EcS1 is higher than EcS3. Although not shown in FIGS. 25A and 25B, EcS3 may be higher than EcS1.

When the transistor 862 includes the oxide semiconductor layer 844 having the above band structure and an electric field is applied to the oxide semiconductor layer 844 by application of voltage to the gate electrode 848a, a channel region is formed in the oxide semiconductor layer 844b, which has the lowest energy of the bottom of the conduction band in the oxide semiconductor layer 844. In other words, since the oxide semiconductor layer 844c is provided between the oxide semiconductor layer 844b and the gate insulating layer 846, a channel region can be formed in the oxide semiconductor layer 844b, which is separated from the gate insulating layer 846.

Since the oxide semiconductor layer 844c contains at least one of the metal elements contained in the oxide semiconductor layer 844b, interface scattering is unlikely to occur at the interface between the oxide semiconductor layer 844b and the oxide semiconductor layer 844c. Thus, the movement of carriers is unlikely to be inhibited at the interface, which results in an increase in the field-effect mobility of the transistor 862.

If an interface level is formed at the interface between the oxide semiconductor layer 844a and the oxide semiconductor layer 844b, a channel region is formed also in a region in the vicinity of the interface, which causes a change in the threshold voltage of the transistor 862. However, since the oxide semiconductor layer 844a contains at least one of the metal elements contained in the oxide semiconductor layer 844b, an interface level is unlikely to be formed at the interface between the oxide semiconductor layer 844a and the oxide semiconductor layer 844b. As a result, the above structure can reduce variation in electrical characteristics (e.g., threshold voltage) of the transistor 862.

Further, it is preferable that a plurality of oxide semiconductor layers be stacked to prevent an interface level that inhibits carrier flow from being formed at an interface between the oxide semiconductor layers by impurities existing between the oxide semiconductor layers. This is because if impurities exist between the stacked oxide semiconductor layers, the continuity of the energy of the bottom of the conduction band of the oxide semiconductor layers is lost, and carriers are trapped or disappear by recombination in the vicinity of the interface. By reducing impurities existing between the layers, a continuous junction (here, particularly a well structure having a U shape in which the energy of the bottom of the conduction band is changed continuously between the layers) is formed easily as compared to the case of merely stacking a plurality of oxide semiconductor layers that contain at least one common metal as a main component.

In order to form continuous junction, the layers need to be stacked successively without being exposed to the air by using a multi-chamber deposition system (sputtering system) provided with a load lock chamber. Each chamber of the sputtering system is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evaporation in a chamber but also high purity of a sputtering gas is necessary to obtain a high-purity intrinsic oxide semiconductor. As an oxygen gas or an argon gas used as the sputtering gas, a gas that is highly purified to have a dew point of −40° C. or lower, preferably −80° C. or lower, more preferably −100° C. or lower is used, so that entry of moisture or the like into the oxide semiconductor layer can be prevented as much as possible.

For example, the oxide semiconductor layer 844a and/or the oxide semiconductor layer 844c can be an oxide layer that contains aluminum, silicon, titanium, gallium, germanium, yttrium, zirconium, tin, lanthanum, cerium, or hafnium at a higher atomic ratio than the oxide semiconductor layer 844b. Specifically, the oxide semiconductor layer 844a and/or the oxide semiconductor layer 844c is preferably an oxide layer with a content of any of the above elements 1.5 times or more, preferably 2 times or more, further preferably 3 times or more that of the oxide semiconductor layer 844b in an atomic ratio. The above element is strongly bonded to oxygen and thus has a function of suppressing generation of oxygen vacancies in the oxide layer. Accordingly, the oxide semiconductor layer 844a and/or the oxide semiconductor layer 844c can be an oxide layer in which oxygen vacancies are less likely to be generated than in the oxide semiconductor layer 844b.

Specifically, when both the oxide semiconductor layer 844b and the oxide semiconductor layer 844a or 844c are In-M-Zn-based oxide layers and the atomic ratio of the oxide semiconductor layer 844a or 844c is In:M:Zn=$x_1$:$y_1$:$z_1$ and that of the oxide semiconductor layer 844b is In:M:Zn=$x_2$:$y_2$:$z_2$, the atomic ratios are set so that $y_1/x_1$ is larger than $y_2/x_2$. Note that the element M is a metal element whose bonding strength to oxygen is larger than that of In, and can be Al, Ti, Ga, Y, Zr, Sn, La, Ce, Nd, or Hf, for example. The atomic ratios are preferably set so that $y_1/x_1$ is 1.5 times or more, preferably 2 times or more, further preferably 3 times or more $y_2/x_2$. Here, in the oxide semiconductor layer 844b, $y_1$ is preferably larger than or equal to $x_1$ because the transistor 862 can have stable electrical characteristics. Note that the field-effect mobility of the transistor 862 is reduced when $y_1$ is 3 times or more $x_1$; accordingly, $y_1$ is preferably smaller than 3 times $x_1$.

The thickness of the oxide semiconductor layers 844a and 844c ranges from 3 nm to 100 nm, preferably from 3 nm to 50 nm. The thickness of the oxide semiconductor layer 844b ranges from 3 nm to 200 nm, preferably from 3 nm to 100 nm, further preferably from 3 nm to 50 nm.

In the three-layer oxide semiconductor layer, the oxide semiconductor layers 844a to 844c can be amorphous or crystalline. Note that the transistor 862 can have stable electrical characteristics when the oxide semiconductor layer 844b where a channel region is formed is crystalline; therefore, the oxide semiconductor layer 844b is preferably crystalline.

Note that a channel formation region refers to a region of a semiconductor film of a transistor that overlaps with a gate electrode and is located between a source electrode and a drain electrode. Further, a channel region refers to a region through which current mainly flows in the channel formation region.

For example, when an In—Ga—Zn-based oxide layer formed by sputtering is used as the oxide semiconductor layers 844a and 844c, a sputtering target that is In—Ga—Zn-based oxide containing In, Ga, and Zn at an atomic ratio of 1:3:2 can be used to deposit the oxide semiconductor layers 844a and 844c. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor layer 844b is a CAAC-OS film, a sputtering target including polycrystalline In—Ga—Zn-based oxide containing In, Ga, and Zn at an atomic ratio of 1:1:1 is preferably used to deposit the oxide semiconductor layer 844b. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that in the transistor 862 illustrated in FIG. 24A, the end portions of the oxide semiconductor layer 844 may be tapered or rounded.

Figure 24B:
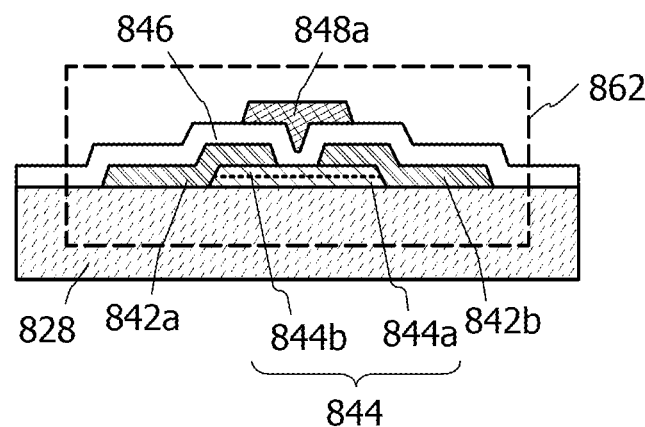

Although the oxide semiconductor layer 844 in FIG. 24A is a stack including three oxide semiconductor layers, the oxide semiconductor layer 844 may be a stack including two or four or more oxide semiconductor layers. For example, the oxide semiconductor layer 844 may be a stack including two oxide semiconductor layers as illustrated in FIG. 24B.

Here, a state due to oxygen vacancy, which is one of defect states of an oxide semiconductor layer, is described. The case where the oxide semiconductor layer is In—Ga—Zn oxide is described here.

Figure 26:
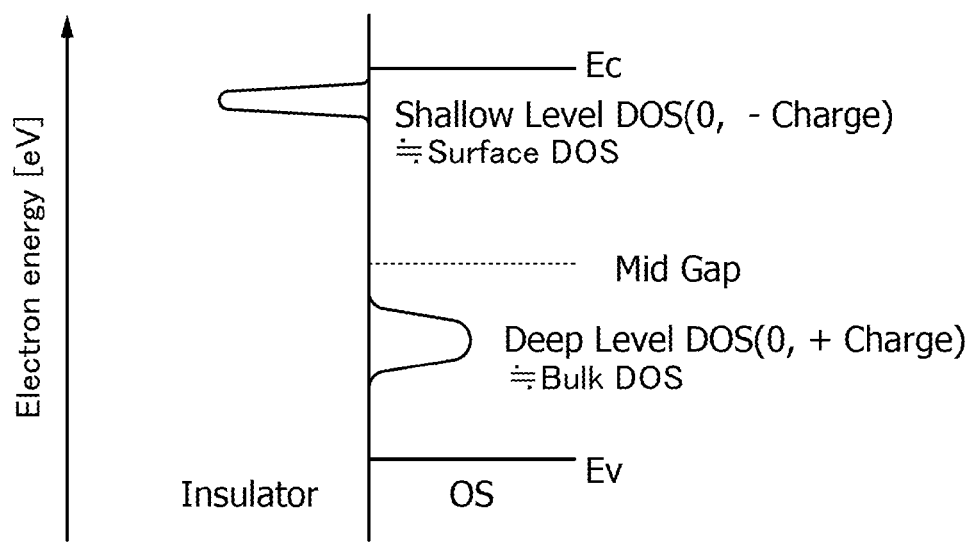
FIG. 26 shows oxygen vacancy in an oxide film.

FIG. 26 illustrates a band structure of an oxide semiconductor layer (OS). The oxide semiconductor layer has a shallow level DOS and a deep level DOS. In this specification, the shallow level DOS refers to a state between the energy (Ec) at the bottom of the conduction band and the mid gap. Further, the deep level DOS refers to a state between the energy (Ev) at the top of the valence band and the mid gap. Note that the shallow level DOS is likely to exist in the vicinity of a surface (vicinity of an interface with an insulating film (Insulator)), and the deep level DOS is likely to exist in a bulk.

For example, in the case where an insulating film in contact with an oxide semiconductor film contains silicon, a bond between oxygen and indium contained in the oxide semiconductor film is cut and a bond between the oxygen and silicon is generated in some cases. This is because the bond energy between silicon and oxygen is high and the bond energy between indium and oxygen is relatively low. In this case, a site of oxygen bonded to indium becomes an oxygen vacancy (Vo). Thus, silicon may serve as an impurity that adversely affects the oxide semiconductor film. Further, in the oxide semiconductor film, a bond between indium and oxygen is easily cut, so that an oxygen vacancy sometimes occurs because of damage caused by plasma, a sputtering particle, or the like. The oxygen vacancy becomes a deep level DOS and a hole trap state (hole trap).

In addition, oxygen vacancies are unstable in the oxide semiconductor film. Accordingly, oxygen vacancies become a metastable state by trapping hydrogen. The oxygen vacancy becomes a shallow level DOS by trapping hydrogen and serves as an electron trap state (electron trap) or an electron generation source. That is, the shallow level DOS is charged positively or negatively.

Note that by supply of oxygen to the oxide semiconductor film, the density of oxygen vacancies in the oxide semiconductor film can be reduced in some cases. The oxygen vacancies can be stable and electrically neutral by entry of oxygen. For example, when excess oxygen is contained in the oxide semiconductor film or an insulating film provided in the vicinity of the oxide semiconductor film, oxygen vacancies in the oxide semiconductor film can be effectively reduced. Excess oxygen refers to oxygen in excess of the stoichiometric composition or oxygen released by heating, for example. In the oxide semiconductor film, an oxygen vacancy may seem to move by capturing adjacent oxygen atoms. Similarly, excess oxygen may seem to move in the oxide semiconductor film.

As described above, an oxygen vacancy may become a metastable state or a stable state by hydrogen or oxygen. When the hydrogen concentration of the oxide semiconductor film is high, more hydrogen is trapped by oxygen vacancies. In contrast, when the hydrogen concentration of the oxide semiconductor film is low, less hydrogen is trapped by oxygen vacancies.

In consideration of only relative positions of a hydrogen bond, hydrogen, an oxygen vacancy, and oxygen, it can be understood that shallow level DOS is charged positively or negatively. Hydrogen forms $H^+ + e^-$ to make the oxide semiconductor film have n-type conductivity. Further, hydrogen is trapped by oxygen vacancies (VoH). The oxygen vacancies are considered to be a valence of approximately −0.7±1.0, and VoH is positively charged. As a result, $H^+ + e^-$ forms an n-type region in the oxide semiconductor film.

Examples of forming the shallow level DOS include the following models.

For example, in Model 1 of Si—O—H . . . Vo-In, H . . . Vo is negatively charged, and in Model 2 of Si—O . . . H-Vo-In, H-Vo is positively charged. Since much silicon exists in the vicinity of the surface of the oxide semiconductor film, the shallow level DOS represented by Model 1 and Model 2 is easily generated in the vicinity of the surface (such DOS is referred to as surface DOS). Note that the reaction of Model 2 is less likely to occur. Note that a symbol " . . . " in the models denotes a hydrogen bond.

The same applies to the case where silicon is replaced with indium. For example, in Model 3 of In—O—H . . . Vo-In, H . . . Vo is negatively charged, and in Model 4 of In—O . . . H-Vo-In, H-Vo is positively charged. Not only are Model 3 and Model 4, in which silicon in Model 1 and Model 2 is replaced with indium, generated in the vicinity of the surface of the oxide semiconductor film, but also they are easily generated in a bulk (such DOS is referred to as bulk DOS). Model 3 and Model 4 are frequently generated in an oxide semiconductor film with a high indium content in an atomic ratio.

The structure described in this embodiment can be combined as appropriate with any of the structures described in the other embodiments.

(Embodiment 9)

In Embodiment 9, application examples of the semiconductor device described in the foregoing embodiment to an electronic component and to an electronic device including the electronic component will be described with reference to FIGS. 31A and 31B and FIGS. 32A to 32E.

Figure 31A:
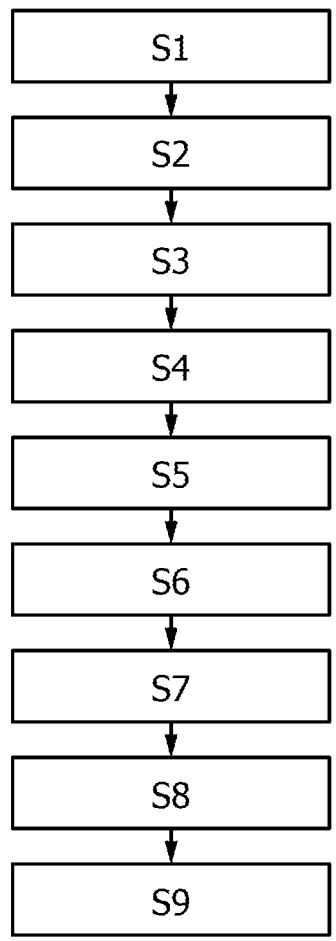
FIG. 31A is a flow chart showing steps of fabricating a semiconductor device.

FIG. 31A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device obtained through the transistor fabrication process (wafer process) such as that illustrated in FIGS. 20A to 20D, FIGS. 21A to 21D, FIGS. 22A to 22D, and FIGS. 23A and 23B in Embodiment 8 undergoes the assembly and testing process, thereby being a component detachable to a printed circuit board.

The component can be completed through steps shown in FIG. 31A of the assembly and testing process. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the semiconductor device and the wire embedded in the component can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component including the semiconductor device is completed (Step S9).

Since the electronic component described above includes the semiconductor device of the foregoing embodiment, data can be read at high speed and the memory capacity can be increased or decreased easily in the electronic component.

Figure 31B:
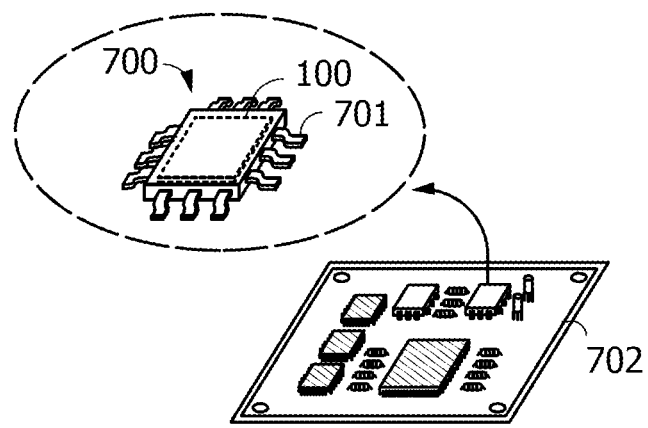
FIG. 31B is a perspective schematic diagram of the semiconductor device.

FIG. 31B is a perspective schematic diagram of a completed electronic component including the semiconductor device. FIG. 31B shows a perspective schematic diagram of a quad flat package (QFP) as an example of the electronic component. An electronic component 700 illustrated in FIG. 31B includes the semiconductor device 100 and a lead 701. The electronic component 700 in FIG. 31B is, for example, mounted on a printed circuit board 702 and provided inside an electronic device or the like. For example, the semiconductor devices 100 in FIG. 31B may be stacked and incorporated in the electronic component 700.

Next, the description is made on applications of the above electronic component to electronic devices such as a computer, a portable information appliance (including a mobile phone, a portable game machine, an audio reproducing device, and the like), electronic paper, a television device (also referred to as television or television receiver), and a digital video camera.

Figure 32A:
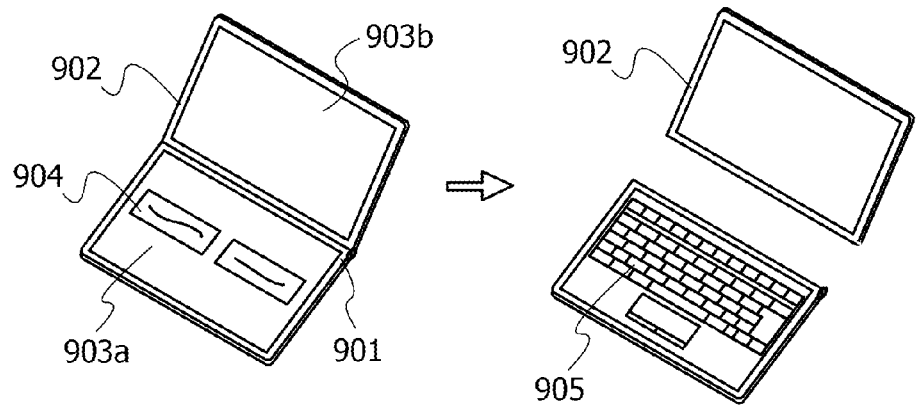
FIGS. 32A to 32E each illustrate an electronic device including a semiconductor device.

FIG. 32A illustrates a portable information appliance that includes a housing 901, a housing 902, a first display portion 903a, a second display portion 903b, and the like. The semiconductor device described in the foregoing embodiment is provided in at least one of the housings 901 and 902. Thus, it is possible to provide a portable information appliance in which data can be read at high speed and the memory capacity can be increased or decreased easily.

Note that the first display portion 903a is a touch panel, and for example, as illustrated in the left of FIG. 32A, which of "touch input" and "keyboard input" is performed can be selected by a selection button 904 displayed on the first display portion 903a. Since selection buttons with a variety of sizes can be displayed, the information appliance can be easily used by people of any generation. For example, when "touch input" is selected, a keyboard 905 is displayed on the first display portion 903a as illustrated in the right of FIG.

32A. Thus, letters can be input quickly by key input as in the case of using a conventional information appliance, for example.

One of the first display portion 903a and the second display portion 903b can be detached from the portable information appliance as shown in the right of FIG. 32A. Providing the second display portion 903b with a touch input function makes the information appliance convenient to carry because the weight can be further reduced and the information appliance can operate with one hand while the other hand supports the housing 902.

The portable information appliance in FIG. 32A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 32A may transmit and receive data wirelessly. Through wireless communication, desired book data or the like can be purchased and downloaded from an electronic book server.

Further, the housing 902 illustrated in FIG. 32A may be equipped with an antenna, a microphone function, or a wireless communication function to be used as a mobile phone.

Figure 32B:
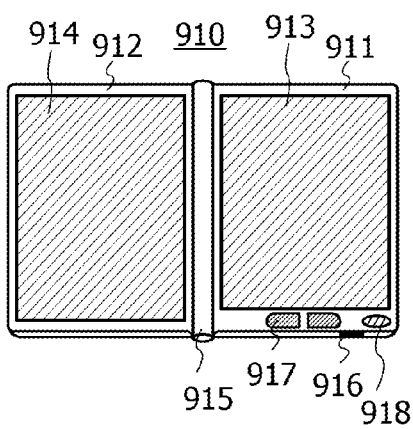

FIG. 32B illustrates an e-book reader 910 in which electronic paper is incorporated. The e-book reader has two housings of a housing 911 and a housing 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. The semiconductor device described in the foregoing embodiment is provided in at least one of the housings 911 and 912. Thus, it is possible to provide an e-book reader in which data can be read at high speed and the memory capacity can be increased or decreased easily.

Figure 32C:
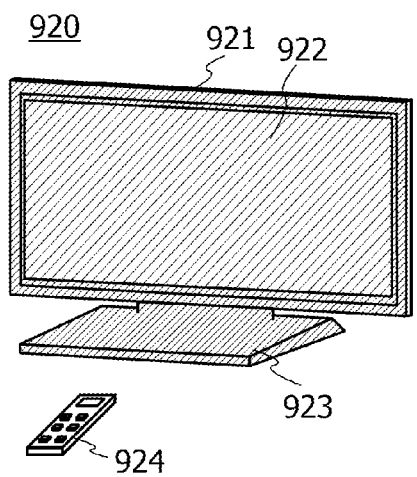

FIG. 32C illustrates a television device 920 including a housing 921, a display portion 922, a stand 923, and the like. The television device 920 can operate with a switch of the housing 921 and a separate remote controller 924. The semiconductor device described in the foregoing embodiment is mounted in the housing 921 and the remote controller 924. Thus, it is possible to provide a television device in which data can be read at high speed and the memory capacity can be increased or decreased easily.

Figure 32D:
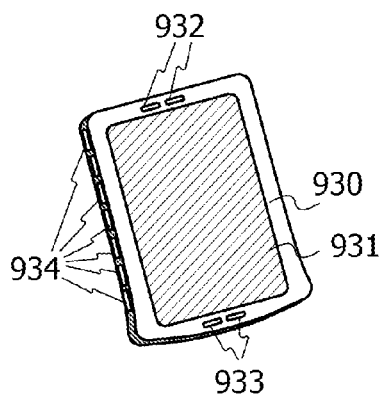

FIG. 32D illustrates a smartphone in which a main body 930 is provided with a display portion 931, a speaker 932, a microphone 933, an operation key 934, and the like. The semiconductor device described in the foregoing embodiment is provided in the main body 930. Thus, it is possible to provide a smartphone in which data can be read at high speed and the memory capacity can be increased or decreased easily.

Figure 32E:
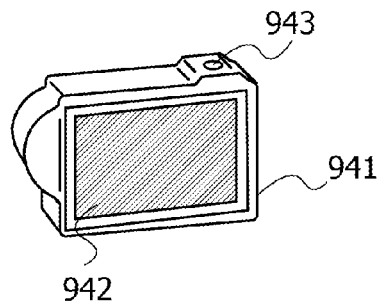

FIG. 32E illustrates a digital camera including a main body 941, a display portion 942, an operation switch 943, and the like. The semiconductor device described in the foregoing embodiment is provided in the main body 941. Thus, it is possible to provide a digital camera in which data can be read at high speed and the memory capacity can be increased or decreased easily.

As described above, the electronic device shown in this embodiment incorporates the semiconductor device in any of the foregoing embodiments, thereby achieving the electronic device including the semiconductor device with a high degree of convenience.

This application is based on Japanese Patent Application serial no. 2012-282478 filed with Japan Patent Office on Dec. 26, 2012, the entire contents of which are hereby incorporated by reference.

What is claimed is:

1. A semiconductor device comprising:
   a switch;
   a bit line electrically connected to a first terminal of the switch;
   a word line;
   a memory cell electrically connected to the bit line and the word line;
   a first comparator electrically connected to a second terminal of the switch;
   a second comparator electrically connected to a third terminal of the switch; and
   a third comparator electrically connected to the third terminal of the switch,
   wherein the memory cell is configured to store binary data or multilevel data,
   wherein the binary data is supplied from the bit line to the first comparator through the switch when the binary data is read from the memory cell,
   wherein the multilevel data is supplied from the bit line to the second comparator through the switch when the multilevel data is read from the memory cell,
   wherein the multilevel data is supplied from the bit line to the third comparator through the switch when the multilevel data is read from the memory cell,
   wherein the first comparator is configured to compare a level of a first reference voltage and a voltage corresponding to the binary data read from the memory cell,
   wherein the second comparator is configured to compare a level of a second reference voltage and a voltage corresponding to the multilevel data read from the memory cell, and
   wherein the third comparator is configured to compare a level of a third reference voltage and the voltage corresponding to the multilevel data read from the memory cell.

2. The semiconductor device according to claim 1,
   wherein a power supply voltage is supplied to the first comparator and is not supplied to the second comparator and the third comparator when the binary data is read from the memory cell, and
   wherein the power supply voltage is not supplied to the first comparator and is supplied to the second comparator and the third comparator when the multilevel data is read from the memory cell.

3. The semiconductor device according to claim 1,
   wherein the memory cell comprises a first transistor and a second transistor,
   wherein a first terminal of the first transistor is electrically connected to a gate of the second transistor,
   wherein a first terminal of the second transistor is electrically connected to the bit line, and
   wherein the first transistor comprises a channel formation region comprising an oxide semiconductor.

4. The semiconductor device according to claim 3,
wherein a power supply voltage is supplied to the first comparator and is not supplied to the second comparator and the third comparator when the binary data is read from the memory cell, and
wherein the power supply voltage is not supplied to the first comparator and is supplied to the second comparator and the third comparator when the multilevel data is read from the memory cell.

5. The semiconductor device according to claim 3,
wherein a power supply voltage is supplied to the first comparator and is not supplied to the second comparator and the third comparator when the binary data is read from the memory cell, and
wherein the power supply voltage is supplied to the first comparator, the second comparator, and the third comparator when the multilevel data is read from the memory cell.

6. A semiconductor device comprising:
a switch;
a bit line electrically connected to a first terminal of the switch;
a word line;
a memory cell electrically connected to the bit line and the word line;
a first comparator electrically connected to a second terminal of the switch;
a second comparator electrically connected to a third terminal of the switch;
a third comparator electrically connected to the third terminal of the switch; and
a writing circuit electrically connected to the bit line,
wherein the memory cell is configured to store binary data or multilevel data,
wherein the binary data is supplied from the bit line to the first comparator through the switch when the binary data is read from the memory cell,
wherein the multilevel data is supplied from the bit line to the second comparator through the switch when the multilevel data is read from the memory cell,
wherein the multilevel data is supplied from the bit line to the third comparator through the switch when the multilevel data is read from the memory cell,
wherein the first comparator is configured to compare a level of a first reference voltage and a voltage corresponding to the binary data read from the memory cell,
wherein the second comparator is configured to compare a level of a second reference voltage and a voltage corresponding to the multilevel data read from the memory cell,
wherein the third comparator is configured to compare a level of a third reference voltage and the voltage corresponding to the multilevel data read from the memory cell,
wherein the writing circuit is configured to output one of a first voltage and a second voltage to the memory cell through the bit line in accordance with the binary data, and
wherein the writing circuit is configured to output one of a third voltage, a fourth voltage, and a fifth voltage to the memory cell through the bit line in accordance with the multilevel data.

7. The semiconductor device according to claim 6,
wherein a power supply voltage is supplied to the first comparator and is not supplied to the second comparator and the third comparator when the binary data is read from the memory cell, and
wherein the power supply voltage is not supplied to the first comparator and is supplied to the second comparator and the third comparator when the multilevel data is read from the memory cell.

8. The semiconductor device according to claim 6,
wherein the memory cell comprises a first transistor and a second transistor,
wherein a first terminal of the first transistor is electrically connected to a gate of the second transistor,
wherein a first terminal of the second transistor is electrically connected to the bit line, and
wherein the first transistor comprises a channel formation region comprising an oxide semiconductor.

9. The semiconductor device according to claim 8,
wherein a power supply voltage is supplied to the first comparator and is not supplied to the second comparator and the third comparator when the binary data is read from the memory cell, and
wherein the power supply voltage is not supplied to the first comparator and is supplied to the second comparator and the third comparator when the multilevel data is read from the memory cell.

10. The semiconductor device according to claim 8,
wherein a power supply voltage is supplied to the first comparator and is not supplied to the second comparator and the third comparator when the binary data is read from the memory cell, and
wherein the power supply voltage is supplied to the first comparator, the second comparator, and the third comparator when the multilevel data is read from the memory cell.

11. A semiconductor device comprising:
a bit line;
a word line;
a memory cell electrically connected to the bit line and the word line;
a first switch electrically connected to the bit line;
a second switch;
a first comparator electrically connected to a first terminal of the first switch and a first terminal of the second switch;
a second comparator electrically connected to a second terminal of the first switch and a second terminal of the second switch;
a third comparator electrically connected to the second terminal of the first switch and the second terminal of the second switch;
a writing circuit electrically connected to the bit line; and
a voltage generator circuit electrically connected to the second switch.

12. The semiconductor device according to claim 11,
wherein the memory cell is configured to store binary data or multilevel data,
wherein the binary data is supplied from the bit line to the first comparator through the first switch when the binary data is read from the memory cell,
wherein the multilevel data is supplied from the bit line to the second comparator through the first switch when the multilevel data is read from the memory cell,
wherein the multilevel data is supplied from the bit line to the third comparator through the first switch when the multilevel data is read from the memory cell,
wherein the first comparator is configured to compare a level of a first reference voltage and a voltage corresponding to the binary data read from the memory cell, wherein the second comparator is configured to compare a level of a second reference voltage and a voltage corresponding to the multilevel data read from the memory cell, wherein the third comparator is configured to compare a level of a third reference voltage and the voltage corresponding to the multilevel data read from the memory cell, wherein the writing circuit is configured to output one of a first voltage and a second voltage to the memory cell through the bit line in accordance with the binary data, wherein the writing circuit is configured to output one of a third voltage, a fourth voltage, and a fifth voltage to the memory cell through the bit line in accordance with the multilevel data, and wherein the voltage generator circuit is configured to supply a power supply voltage to the first comparator, the second comparator, and the third comparator through the second switch.

13. The semiconductor device according to claim 12, wherein the power supply voltage is supplied to the first comparator and is not supplied to the second comparator and the third comparator when the binary data is read from the memory cell, and wherein the power supply voltage is not supplied to the first comparator and is supplied to the second comparator and the third comparator when the multilevel data is read from the memory cell.

14. The semiconductor device according to claim 11, wherein the memory cell comprises a first transistor and a second transistor, wherein a first terminal of the first transistor is electrically connected to a gate of the second transistor, wherein a first terminal of the second transistor is electrically connected to the bit line, and wherein the first transistor comprises a channel formation region comprising an oxide semiconductor.

15. The semiconductor device according to claim 14, wherein the memory cell is configured to store binary data or multilevel data, wherein the binary data is supplied from the bit line to the first comparator through the first switch when the binary data is read from the memory cell, wherein the multilevel data is supplied from the bit line to the second comparator through the first switch when the multilevel data is read from the memory cell, wherein the multilevel data is supplied from the bit line to the third comparator through the first switch when the multilevel data is read from the memory cell, wherein the first comparator is configured to compare a level of a first reference voltage and a voltage corresponding to the binary data read from the memory cell, wherein the second comparator is configured to compare a level of a second reference voltage and a voltage corresponding to the multilevel data read from the memory cell, wherein the third comparator is configured to compare a level of a third reference voltage and the voltage corresponding to the multilevel data read from the memory cell, wherein the writing circuit is configured to output one of a first voltage and a second voltage to the memory cell through the bit line in accordance with the binary data, wherein the writing circuit is configured to output one of a third voltage, a fourth voltage, and a fifth voltage to the memory cell through the bit line in accordance with the multilevel data, and wherein the voltage generator circuit is configured to supply a power supply voltage to the first comparator, the second comparator, and the third comparator through the second switch.

16. The semiconductor device according to claim 15, wherein the power supply voltage is supplied from the voltage generator circuit to the first comparator through the second switch when the binary data is read from the memory cell, wherein the power supply voltage is not supplied from the voltage generator circuit to the second comparator and the third comparator through the second switch when the binary data is read from the memory cell, wherein the power supply voltage is not supplied from the voltage generator circuit to the first comparator through the second switch when the multilevel data is read from the memory cell, and wherein the power supply voltage is supplied from the voltage generator circuit to the second comparator and the third comparator through the second switch when the multilevel data is read from the memory cell.

* * * * *